United States Patent
Shin et al.

(10) Patent No.: US 12,381,529 B2
(45) Date of Patent: Aug. 5, 2025

(54) METHODS OF MANUFACTURING BULK ACOUSTIC WAVE RESONATORS WITH PATTERNED MASS LOADING LAYERS

(71) Applicant: Skyworks Global Pte. Ltd., Singapore (SG)

(72) Inventors: Kwang Jae Shin, Yongin (KR); Jiansong Liu, Irvine, CA (US); Jong Duk Han, Yongin (KR); Jae Hyung Lee, Seoul (KR); Yiliu Wang, Irvine, CA (US); Yosuke Hamaoka, Suita (JP); Alexandre Augusto Shirakawa, San Diego, CA (US); Benfeng Zhang, Moriguchi (JP)

(73) Assignee: Skyworks Global Pte. Ltd., Singapore (SG)

( * ) Notice: Subject to any disclaimer, the term of this patent is extended or adjusted under 35 U.S.C. 154(b) by 1159 days.

(21) Appl. No.: 17/219,512

(22) Filed: Mar. 31, 2021

(65) Prior Publication Data
US 2022/0103159 A1    Mar. 31, 2022

Related U.S. Application Data

(60) Provisional application No. 63/085,413, filed on Sep. 30, 2020, provisional application No. 63/085,399, (Continued)

(51) Int. Cl.
*H03H 3/04*    (2006.01)
*H03H 3/02*    (2006.01)
(Continued)

(52) U.S. Cl.
CPC ............ *H03H 3/04* (2013.01); *H03H 3/02* (2013.01); *H03H 9/02015* (2013.01);
(Continued)

(58) Field of Classification Search
CPC .... H03H 3/02; H03H 3/04; H03H 2203/0442; H03H 9/02015; H03H 9/02086;
(Continued)

(56) References Cited

U.S. PATENT DOCUMENTS 6,476,536 B1    11/2002    Pensala
8,791,776 B2    7/2014    Pang et al.
(Continued)

FOREIGN PATENT DOCUMENTS

JP    2007-535279    11/2007
JP    2012-124648    6/2012
(Continued)

OTHER PUBLICATIONS

Rabe et al, "Design, manufacturing, and characterization of high-frequency thickness-shear mode resonators," Proceedings of the 2000 IEEE/EIA International Frequency Control Symposium and Exhibition (Cat. No.00CH37052), Kansas City, MO, USA, 2000, pp. 106-112. (Year: 2000).*

*Primary Examiner* — A. Dexter Tugbang
(74) *Attorney, Agent, or Firm* — Knobbe, Martens, Olson & Bear, LLP

(57) ABSTRACT

Methods of manufacturing bulk acoustic wave resonators are disclosed. During a common processing step, a first patterned mass loading layer for a first bulk acoustic wave resonator is formed and a second patterned mass loading layer for a second bulk acoustic wave resonator is formed. The first patterned mass loading layer has a different density than the second patterned mass loading layer.

20 Claims, 43 Drawing Sheets

Related U.S. Application Data filed on Sep. 30, 2020, provisional application No. 63/085,398, filed on Sep. 30, 2020.

(51) Int. Cl.
*H03H 9/02* (2006.01)
*H03H 9/17* (2006.01)
*H03H 9/205* (2006.01)
*H03H 9/54* (2006.01)
*H03H 9/56* (2006.01)
*H04B 1/40* (2015.01)

(52) U.S. Cl.
CPC ........ *H03H 9/02086* (2013.01); *H03H 9/173* (2013.01); *H03H 9/175* (2013.01); *H03H 9/205* (2013.01); *H03H 9/54* (2013.01); *H03H 9/564* (2013.01); *H03H 9/568* (2013.01); *H04B 1/40* (2013.01); *H03H 2003/0442* (2013.01)

(58) Field of Classification Search
CPC ........ H03H 9/173; H03H 9/175; H03H 9/205; H03H 9/54; H03H 9/564; H03H 9/568; H03H 9/64; H03H 2003/0442; H04B 1/40
See application file for complete search history.

(56) References Cited

U.S. PATENT DOCUMENTS

| | | |
|---|---|---|
| 9,362,880 B2 | 6/2016 | Sinha et al. |
| 9,450,565 B2 | 9/2016 | Tajic |
| 9,577,603 B2 | 2/2017 | Burak et al. |
| 11,581,869 B2 * | 2/2023 | Shin .................... H04B 1/40 |
| 12,021,506 B2 * | 6/2024 | Shin .................... H03H 9/205 |
| 12,088,278 B2 | 9/2024 | Shin et al. |
| 2011/0304412 A1 * | 12/2011 | Zhang .................... H03H 9/173 |
| | | 29/25.35 |
| 2012/0299444 A1 | 11/2012 | Yokoyama et al. |
| 2017/0033769 A1 | 2/2017 | Yokoyama |
| 2017/0054431 A1 | 2/2017 | Shimomura et al. |
| 2017/0077385 A1 | 3/2017 | Stokes et al. |
| 2017/0093371 A1 * | 3/2017 | Takamine ............... H03H 9/64 |
| 2017/0261503 A1 * | 9/2017 | Murdock ............... H03H 9/175 |
| 2019/0319602 A1 * | 10/2019 | Sturzebecher ........... H03H 3/02 |
| 2021/0044278 A1 | 2/2021 | Kankar et al. |
| 2022/0103150 A1 | 3/2022 | Shin et al. |
| 2022/0103151 A1 | 3/2022 | Shin et al. |
| 2022/0103152 A1 | 3/2022 | Shin et al. |
| 2024/0297635 A1 | 9/2024 | Shin et al. |

FOREIGN PATENT DOCUMENTS

| | | | |
|---|---|---|---|
| JP | 2017135463 A * | 8/2017 | ........ H03H 9/02125 |
| JP | 2022-058121 | 4/2022 | |

* cited by examiner

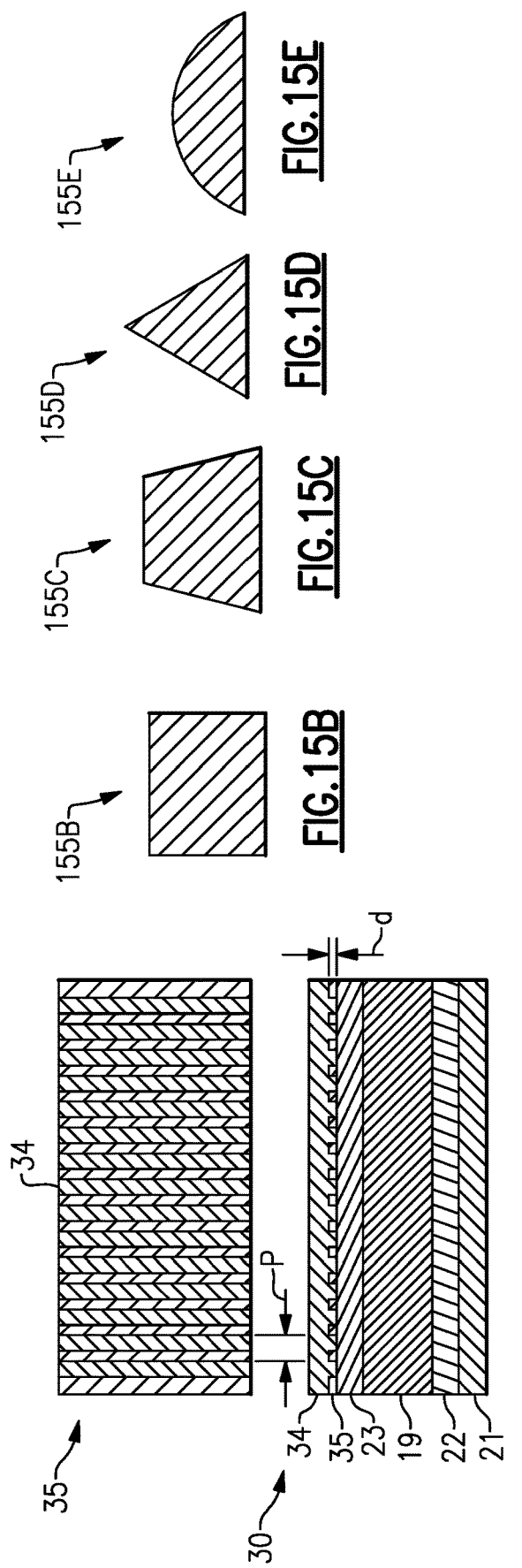

$0 <= \alpha <= 180$

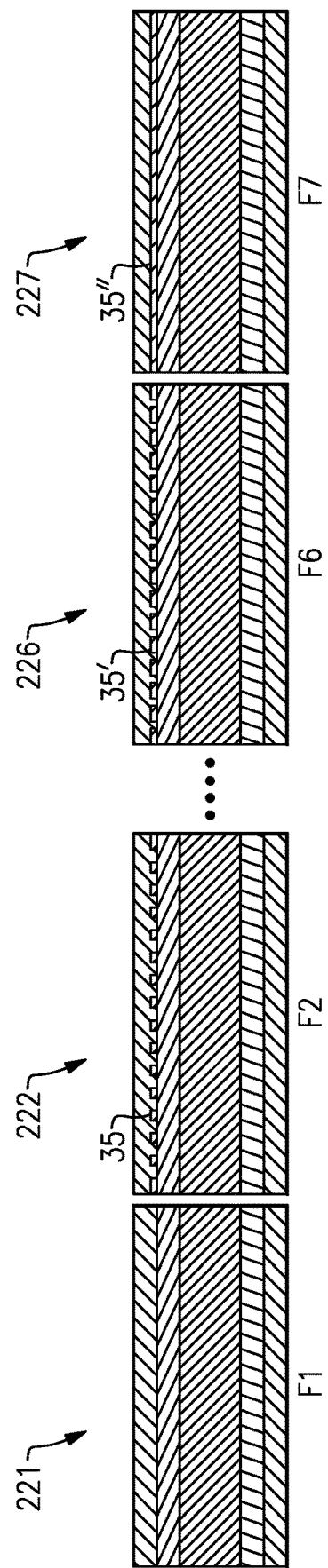

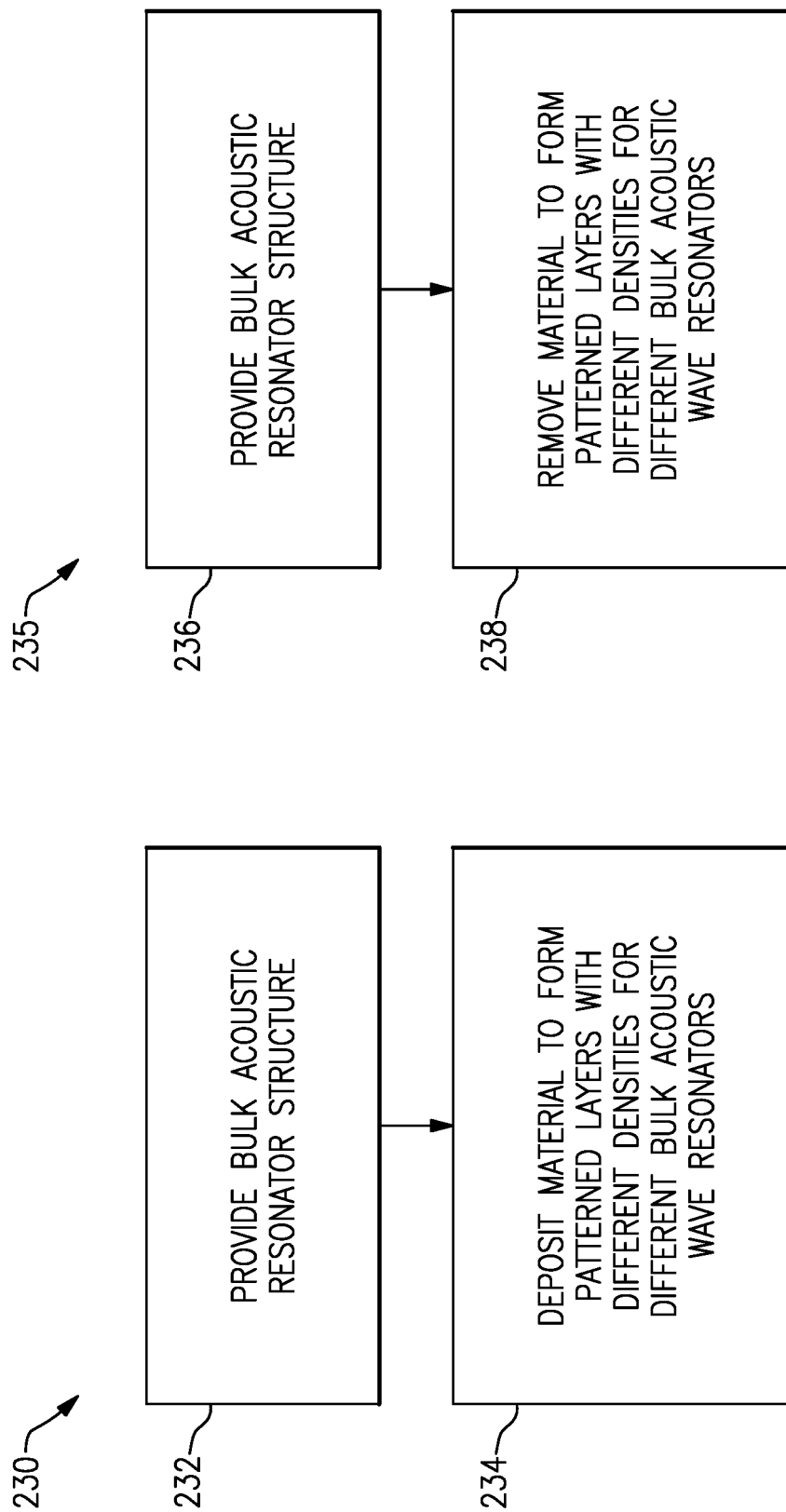

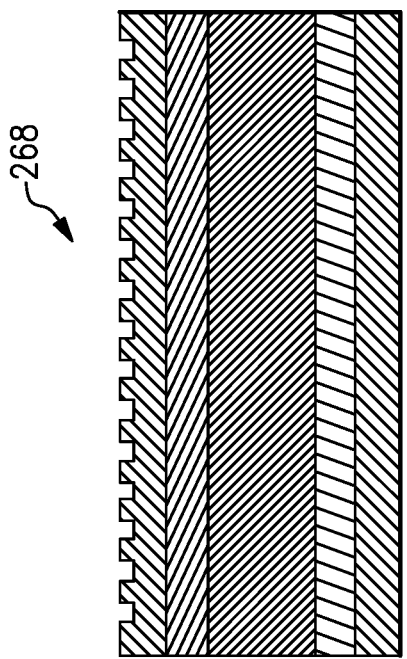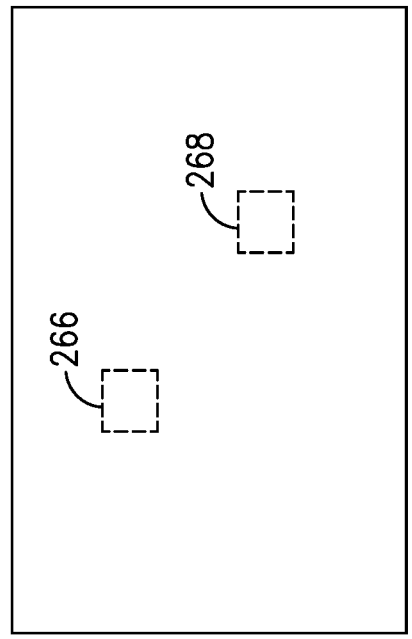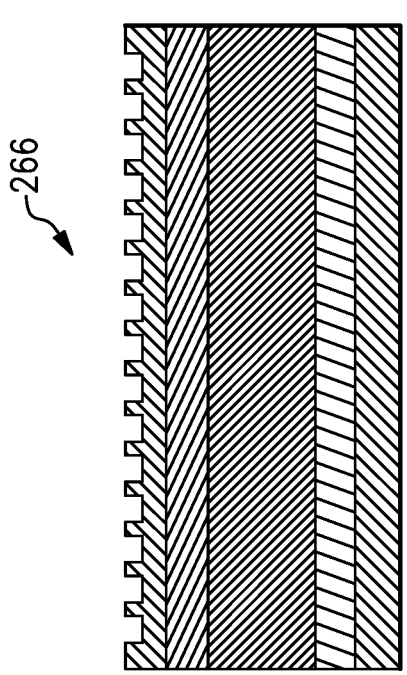
FIG. 26

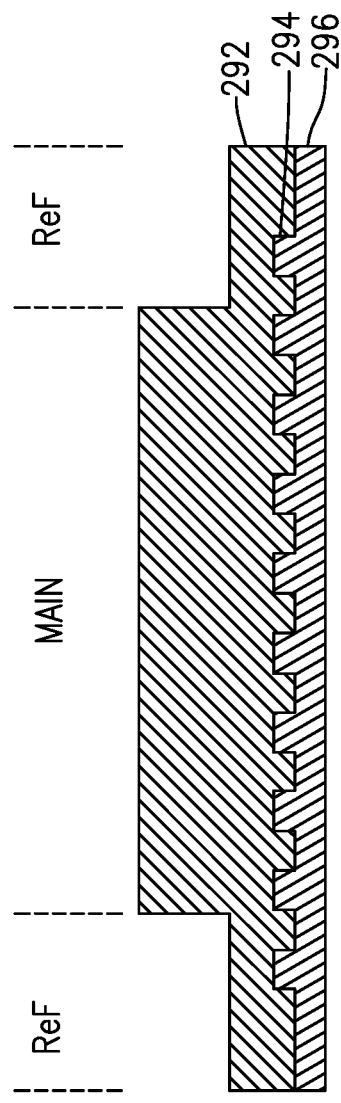
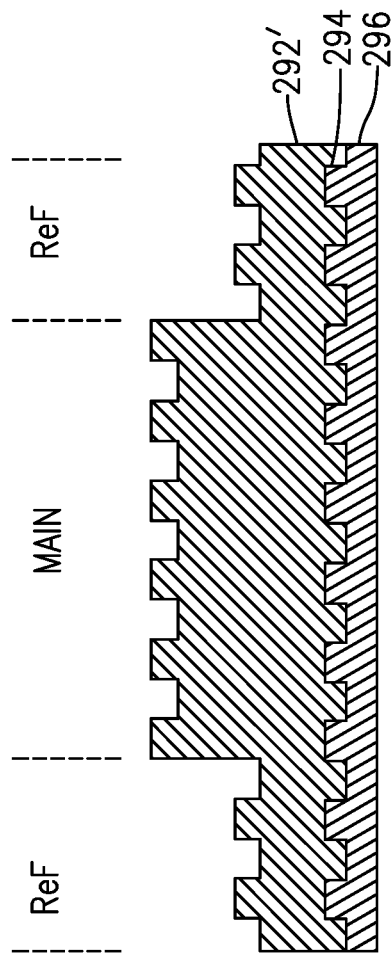

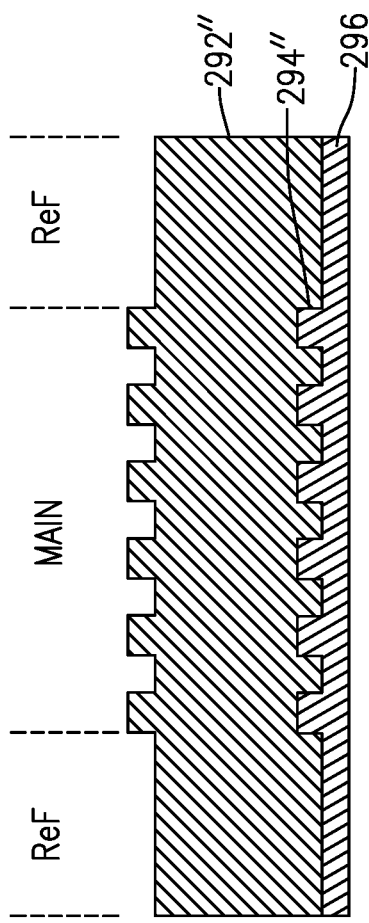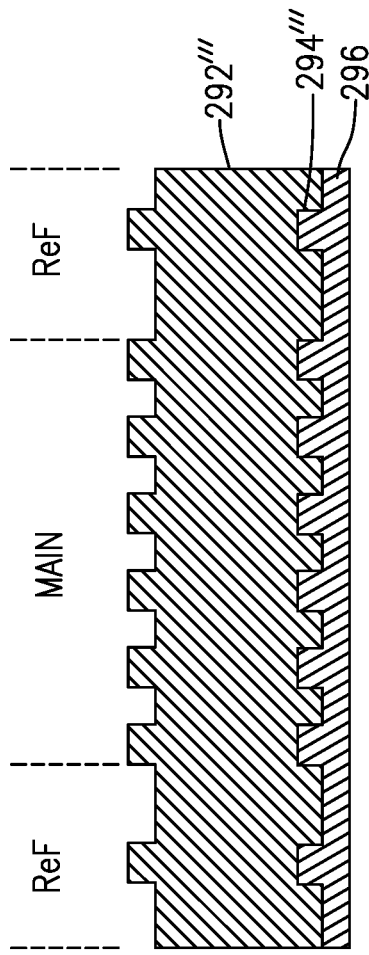

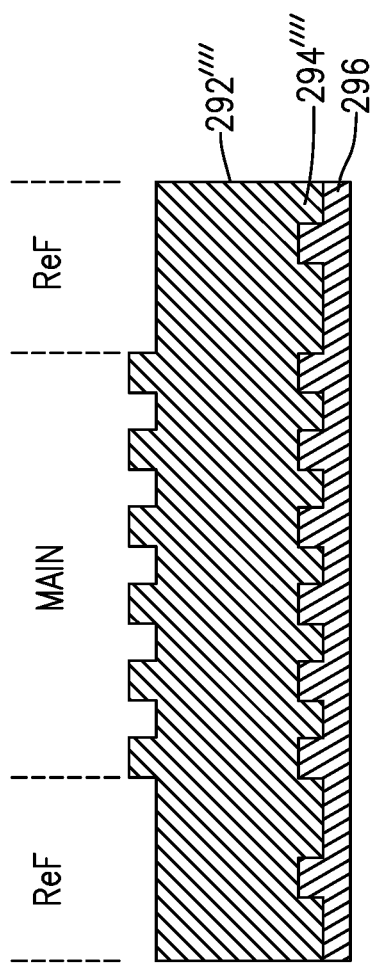

METHODS OF MANUFACTURING BULK ACOUSTIC WAVE RESONATORS WITH PATTERNED MASS LOADING LAYERS

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/085,413, filed Sep. 30, 2020 and entitled "BULK ACOUSTIC WAVE RESONATORS WITH PATTERNED MASS LOADING LAYERS," U.S. Provisional Application No. 63/085,399, filed Sep. 30, 2020 and entitled "BULK ACOUSTIC WAVE RESONATOR WITH MASS LOADING LAYER," and U.S. Provisional Application No. 63/085,398, filed Sep. 30, 2020 and entitled "METHODS OF MANUFACTURING BULK ACOUSTIC WAVE RESONATORS WITH PATTERNED MASS LOADING LAYERS," the disclosures of each of which are hereby incorporated by reference in their entireties.

BACKGROUND

Technical Field

Embodiments of this disclosure relate to acoustic wave devices and, more specifically, to bulk acoustic wave devices.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and solidly mounted resonators (SMRs). In BAW resonators, acoustic waves propagate in a bulk of a piezoelectric layer.

Manufacturing BAW resonators having different resonant frequencies can involve several processing steps. As more BAW resonators with different resonant frequencies are being manufactured on a common die, the number of processing steps to manufacture such BAW resonators can also increase.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter that includes a first bulk acoustic wave resonator and a second bulk acoustic wave resonator. The first bulk acoustic wave resonator includes a first patterned mass loading layer having a first density. The first patterned mass loading layer impacts a resonant frequency of the first bulk acoustic wave resonator. The second bulk acoustic wave resonator includes a second patterned mass loading layer having a second density. The second patterned mass loading layer impacts a resonant frequency of the second bulk acoustic wave resonator. The second density is different than the first density. The bulk acoustic wave filter is arranged to filter a radio frequency signal.

The first and second patterned mass loading layers can be formed during a common processing step. The first patterned mass loading layer can extend from a first piezoelectric layer of the first bulk acoustic wave resonator a same distance as the second patterned mass loading layer extends from a second piezoelectric layer of the second bulk acoustic wave resonator.

The first patterned mass loading layer can have a periodic pattern. The first patterned mass loading layer can include a plurality of strips spaced apart from each other. The first patterned mass loading layer can include a first group of strips and a second group of strips that intersect with the first group of strips. The first patterned mass loading layer can have a concentric pattern.

The first patterned mass loading layer can include a different material than any other layer of the first bulk acoustic wave resonator in physical contact with the first patterned mass loading layer. Alternatively, the first patterned mass loading layer can include a same material as a layer of the first bulk acoustic wave resonator in physical contact with the first patterned mass loading layer. The first patterned mass loading layer can include a metal. The first patterned mass loading layer can include a dielectric material.

The first patterned mass loading layer can be positioned below a piezoelectric layer of the first bulk acoustic wave resonator. Alternatively, the first patterned mass loading layer can be positioned above a piezoelectric layer of the first bulk acoustic wave resonator. The first patterned mass loading layer can be positioned over an electrode positioned over a piezoelectric layer of the first bulk acoustic wave resonator.

The acoustic wave filter can include a third bulk acoustic wave resonator that includes a third patterned mass loading layer having a third density, in which the third density is different than both the first density and the second density.

The first bulk acoustic wave resonator can be a film bulk acoustic wave resonator.

The second density can be higher than the first density, and the resonant frequency of the second bulk acoustic wave resonator can be lower than the resonant frequency of the first bulk acoustic wave resonator. A resonant frequency of the first bulk acoustic wave resonator can be in a range from 0.1% to 10% greater than a resonant frequency of the second bulk acoustic wave resonator. A resonant frequency of the first bulk acoustic wave resonator can be in a range from 1% to 10% greater than a resonant frequency of the second bulk acoustic wave resonator.

The first patterned mass loading layer can have a duty factor in a range from 0.05 to 0.95 in a main acoustically active region of the first bulk acoustic wave resonator. The first patterned mass loading layer can have a duty factor in a range from 0.2 to 0.8 in a main acoustically active region of the first bulk acoustic wave resonator. The second patterned mass loading layer can have a duty factor in a range from 0.05 to 0.95 in a main acoustically active region of the second bulk acoustic wave resonator. The second patterned mass loading layer can have a duty factor in a range from 0.2 to 0.8 in a main acoustically active region of the second bulk acoustic wave resonator.

Another aspect of this disclosure is an acoustic wave filter that includes a first bulk acoustic wave resonator and a second bulk acoustic wave resonator. The first bulk acoustic wave resonator includes a first patterned mass loading layer and a periodic pattern. The second bulk acoustic wave resonator includes a second patterned mass loading layer. The second mass loading provides greater mass loading than the first patterned mass loading layer such that the second patterned mass loading layer causes the second bulk acoustic wave resonator to have a lower resonant frequency than the first bulk acoustic wave resonator. The bulk acoustic wave filter is arranged to filter a radio frequency signal.

Another aspect of this disclosure is an acoustic wave die that includes a first bulk acoustic wave resonator on the bulk acoustic wave die and a second bulk acoustic wave resonator on the bulk acoustic wave die. The first bulk acoustic wave resonator includes a first patterned mass loading layer having a first density. The first patterned mass loading layer impacts a resonant frequency of the first bulk acoustic wave resonator. The second bulk acoustic wave resonator includes a second patterned mass loading layer having a second density. The second density is higher than the first density. The second patterned mass loading layer impacts a resonant frequency of the second bulk acoustic wave resonator.

The first bulk acoustic wave resonator and the second bulk acoustic wave resonator can be included in a same filter. Alternatively, the first bulk acoustic wave resonator and the second bulk acoustic wave resonator can be included in different filters. Such different can be filters are included in a multiplexer.

The first and second patterned mass loading layers can be formed during a common processing step. The first patterned mass loading layer can extend from a first piezoelectric layer of the first bulk acoustic wave resonator a substantially same distance as the second patterned mass loading layer extends from a second piezoelectric layer of the second bulk acoustic wave resonator.

The first patterned mass loading layer can have a periodic pattern. The first patterned mass loading layer can include a plurality of strips spaced apart from each other.

The first patterned mass loading layer can include a different material than any other layer of the first bulk acoustic wave resonator in physical contact with the first patterned mass loading layer. Alternatively, the first patterned mass loading layer can include a same material as a layer of the first bulk acoustic wave resonator in physical contact with the first patterned mass loading layer. The first patterned mass loading layer can include a metal. The first patterned mass loading layer can include a dielectric material.

The acoustic wave die can include a third bulk acoustic wave resonator that includes a third patterned mass loading layer having a third density, in which the third density is different than both the first density and the second density.

A resonant frequency of the first bulk acoustic wave resonator can be in a range from 0.1% to 10% greater than a resonant frequency of the second bulk acoustic wave resonator. A resonant frequency of the first bulk acoustic wave resonator can be in a range from 1% to 10% greater than a resonant frequency of the second bulk acoustic wave resonator.

The first patterned mass loading layer can have a duty factor in a range from 0.05 to 0.95 in a central area of an active region of the first bulk acoustic wave resonator. The first patterned mass loading layer can have a duty factor in a range from 0.2 to 0.8 in a central area of an active region of the first bulk acoustic wave resonator.

Another aspect of this disclosure is a radio frequency module that includes an acoustic filter with a bulk acoustic wave device having a patterned mass loading layer and a radio frequency circuit element coupled to the acoustic wave filter. The acoustic wave filter and the radio frequency circuit element are enclosed within a common module package.

The radio frequency circuit element can be a radio frequency amplifier arranged to amplify a radio frequency signal. The radio frequency circuit element can be a switch configured to selectively couple the acoustic wave filter to a port of the radio frequency module.

Another aspect of this disclosure is a wireless communication device that includes an acoustic wave filter with a bulk acoustic wave device having a patterned mass loading layer, an antenna operatively coupled to the acoustic wave filter, a radio frequency amplifier operatively coupled to the acoustic wave filter and configured to amplify a radio frequency signal, and a transceiver in communication with the radio frequency amplifier.

The wireless communication device can include a baseband processor in communication with the transceiver. The acoustic wave filter can be included in a radio frequency front end. The wireless communication device can be a user equipment.

Another aspect of this disclosure is a bulk acoustic wave resonator that includes a first electrode over an acoustic reflector, a piezoelectric layer over the first electrode, a second electrode over the piezoelectric layer, and a patterned mass loading layer having a duty factor in a range from 0.2 to 0.8 in a main acoustically active region of the bulk acoustic wave resonator. The patterned mass loading layer is arranged to affect a resonant frequency of the bulk acoustic wave resonator.

The patterned mass loading layer can have a periodic pattern. The patterned mass loading layer can include a plurality of strips spaced apart from each other. The patterned mass loading layer can have a duty factor in a range from 0.3 to 0.7 in the main acoustically active region.

The patterned mass loading layer can include a different material than any other layer of the bulk acoustic wave resonator in physical contact with the patterned mass loading layer. The patterned mass loading layer can include a same material as a layer of the bulk acoustic wave resonator in physical contact with the patterned mass loading layer. The patterned mass loading layer can include a metal. The patterned mass loading layer can include a dielectric material.

The patterned mass loading layer can be positioned below the piezoelectric layer. The patterned mass loading layer can be positioned above the piezoelectric layer. The patterned mass loading layer can be positioned over the second electrode.

The acoustic reflector can be an air cavity. Alternatively, the acoustic reflector can be is a solid acoustic mirror.

Another aspect of this disclosure is an acoustic wave filter that includes a bulk acoustic wave resonator and a plurality of additional acoustic wave resonators. The bulk acoustic wave resonator includes a first electrode over an acoustic reflector, a piezoelectric layer over the first electrode, a second electrode over the piezoelectric layer, and a patterned mass loading layer having a duty factor in a range from 0.2 to 0.8 in a main acoustically active region of the bulk acoustic wave resonator. The patterned mass loading layer is arranged to affect a resonant frequency of the bulk acoustic wave resonator. The acoustic wave filter is configured to filter a radio frequency signal.

The patterned mass loading layer can have a periodic pattern. The bulk acoustic wave resonator can be a series resonator. The bulk acoustic wave resonator can be a shunt resonator.

The filter can be included in a wireless communication device that also includes an antenna operatively coupled to the acoustic wave filter, a radio frequency amplifier operatively coupled to the acoustic wave filter and configured to amplify a radio frequency signal, and a transceiver in communication with the radio frequency amplifier. The wireless communication device can include a baseband processor in communication with the transceiver. The acoustic wave filter can be included in a radio frequency front end. The wireless communication device can be a user equipment.

Another aspect of this disclosure is a method of manufacturing bulk acoustic wave resonators. The method includes providing a bulk acoustic wave resonator structure including a support substrate; and during a common processing step, forming (i) a first patterned mass loading layer on the bulk acoustic wave resonator structure in a first area for a first bulk acoustic wave resonator and (ii) a second patterned mass loading layer on the bulk acoustic wave resonator structure in a second area for a second bulk acoustic wave resonator. The second patterned mass loading layer has a different density than the first patterned mass loading layer.

The bulk acoustic wave resonator structure can include a passivation layer and an electrode layer. The bulk acoustic wave resonator structure can also include a piezoelectric layer. The bulk acoustic wave resonator structure can also include a second electrode layer, where the piezoelectric layer is positioned between the first electrode layer and the second electrode layer. The bulk acoustic wave resonator structure can also include a second passivation layer over the second electrode layer.

The first patterned mass loading layer can include a different material than any layer of the first bulk acoustic wave resonator that is in physical contact with the first patterned mass loading layer. Alternatively, the first patterned mass loading layer and a layer of the first bulk acoustic wave resonator structure that is in physical contact with the first patterned mass loading layer can both be of a same material. The first patterned mass loading layer can include a dielectric material. The first patterned mass loading layer can include a metal.

The method can also include forming, during the common processing step, a third patterned mass loading layer over the bulk acoustic wave resonator structure in a third area for a third bulk acoustic wave resonator. The third patterned mass loading layer has a different density than both the first and second patterned mass loading layers.

The common processing step can include depositing material of the first and second patterned layers. The common processing step can include removing material to form the first and second patterned layers.

The method can further include forming, during the common processing step, a third patterned mass loading layer over the bulk acoustic wave resonator structure in a third area for a third bulk acoustic wave resonator; and removing material to increase a depth between features of the third patterned mass loading layer. The depth between the features of the third patterned mass loading layer can be greater than a depth between features of the first patterned mass loading layer.

The first patterned mass loading layer can have a periodic pattern. The first patterned mass loading layer can include a plurality of strips spaced apart from each other. The first patterned mass loading layer can include a first group of strips and a second group of strips that intersect with the first group of strips. The first patterned mass loading layer can have a concentric pattern.

The first bulk acoustic wave resonator can be a film bulk acoustic wave resonator. Alternatively, the first bulk acoustic wave resonator can be a solidly mounted resonator.

The method can include interconnecting a plurality of bulk acoustic wave resonators such that the first and second bulk acoustic wave resonators are included in a common filter. Alternatively, the can include interconnecting a plurality of bulk acoustic wave resonators such that the first bulk acoustic wave resonator is included in a first filter and the second bulk acoustic wave resonator is included in a second filter. A multiplexer can include the first filter and the second filter. The multiplexer can be a duplexer.

After manufacture, the first patterned mass loading layer can impact a resonant frequency of the first bulk acoustic wave resonator and the second patterned mass loading layer can impact a resonant frequency of the second bulk acoustic wave resonator. The resonant frequency of the first bulk acoustic wave resonator can be in a range from 0.1% to 10% greater than the resonant frequency of the second bulk acoustic wave resonator. The resonant frequency of the first bulk acoustic wave resonator can be in a range from 1% to 10% greater than the resonant frequency of the second bulk acoustic wave resonator.

The first patterned mass loading layer can have a duty factor in a range from 0.05 to 0.95 in a main acoustically active region of the first bulk acoustic wave resonator. The second patterned mass loading layer can have a duty factor in a range from 0.05 to 0.95 in a main acoustically active region of the second bulk acoustic wave resonator.

The first patterned mass loading layer can have a duty factor in a range from 0.2 to 0.8 in a main acoustically active region of the first bulk acoustic wave resonator. The second patterned mass loading layer can have a duty factor in a range from 0.2 to 0.8 in a main acoustically active region of the second bulk acoustic wave resonator.

Another aspect of this disclosure is a method of manufacturing bulk acoustic wave resonators. The method includes providing a bulk acoustic wave resonator structure including a support substrate; and during a common processing step, depositing material to form (i) a first patterned mass loading layer over the bulk acoustic wave resonator structure in a first area for a first bulk acoustic wave resonator and (ii) a second patterned mass loading layer over the bulk acoustic wave resonator structure in a second area for a second bulk acoustic wave resonator, the second patterned mass loading layer having a different density than the first patterned mass loading layer.

Another aspect of this disclosure is a method of manufacturing bulk acoustic wave resonators. The method includes providing a bulk acoustic wave resonator structure including a support substrate; and during a common processing step, etching material to form (i) a first patterned mass loading layer on the bulk acoustic wave resonator structure in a first area for a first bulk acoustic wave resonator and (ii) a second patterned mass loading layer on the bulk acoustic wave resonator structure in a second area for a second bulk acoustic wave resonator, the second patterned mass loading layer having a different density than the first patterned mass loading layer.

Another aspect of this disclosure is a bulk acoustic wave resonator that includes a first electrode over an acoustic reflector, a piezoelectric layer over the first electrode, a second electrode over the piezoelectric layer, and a patterned mass loading layer at least contributing to a difference in mass loading between a main acoustically active region and a recessed frame region. The patterned mass loading layer is arranged to affect a resonant frequency of the bulk acoustic wave resonator.

The patterned mass loading can be included in both the main acoustically active region and the recessed frame region, and the patterned mass loading layer can have a higher density in the main acoustically active region than in the recessed frame region.

The patterned mass loading layer can be included in the main acoustically active region, and the recessed frame region can be free from the patterned mass loading layer.

The patterned mass loading layer can have a periodic pattern in the first area. The patterned mass loading layer can include a plurality of strips spaced apart from each other.

The patterned mass loading layer can include a different material than any layer of the bulk acoustic wave resonator that is in physical contact with the patterned mass loading layer. The patterned mass loading layer and a layer of the bulk acoustic wave resonator structure that is in physical contact with the patterned mass loading layer can both be of a same material.

The patterned mass loading layer can have a duty factor that is not greater than 0.3 in the second area. The patterned mass loading layer can have a duty factor in a range from 0.05 to 0.3 in the second area. The patterned mass loading layer can have a duty factor in the first area that is greater than the duty factor in the second area. The patterned mass loading layer can have a duty factor in a range from 0.3 to 0.8 in the first area.

Another aspect of this disclosure is an acoustic wave filter that includes a bulk acoustic wave resonator and a plurality of additional acoustic wave resonators. The bulk acoustic wave resonator includes a first electrode over an acoustic reflector, a piezoelectric layer over the first electrode, a second electrode over the piezoelectric layer, and a patterned mass loading layer at least contributing to a difference in mass loading between a main acoustically active region and a recessed frame region. The patterned mass loading layer is arranged to affect a resonant frequency of the bulk acoustic wave resonator. The acoustic wave filter is configured to filter a radio frequency signal.

Another aspect of this disclosure is a method of manufacturing a bulk acoustic wave resonator. The method includes providing a bulk acoustic wave resonator structure including a support substrate; and during a common processing step, forming a patterned mass loading layer on the bulk acoustic wave resonator structure such that the patterned mass loading layer has a first density in a first area of the bulk acoustic wave resonator structure and a second density in a second area of the bulk acoustic wave resonator structure. The first area corresponds to a main acoustically active region of the bulk acoustic wave resonator. The second area corresponds to a recessed frame region of the bulk acoustic wave resonator. The first density is higher than the second density.

The method can further include forming a passivation layer over an upper electrode of the bulk acoustic wave resonator without etching material of the passivation layer over the recessed frame region, in which the upper electrode is over a piezoelectric layer of the bulk acoustic wave resonator.

The patterned mass loading layer can have a duty factor that is not greater than 0.3 in the second area. The patterned mass loading layer can have a duty factor in a range from 0.05 to 0.3 in the second area. The patterned mass loading layer can have a duty factor in the first area that is greater than the duty factor in the second area. The patterned mass loading layer can have a duty factor in a range from 0.3 to 0.8 in the first area.

The bulk acoustic wave resonator structure can include a passivation layer over the support substrate, an electrode layer over the passivation layer, and a piezoelectric layer over the electrode layer, in which the patterned mass loading layer is formed over the piezoelectric layer. The bulk acoustic wave resonator structure can include a passivation layer over the support substrate, a first electrode layer over the passivation layer, a piezoelectric layer over the first electrode layer, and a second electrode over the piezoelectric layer, in which the patterned mass loading layer is formed over the second electrode.

The common processing step can include depositing material of the patterned mass loading layer. The common processing step can include removing material to form the patterned mass loading layer.

The patterned mass loading layer can have a periodic pattern in the first area. The patterned mass loading layer can include a plurality of strips spaced apart from each other.

The present disclosure relates to U.S. patent application Ser. No. 17/218,725, titled "BULK ACOUSTIC WAVE RESONATORS WITH PATTERNED MASS LOADING LAYERS," filed on even date herewith, the entire disclosure of which is hereby incorporated by reference herein. The present disclosure relates to U.S. patent application Ser. No. 17/218,950, titled "BULK ACOUSTIC WAVE RESONATOR WITH MASS LOADING LAYER," filed on even date herewith, the entire disclosure of which is hereby incorporated by reference herein. The present disclosure relates to U.S. patent application Ser. No. 17/219,525, titled "BULK ACOUSTIC WAVE RESONATOR WITH PATTERNED MASS LOADING LAYER AND RECESSED FRAME," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 15A includes a cross-sectional view of a BAW material stack according to an embodiment. FIGS. 15B to 15H illustrate example shapes for gratings of a patterned mass loading layer.

FIG. 22 is an example schematic cross-sectional diagram showing material stacks of example BAW resonators of the ladder filter of FIG. 21 with different patterned mass loading layers.

FIGS. 23A and 23B are flow diagrams of example methods of forming BAW resonators with patterned mass loading layers.

FIG. 26 is a top plan view schematically illustrating a BAW die that includes BAW resonators with different patterned mass loading layers according to an embodiment.

FIG. 29A is a schematic cross-sectional diagram of a main acoustically active region and a recessed frame region of part of a BAW resonator with a patterned mass loading layer. FIG. 29B is a schematic cross-sectional diagram of a main acoustically active region and a recessed frame region of part of another BAW resonator with a patterned mass loading layer.

FIG. 31A is a schematic cross-sectional diagram of part of a BAW resonator with a patterned mass loading layer in a main acoustically active region and a recessed frame region without a patterned mass loading layer. FIG. 31B is a schematic cross-sectional diagram of part of a BAW resonator with a patterned mass loading layer with a higher density in a main acoustically active region than in a recessed frame region. FIG. 31C is a schematic cross-sectional diagram of part of a BAW resonator with a patterned mass loading layer with a higher density in a main acoustically active region than in a recessed frame region.

DETAILED DESCRIPTION OF CERTAIN EMBODIMENTS

Figure 1A:
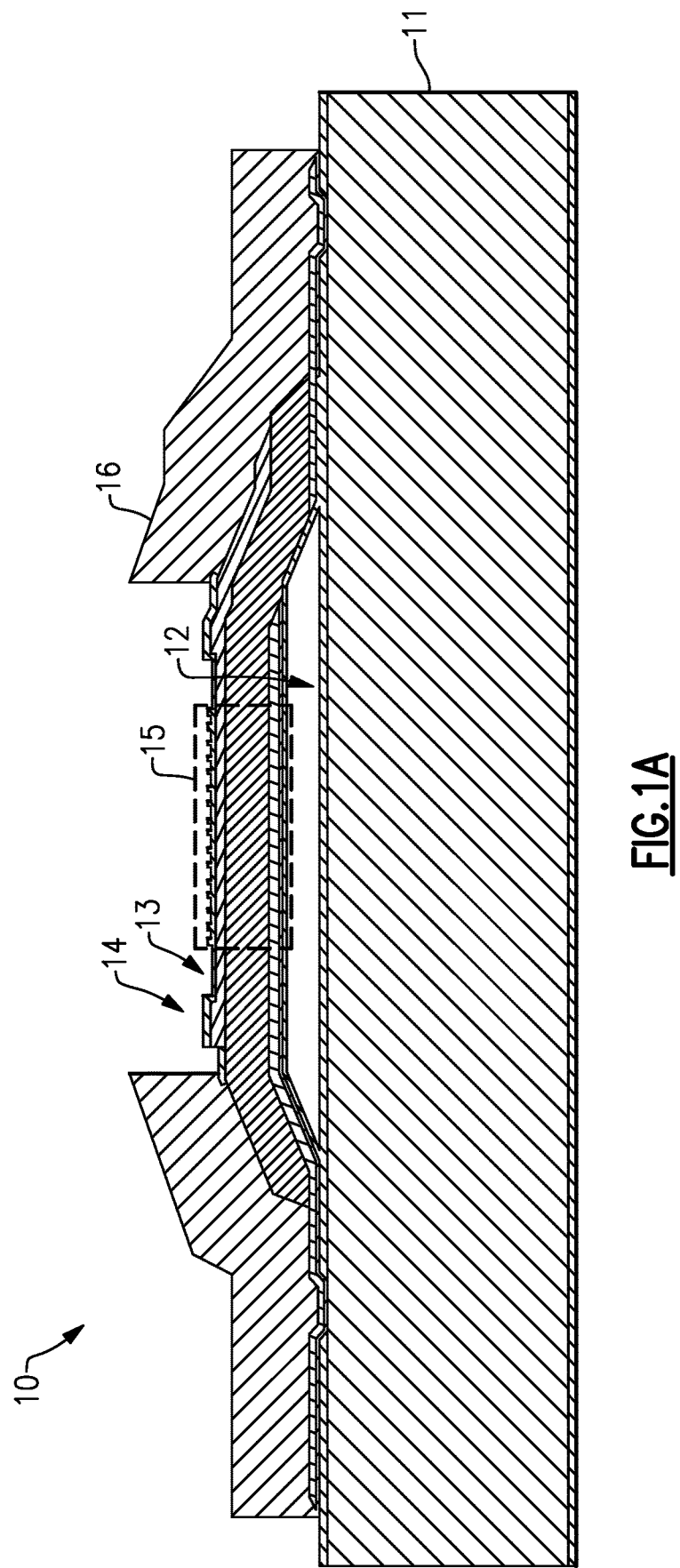
FIG. 1A is a schematic cross-sectional diagram of a bulk acoustic wave (BAW) resonator according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Bulk acoustic wave (BAW) filters with BAW resonators have a plurality of different resonant frequencies can meet a variety of design specifications including insertion loss at a pass band edge, rejection outside of a passband of the BAW filter, power handling, and matching to a power amplifier and/or a low noise amplifier. Manufacturing BAW resonators with a plurality of different resonant frequencies with a lower complexity process is desirable.

Aspects of this disclosure relate to BAW resonators having different patterned mass loading layers and methods of manufacturing such BAW resonators. BAW resonators with different patterned mass loading layers can have different resonant frequencies. Patterned mass loading layers with different densities can achieve different mass loading that results in such different resonant frequencies. A BAW resonator with a lower density patterned mass loading layer can have a higher resonant frequency than another BAW resonator that is the same except for having a higher density patterned mass loading layer. In certain instances, the patterned mass loading layer can include a plurality of mass loading strip lines arranged in a periodic pattern. Material of the patterned mass loading layer can be denser than material of another layer in physical contact with the patterned mass loading layer. Although embodiments may be discussed with reference to BAW resonators, any suitable principles and advantages disclosed herein can be implemented in any suitable BAW device.

Density of a patterned mass loading layer can tune resonant frequency of a BAW resonator. A patterned mass loading layer can have a duty factor in a range from 0.05 to 0.95 in a central area of an active region of the BAW resonator. Increasing density of the patterned mass loading layer can decrease the resonant frequency. On the other hand, decreasing density of the patterned mass loading layer can increase the resonant frequency.

Any two BAW resonators of a filter can be tuned differently by having patterned mass loading layers with different densities. For example, two series BAW resonators of a filter can have patterned mass loading layers with different densities. As another example, two shunt BAW resonators of a filter can have patterned mass loading layers with different densities. As one more example, a series BAW resonator and shunt BAW resonator of a filter can have patterned mass loading layers with different densities.

In some instances, two or more BAW resonators of a filter can have patterned mass loading layer with the same density while one or more other BAW resonators of the filter have patterned mass loading layers with different densities. Such BAW resonators with patterned mass loading layers with the same density can have a resonant frequency tuned by a same amount by respective patterned mass loading layers.

The patterned mass loading layer impacts the resonant frequency of a BAW resonator. Other layers of the BAW resonator also impact the resonant frequency. Patterned mass loading layers with different densities can account for some or all of a difference in resonant frequency between two BAW resonators. Differences in mass loading provided by one or more other layers (e.g., one or more electrode layers and/or one or more passivation layers) together with patterned mass loading layers with different densities can cause BAW resonators to have different resonant frequencies in certain applications. Alternatively, a difference in density in patterned mass loading layers can account for an entire difference in resonant frequency between BAW resonators in various applications.

Some methods of manufacturing BAW resonators involve multiple process steps to make BAW resonators having different resonant frequencies. A lithography and etch process can be performed for each different resonant frequency. Lithography and etch processes can be performed to form higher resonant frequencies. A lithography and deposition process can be performed for each different resonant frequency. Lithography and deposition processes can be performed to form lower resonant frequencies. As BAW resonators with more different resonant frequencies are included on a die, the number of process steps can increase. With more processing steps, manufacturing BAW resonators can become more complex and expensive.

Patterned mass loading layers having different densities can be formed in a common processing step. Accordingly, methods of manufacturing BAW resonators disclosed herein can reduce a number of processing steps to form BAW resonators having a plurality of different resonant frequencies.

The common processing step can reduce process complexity and cost of manufacturing BAW resonators. By using a common processing step to modify resonant frequency of a plurality of different BAW resonators, resonant frequency can be adjusted using a common processing step and a single parameter. Adjusting density of a mass loading layer between no fill and 100% fill can enable resonant frequency of a BAW resonator to be tuned within a tuning range. This can provide flexibility in tuning resonant frequency within the tuning range with one photolithography process step. The common processing step can be used for forming BAW resonators with different frequencies that are included in the same filter. The common processing step can be used for forming BAW resonators with different frequencies that are included in two or more filters on a shared die.

Patterned mass loading layers can be precisely manufactured. Photolithography techniques for manufacturing surface acoustic wave (SAW) devices can be applied to forming a patterned mass loading layer in certain applications. In some applications, patterned mass loading layers can be formed during processes for manufacturing SAW and BAW devices on the same die. Methods disclosed herein can achieve accurate control of the resonant frequency of each BAW resonator.

Patterned mass loading layers can include a strip line patterns. The strip patterns can have a pitch $P < 3\,h$, where h is the total thickness of a resonator stack from a bottom side passivation over an acoustic reflector (e.g., an air cavity or solid acoustic mirror) to a top side passivation. In certain applications, $P < 2.4\,h$ is preferred. The patterned mass loading layer can have a thickness d, where $h < 1.5\,h$. The patterned mass loading layer can have a thickness d, where $0.001\,h < d < 1.5\,h$. In certain applications, $d < 0.3\,h$ is preferred.

The patterned mass loading layer can have any suitable pattern, such as a periodic pattern, a gradient pattern, a pitched modulated pattern, or a random pattern. The patterned mass loading layer can be equivalent to an even mass loading distribution. In plan view, shapes of pattern can include stripe, grating, gradient, the like, or any suitable combination thereof. In cross-sectional view, shapes of the pattern can include a rectangle, a trapezoidal, lens, the like, or any suitable combination thereof.

The patterned mass loading layer can be positioned over an acoustic reflector (e.g., an air cavity or solid acoustic mirror) of a BAW device, in which the acoustic reflector is positioned between a support substrate and a lower electrode of the BAW device. The patterned mass loading layer can be located on top of a BAW device, between a top electrode and a passivation, or in any other suitable position over an acoustic reflector, where the acoustic reflector is positioned between a support substrate and a lower electrode of the BAW device. The mass loading pattern can be located in at least a main acoustically active region of a BAW device. In certain applications, the mass loading pattern can be in a recessed frame region. In such applications, the mass loading pattern can have a lower density in the recessed frame region than in the main acoustically active region.

The patterned mass loading layer can include any suitable material such a dielectric, a metal, a metal alloy, or any suitable combination thereof. Patterned mass loading layers of denser materials can change resonant frequency by more than less dense patterned mass loading layers for the same change in duty factor. Patterned mass loading layers of denser materials can adjust resonant frequency with smaller changes in duty factor compared to less dense patterned mass loading layers. The patterned mass loading layer can include a dielectric layer, such as silicon dioxide ($SiO_2$), silicon nitride (SiN), aluminum oxide ($Al_2O_3$), silicon carbide (SiC), aluminum nitride (AlN), titanium nitride (TiN), silicon oxynitride (SiON), or diamond like carbon (DLC). The patterned mass loading layer can include a metal layer, such as titanium (Ti), ruthenium (Ru), molybdenum (Mo), tungsten (W), platinum (Pt), aluminum (Al), iridium (Ir), chromium (Cr), cobalt (Co), nickel (Ni), copper (Cu), gold (Au), or any suitable alloy thereof.

Example BAW resonators with patterned mass loading layers will now be discussed. Any suitable principles and advantages of these BAW resonators can be implemented together with each other. Although embodiments disclosed herein include a single patterned mass loading layer, any suitable principles and advantages disclosed herein can be applied to a BAW resonator with two or more patterned mass loading layers. In applications with two or more patterned mass loading layers, the mass loading layers can have different patterns or the same patterns.

FIG. 1A is a schematic cross-sectional diagram of a BAW resonator 10 according to an embodiment. The BAW resonator 10 includes a patterned mass loading layer. The patterned mass loading layer impacts the resonant frequency of the BAW resonator 10. The BAW resonator 10 is a film bulk acoustic wave resonator (FBAR). As illustrated, the BAW resonator 10 includes a support substrate, an air cavity 12, a recessed frame structure 13, a raised frame structure 14, a material stack 15 in an active region, and an electrical interconnect layer 16. The material stack 15 includes the patterned mass loading layer. More details about the material stack 15 will be discussed below with reference to FIG. 2.

An active region or active domain of the BAW resonator 10 can be defined by a portion of a piezoelectric layer of the material stack 15 that is in contact with both a lower electrode and an upper electrode and overlaps an acoustic reflector, such as the air cavity 12 or a solid acoustic mirror. In applications where there are a plurality of piezoelectric layers of a BAW device, the active region can be defined by piezoelectric material of the piezoelectric layers being in contact with both a lower electrode and an upper electrode over an acoustic reflector. The active region corresponds to where voltage is applied on opposing sides of the piezoelectric layer over the acoustic reflector. The active region can be the acoustically active region of the BAW resonator 10. The BAW resonator 10 also includes a recessed frame region with the recessed frame structure 13 in the active region and a raised frame region with the raised frame structure 14 in the active region. Acoustic activity can be reduced significantly in the recessed frame region and the raised frame region. A main acoustically active region can be the central part of the active region that is free from frame structures 13 and 14. The main resonant frequency of the BAW resonator 10 can be set by the main acoustically active region.

While FIG. 1A includes a recessed frame structure 13 and a raised frame structure 14, other frame structures can alternatively or additionally be implemented. For example, a raised frame structure with multiple layers including a layer between an electrode of a BAW resonator and a piezoelectric layer can be implemented. As another example, a raised frame structure can include a layer embedded in piezoelectric material. As another example, a floating raised frame structure can be implemented. As one more example, a raised frame structure can be implemented without a recessed frame structure in a frame zone.

The air cavity 12 is an example of an acoustic reflector. As illustrated, the air cavity 12 is located above the support substrate 11. The air cavity 12 is positioned between the support substrate 11 and the material stack 15. In some other embodiments, an air cavity can be etched into a support substrate. The support substrate 11 can be a silicon substrate. The support substrate 11 can be any other suitable support substrate. The electrical interconnect layer 16 can electrically connect electrodes of the BAW resonator 10 one or more other BAW resonators, one or more other circuit elements, one or more signal ports, the like, or any suitable combination thereof.

Figure 1B:
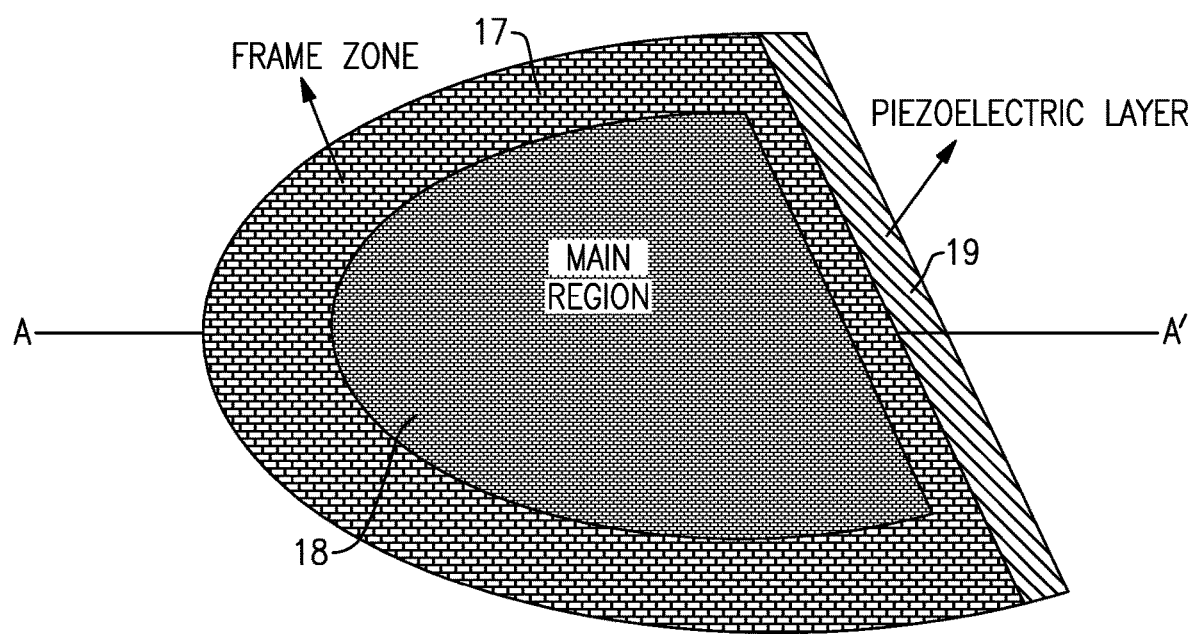
FIG. 1B is an example plan view of the BAW resonator of FIG. 1A.

FIG. 1B is an example plan view of the BAW resonator 10 of FIG. 1A. The cross-sectional view of FIG. 1A is along the line from A to A' in FIG. 1B. As shown in FIG. 1B, the BAW resonator 10 includes a frame zone 17 around the perimeter of a main acoustically active region 18 of the BAW resonator 10. The frame zone 17 can include the recessed frame structure 13 and the raised frame structure 14 of FIG. 1A. The frame zone 17 can be referred to as a border ring in certain instances. The material stack 15 can extend further above a piezoelectric layer 19 in a raised frame region than in the main acoustically active area 18 and the material stack 15 can extend further above the piezoelectric layer 19 in the main acoustically active area 18 than in the recessed frame region. FIG. 1B illustrates the BAW resonator 10 with a semi-elliptical shape in plan view.

Figure 1C:
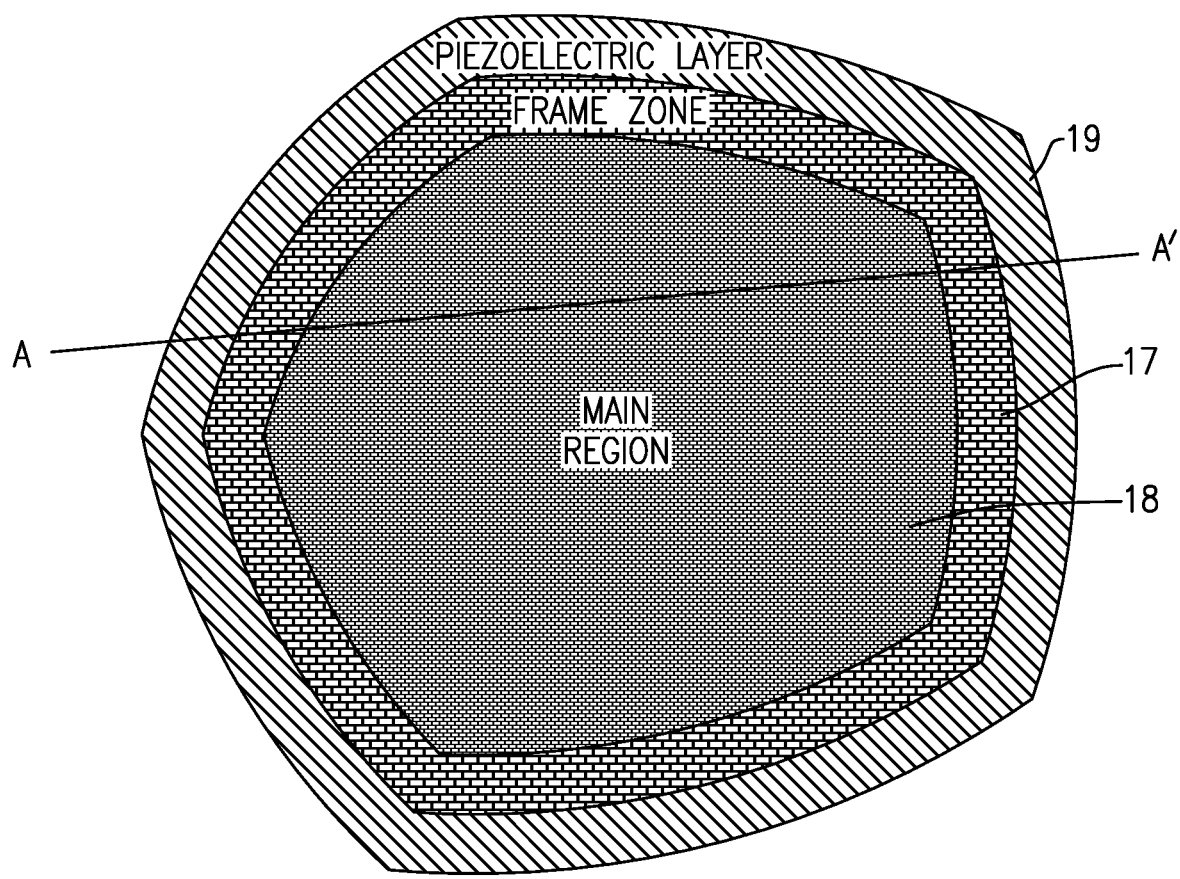
FIG. 1C is another example plan view of the BAW resonator of FIG. 1A.

FIG. 1C is another example plan view of the BAW resonator 10 of FIG. 1A. The cross-sectional view of FIG. 1A is along the line from A to A' in FIG. 1C. FIG. 1C illustrates the BAW resonator 10 with a pentagon shaped with curved sides in plan view.

In some other embodiments, a BAW resonator in accordance with any suitable principles and advantages disclosed herein can have any other suitable shape in plan view, such as a quadrilateral shape, a quadrilateral shape with curved sides, a pentagon shape, a semi-circular shape, a circular shape, ellipsoid shape, or the like.

Figure 2:
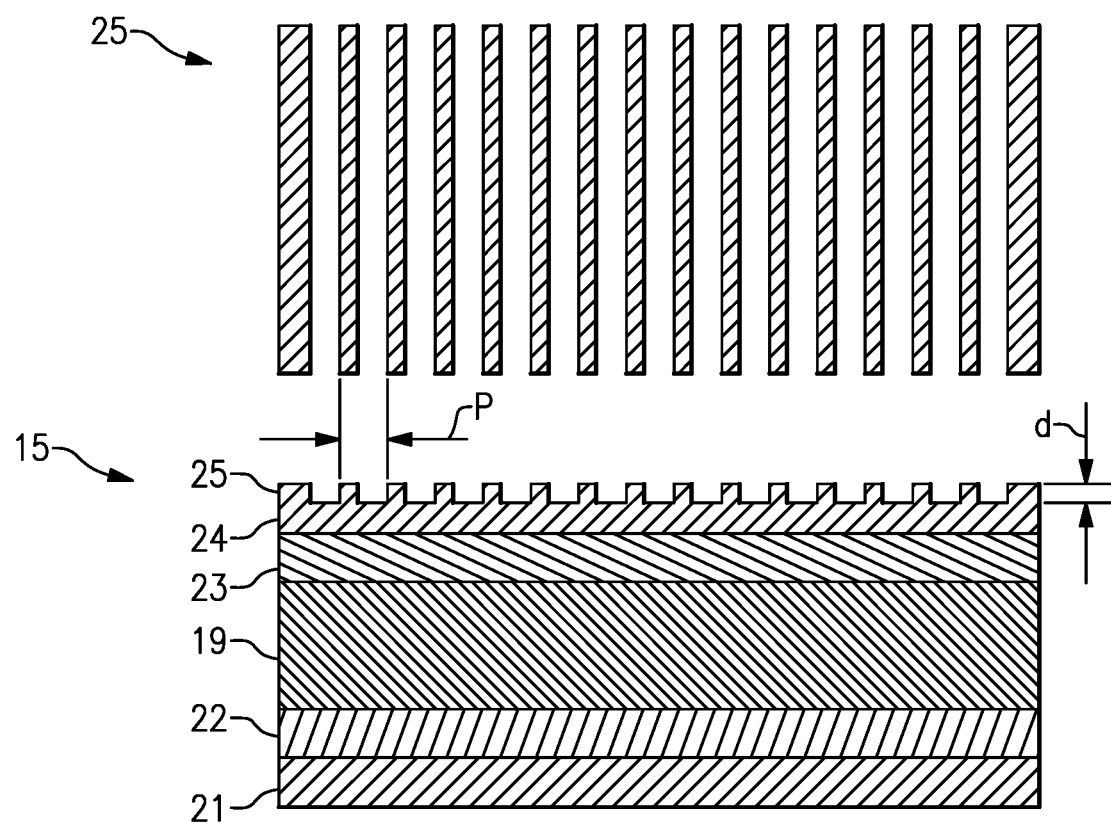
FIG. 2 includes a schematic cross-sectional view of the material stack of the BAW resonator of FIG. 1A.

FIG. 2 includes a schematic cross-sectional view of the material stack 15 of the BAW resonator 10 of FIG. 1A. FIG. 2 also illustrates a patterned mass loading layer 25 in plan view. The material stack 15 is located in the main acoustically active region of the BAW resonator 10. The material stack 15 is positioned over the air cavity 12 in FIG. 1A. The material stack 15 can be positioned over any other suitable acoustic reflector, such as a solid acoustic mirror, in another BAW resonator. As illustrated, the material stack 15 includes a first passivation layer 21, a first electrode layer 22, a piezoelectric layer 19, a second electrode layer 23, a second passivation layer 24, and a patterned mass loading layer 25.

In the material stack 15, the piezoelectric layer 19 is positioned between the first electrode layer and the second electrode layer 23. As illustrated, the piezoelectric layer 19 is physical contact with respective planar surfaces of the first electrode layer 22 and the second electrode layer 24. The piezoelectric layer 19 can be an aluminum nitride layer. The piezoelectric layer 19 can be a zinc oxide layer. The piezoelectric layer 19 can include any suitable piezoelectric material. The piezoelectric layer 19 can be doped with any suitable dopant, such as scandium (Sc), chromium (Cr), magnesium (Mg), or the like. Doping the piezoelectric layer 19 can adjust resonant frequency. Doping the piezoelectric layer 19 can increase the coupling coefficient $k^2$ of the BAW device 10. Doping to increase the coupling coefficient $k^2$ can be advantageous at higher frequencies where the coupling coefficient $k^2$ can be degraded.

The first passivation layer 21 is positioned between an acoustic reflector and the first electrode layer 22. The first passivation layer 21 can be referred to as a lower passivation layer. The first passivation layer 21 can be a silicon dioxide layer or any other suitable passivation layer, such as aluminum oxide, silicon carbide, aluminum nitride, silicon nitride, silicon oxynitride, or the like. As shown in FIG. 1A (although not shown in FIG. 2), there can be an adhesion layer, such as a titanium layer, positioned between the first passivation layer 21 and the first electrode layer 22.

The first electrode layer 22 can be referred to as a lower electrode. The first electrode layer 22 can have a relatively high acoustic impedance. The first electrode layer 22 can include molybdenum (Mo), tungsten (W), ruthenium (Ru), chromium (Cr), iridium (Ir), platinum (Pt), Ir/Pt, or any suitable alloy and/or combination thereof. Similarly, the second electrode layer 23 can have a relatively high acoustic impedance. The second electrode layer 23 can include Mo, W, Ru, Cr, Ir, Pt, Ir/Pt, or any suitable alloy and/or combination thereof. The second electrode layer 23 can be formed of the same material as the first electrode layer 22 in certain instances. The second electrode layer 23 can be referred to as an upper electrode. The piezoelectric layer 19 is positioned between the first and second electrode layers 22 and 23, respectively.

The second passivation layer 24 can be referred to as an upper passivation layer. The second passivation layer 24 can be a silicon dioxide layer or any other suitable passivation layer, such as aluminum oxide, silicon carbide, aluminum nitride, silicon nitride, silicon oxynitride, or the like. The second passivation layer 24 can be the same material as the first passivation layer 21 in certain instances.

In the material stack 15, the patterned mass loading layer 25 is formed over and in physical contact with the second passivation layer 24. The patterned mass loading layer 25 and the second passivation layer 24 are formed of the same material in the material stack 15. The patterned mass loading layer 25 can be a silicon dioxide layer or any other suitable passivation layer, such as aluminum oxide, silicon carbide, aluminum nitride, silicon nitride, silicon oxynitride, or the like.

The patterned mass loading layer 25 can include a plurality of strips spaced apart from each other in a periodic pattern. The patterned mass loading layer 25 has a height d and a pitch P. The pitch P and height d impact mass loading of the BAW resonator 10 a central area of the active region, which in turn impacts resonant frequency of the BAW resonator 10. By adjusting the pitch P, the density of the pass loading layer 25 is adjusted. A smaller pitch P can result in a higher density and lower resonant frequency. Similarly, a larger pitch P can result in a smaller density and higher resonant frequency. Adjusting the height d can alternatively or additionally adjust the mass loading of the patterned mass loading layer 25.

As illustrated, the patterned mass loading layer can have periodic pattern. The periodic pattern can have a duty factor where the duty factor is defined by the width of a strip divided by the pitch. The duty factor can be from 0 (no mass loading layer) to 1 (full mass loading layer). Different BAW resonators can have different duty factors to adjust resonant frequency. More generally, a duty factor can correspond to a fill percentage or pattern density of the mass loading layer over an area of a BAW device. For example, a patterned mass loading layer in a main acoustically active region of a BAW device has a duty factor of 0.2 for the main acoustically active region when 20% of the main acoustically active region includes material of the patterned mass loading layer. As another example, a patterned mass loading layer in a main acoustically active region of a BAW device has a duty factor of 0.7 for the main acoustically active region when 70% of the main acoustically active region includes material of the patterned mass loading layer. Different regions of a BAW device can have different duty factors. For instances, in some embodiments, a patterned mass loading layer can have a lower duty factor in a recessed frame region of a BAW device than in a main acoustically active region of the BAW device.

The patterned mass loading layer 25 can be formed in the same processing step as one or more other patterned mass loading layers of different respective BAW resonators that have different respective densities. The different BAW resonators can be include in the same filter as the BAW resonator 10 and/or in one or more different filters than the BAW resonator 10. The patterned mass loading layer 25 can be formed by lithography and deposition. The patterned mass loading layer 25 can be formed by lithography and etching. Lithographic techniques used for manufacturing surface acoustic wave devices can be used to form the patterned mass loading layer.

Other embodiments of material stacks of BAW resonators with a patterned mass loading layer will be discussed with reference to example cross sections shown in FIGS. 3 to 14. These materials stacks can be implemented in place of the material stack 15 of FIGS. 1A and/or 2. Any suitable combination of features of material stacks of FIGS. 2 to 14 can be combined with each other. The example material stacks of FIGS. 3 to 14 include a patterned mass loading layer in a different position and/or of a different material than the patterned mass loading layer 25 of FIG. 2. Any suitable manufacturing techniques and/or advantages can be implemented for the material stacks of FIGS. 3 to 14 relative to the material stack 15 of FIG. 2. While a single patterned mass loading layer is shown in example embodiments, two or more patterned mass loading layers can be implemented in a single BAW resonator in some applications. The patterned mass loading layers in FIGS. 2 to 14 can be in a main acoustically active region of a BAW resonator.

Figure 3:
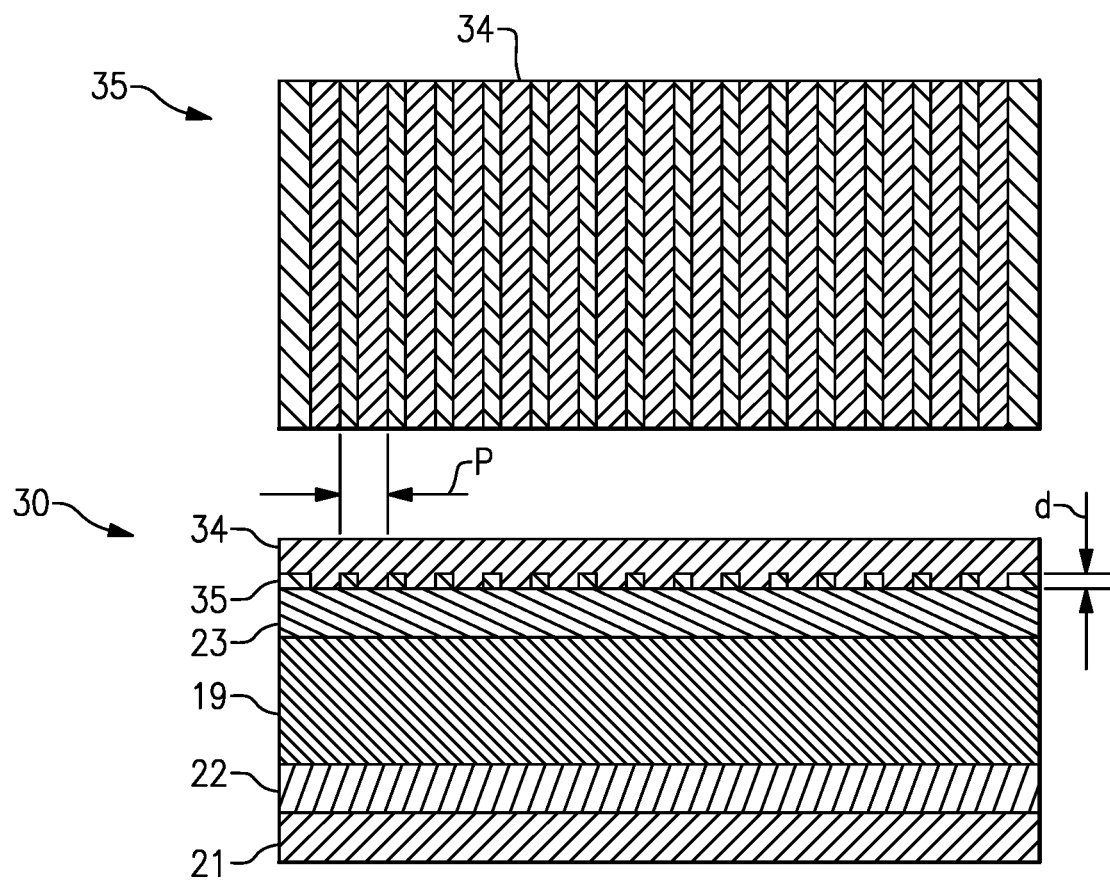
FIG. 3 includes a schematic cross-sectional view of the material stack of a BAW resonator with a patterned mass loading layer according to an embodiment.

FIG. 3 includes a schematic cross-sectional view of a material stack 30 of a BAW resonator. FIG. 3 also illustrates a patterned mass loading layer 35 in plan view with passivation material included between features of the patterned mass loading layer 35. The material stack 30 can be implemented in a central area of an active region of a BAW resonator. The material stack 30 is like the material stack 15 of FIG. 2, except that (1) the material stack 30 includes a patterned mass loading layer 35 in a different position and of a different material than the patterned mass loading layer 25 of FIG. 2 and (2) the material stack 30 also includes a second passivation layer 34 having a different geometry than the second passivation layer 24 of FIG. 2.

In FIG. 3, the patterned mass loading layer 35 is positioned over the second electrode layer 23. The second passivation layer 34 is over the patterned mass loading layer. The patterned mass loading layer 35 is formed of a different material than the second electrode layer 23. The patterned mass loading layer 35 is also formed of a different material than the second passivation layer 34. The patterned mass loading layer 35 can be formed of any suitable mass loading material. The patterned mass loading 35 layer can include a dielectric material and/or a metal. The patterned mass loading layer 35 include one or more of $SiO_2$, SiN, $Al_2O_3$, SiC, Ti, Ru, Mo, or Al, and the second electrode layer 23 and the second passivation layer 34 are both formed of different material than the patterned mass loading layer 35. The density of the material of the patterned mass loading layer 35 can be higher than the density of the material of the second passivation layer 34. In certain applications, the density of the material of the patterned mass loading layer 35 can be higher than the density of the material of the second electrode layer 23. The patterned mass loading layer 35 can cause the second passivation layer 34 to have a different geometry than the passivation layer 24 of FIG. 2.

Figure 4:
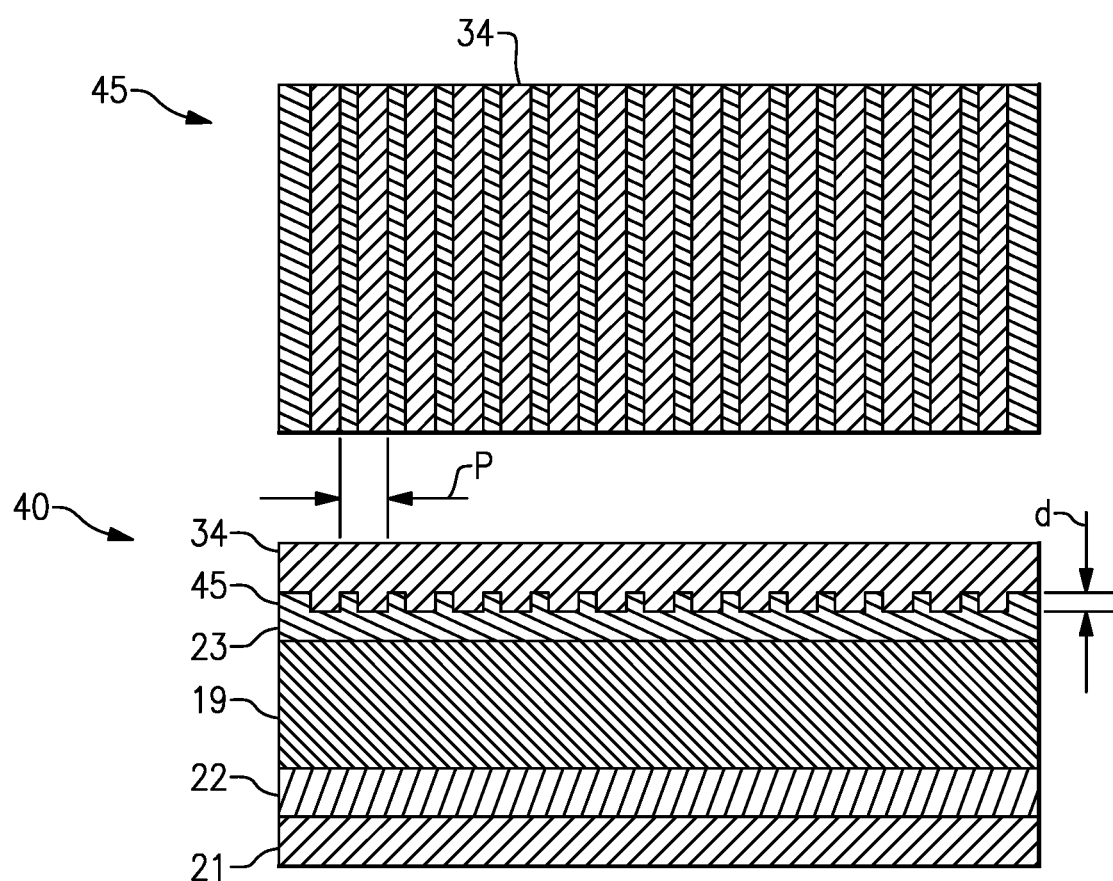
FIG. 4 includes a schematic cross-sectional view of the material stack of a BAW resonator with a patterned mass loading layer according to an embodiment.

FIG. 4 includes a schematic cross-sectional view of a material stack 40 of a BAW resonator. FIG. 4 also illustrates a patterned mass loading layer 45 in plan view. The material stack 40 can be implemented in a central area of an active region of a BAW resonator. The material stack 40 is like the material stack 30 of FIG. 3, except that a patterned mass loading layer 45 includes the same material as the second electrode layer 23 in the material stack 40. The patterned mass loading layer 45 can function as part of the upper electrode in the material stack 40.

Figure 5:
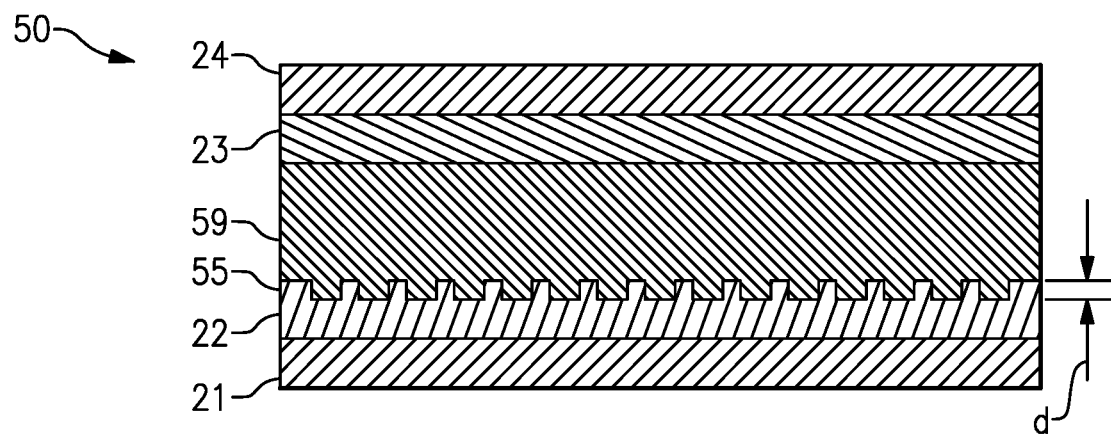
FIG. 5 is a schematic cross-sectional view of a material stack of a BAW resonator with a patterned mass loading layer over a lower electrode according to an embodiment.

FIG. 5 includes a schematic cross-sectional view of a material stack 50 of a BAW resonator. The material stack 50 can be implemented in a central area of an active region of a BAW resonator. The material stack 50 is like the material stack 40 of FIG. 4, except that a patterned mass loading layer 55 is located in a different position. The patterned mass loading layer 55 is positioned between the piezoelectric layer 18 and the first electrode layer 22. The patterned mass loading layer 55 includes the same material as the first electrode layer 22. The patterned mass loading layer 55 can function as part of the lower electrode in the material stack 50.

Figure 6:
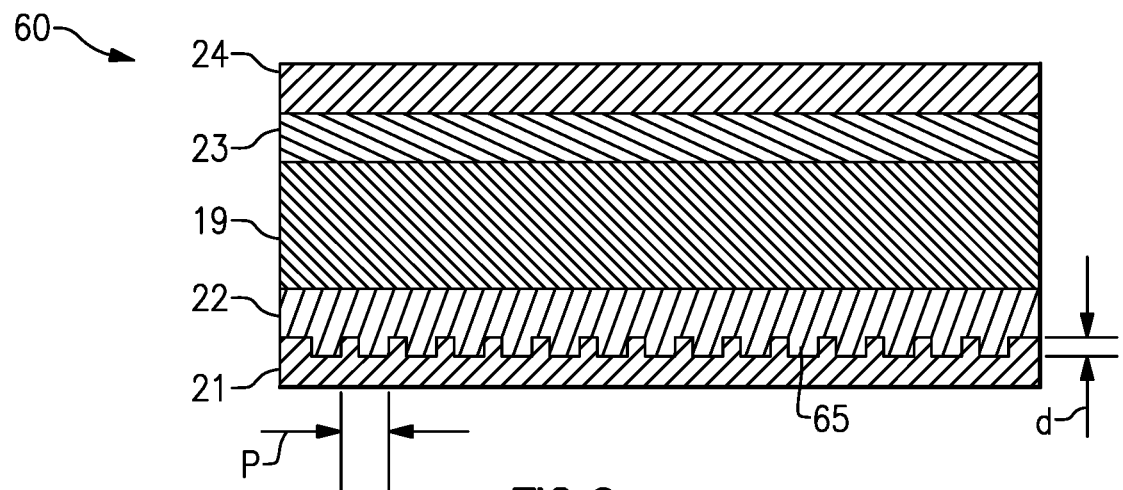
FIG. 6 is a schematic cross-sectional view of the material stack of a BAW resonator with a patterned mass loading layer below a lower electrode according to an embodiment.

FIG. 6 includes a schematic cross-sectional view of a material stack 60 of a BAW resonator. The material stack 60 can be implemented in a central area of an active region of a BAW resonator. The material stack 60 is like the material stack 50 of FIG. 5, except that a patterned mass loading layer 65 is located on an opposite side of the first electrode layer 22 relative to the patterned mass loading layer 55. The patterned mass loading layer 65 is positioned between the first passivation layer 21 and the first electrode layer 22. The patterned mass loading layer 65 includes the same material as the first electrode. The patterned mass loading layer 65 can function as part of the lower electrode in the material stack 60.

Figure 7:
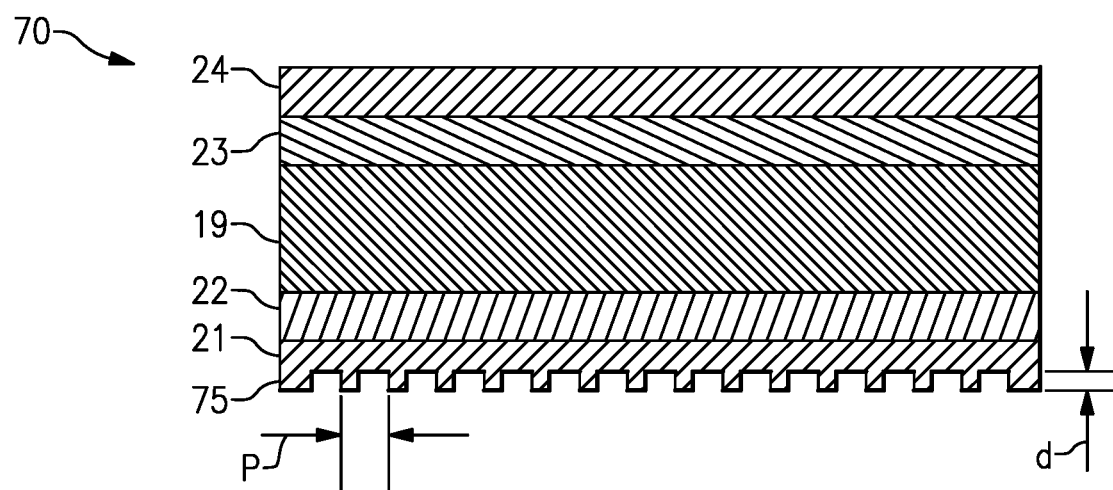
FIG. 7 is a schematic cross-sectional view of the material stack of a BAW resonator with a patterned mass loading layer below a lower passivation layer according to an embodiment.

FIG. 7 includes a schematic cross-sectional view of a material stack 70 of a BAW resonator. The material stack 70 can be implemented in a central area of an active region of a BAW resonator. In the material stack 70, a patterned mass loading layer 75 is positioned below the first passivation layer 21 and includes the same material as the first passivation layer 21. The patterned mass loading layer 75 is located between an acoustic reflector and the first passivation layer 21. The patterned mass loading layer 75 can be patterned over a sacrificial layer that is later removed to from an air cavity below the patterned mass loading layer 75 in certain applications.

Figure 8:
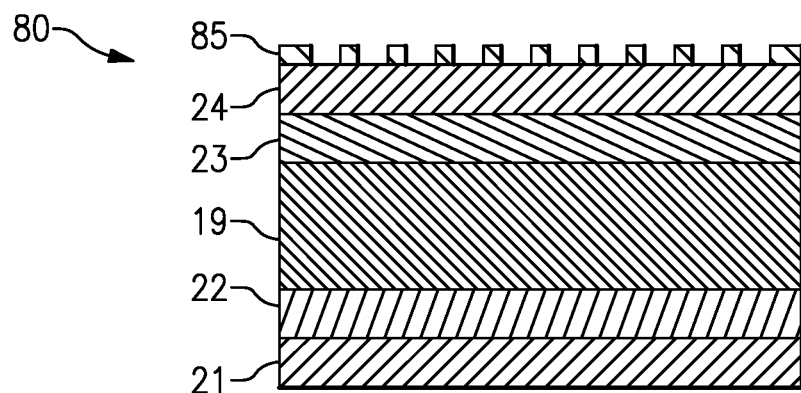
FIG. 8 is a schematic cross-sectional view of the material stack of a BAW resonator with a patterned mass loading layer over an upper electrode according to an embodiment.
Figure 9:
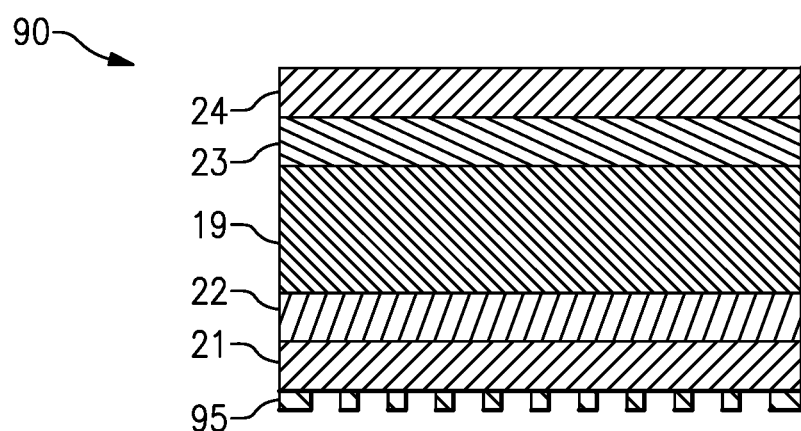
FIG. 9 is a schematic cross-sectional view of the material stack of a BAW resonator with a patterned mass loading layer below a lower passivation layer according to an embodiment according to another embodiment.
Figure 10:
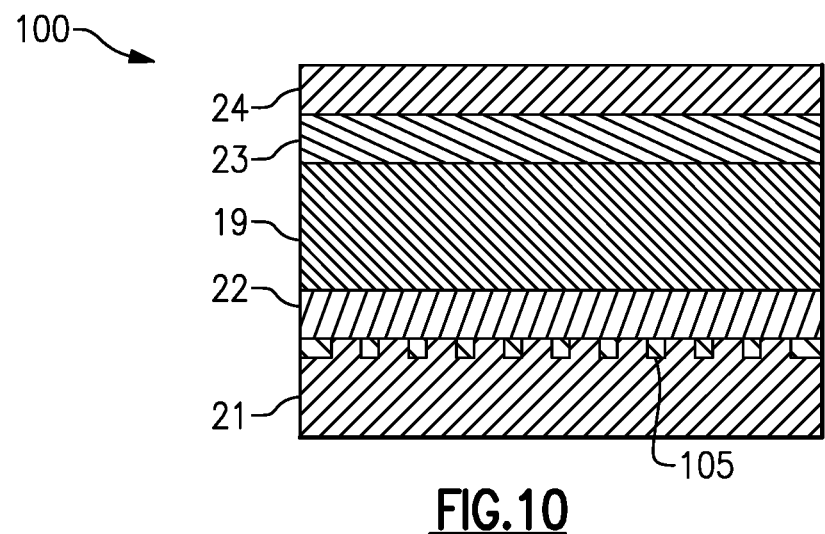
FIG. 10 is a schematic cross-sectional view of the material stack of a BAW resonator with a patterned mass loading layer below a lower electrode according to an embodiment according to another embodiment.

In certain embodiments, a patterned mass loading layer can be of a material different than any other layer(s) of a BAW material stack that are in physical contact with the patterned mass loading layer. Such patterned mass loading layers can include any suitable dielectric and/or metal. For example, such a patterned mass loading can include one or more of $SiO_2$, SiN, $Al_2O_3$, SiC, Ti, Ru, Mo, or Al, and any other layer(s) in contact with the patterned mass loading layer are of a different material. FIGS. 8 to 10 illustrate embodiments similar to certain embodiments discussed above, except where a patterned mass loading layer of a different material is included in place of a patterned mass loading layer of the same material as another layer in physical contact with the patterned mass loading layer. FIGS. 11 to 14 illustrate embodiments where a patterned mass loading layer is embedded in another layer of a BAW material stack of a different material.

FIG. 8 includes a schematic cross-sectional view of a material stack 80 of a BAW resonator. The material stack 80 is like the material stack 15 of FIG. 2, except that a patterned mass loading layer 85 of a different material than the second passivation layer 24 is included in place of the patterned mass loading layer 25.

FIG. 9 includes a schematic cross-sectional view of a material stack 90 of a BAW resonator. The material stack 90 is like the material stack 70 of FIG. 7, except that a patterned mass loading layer 95 of a different material than the first passivation layer 21 is included in place of the patterned mass loading layer 75.

FIG. 10 includes a schematic cross-sectional view of a material stack 100 of a BAW resonator. The material stack 100 is like the material stack 60 of FIG. 6, except that a patterned mass loading layer 105 of a different material than the first electrode layer 22 is included in place of the patterned mass loading layer 65. The patterned mass loading layer 105 is also of a different material than the first passivation layer 21.

Figure 11:
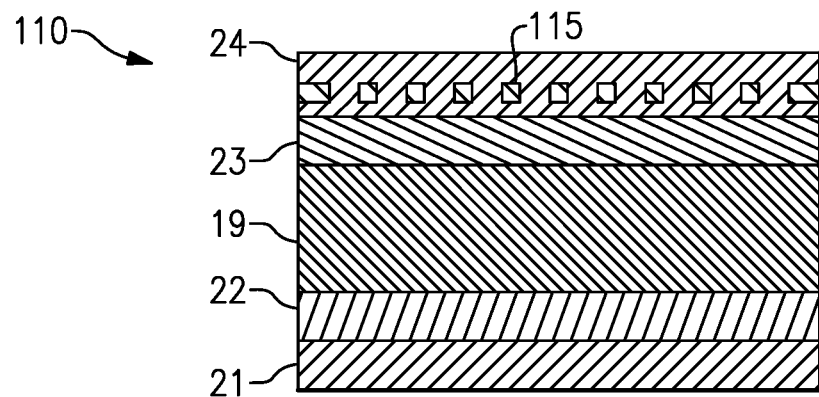
FIG. 11 is a schematic cross-sectional view of the material stack of a BAW resonator with a patterned mass loading layer embedded in an upper passivation layer according to an embodiment.

FIG. 11 includes a schematic cross-sectional view of a material stack 110 of a BAW resonator. In the material stack 110, a patterned mass loading layer 115 is embedded in the second passivation layer 24. The patterned mass loading layer 115 is of a different material than the second passivation layer 24. The pattern mass loading layer 115 can have a higher density than the second passivation layer 24.

Figure 12:
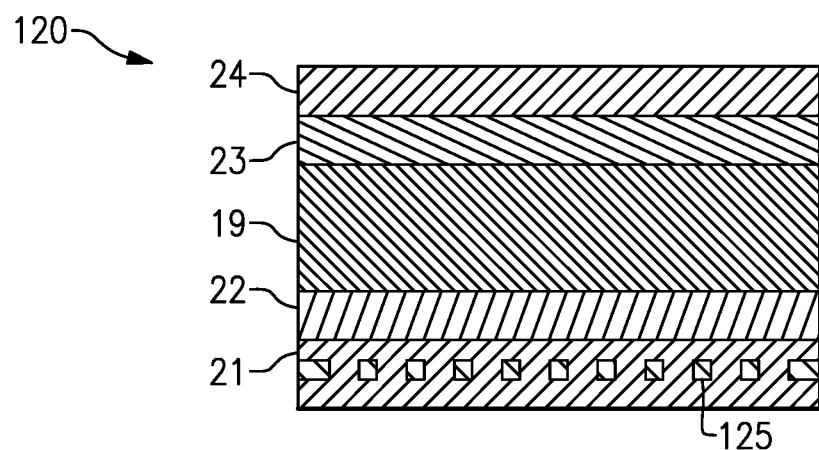
FIG. 12 is a schematic cross-sectional view of the material stack of a BAW resonator with a patterned mass loading layer embedded in a lower passivation layer according to an embodiment.

FIG. 12 includes a schematic cross-sectional view of a material stack 120 of a BAW resonator. In the material stack 120, a patterned mass loading layer 125 is embedded in the first passivation layer 21. The patterned mass loading layer 125 is of a different material than the first passivation layer 21. The pattern mass loading layer 125 can have a higher density than the first passivation layer 21.

Figure 13:
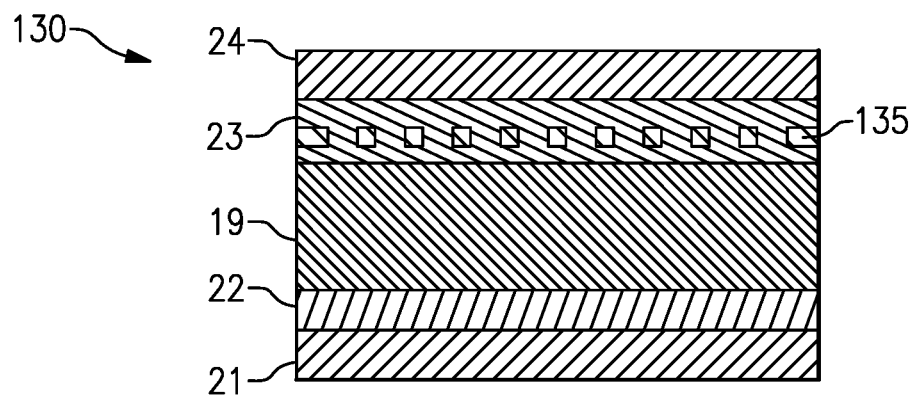
FIG. 13 is a schematic cross-sectional view of the material stack of a BAW resonator with a patterned mass loading layer embedded in an upper electrode layer according to an embodiment.

FIG. 13 includes a schematic cross-sectional view of a material stack 130 of a BAW resonator. In the material stack 130, a patterned mass loading layer 135 is embedded in the second electrode layer 23. The patterned mass loading layer 135 is of a different material than the second electrode layer 23. The pattern mass loading layer 135 can have a higher density than the second electrode layer 23.

Figure 14:
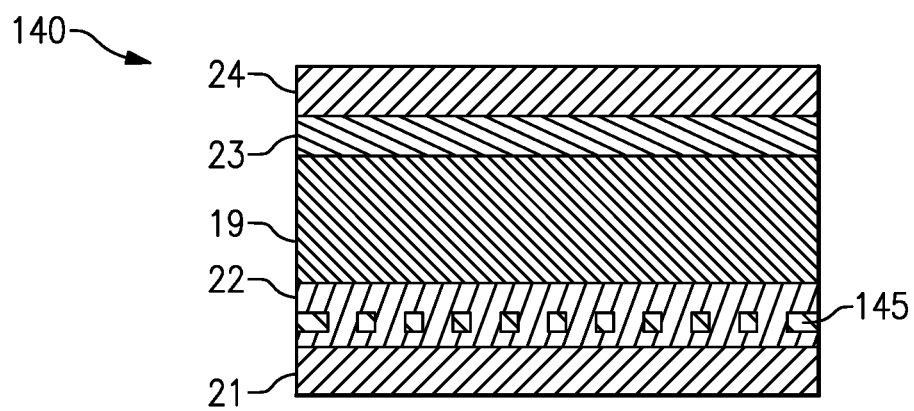
FIG. 14 is a schematic cross-sectional view of the material stack of a BAW resonator with a patterned mass loading layer embedded in a lower passivation layer according to an embodiment.

FIG. 14 includes a schematic cross-sectional view of a material stack 140 of a BAW resonator. In the material stack 140, a patterned mass loading layer 145 is embedded in the first electrode layer 22. The patterned mass loading layer 145 is of a different material than the first electrode layer 22. The pattern mass loading layer 145 can have a higher density than the first electrode layer 22.

Figure 15F:
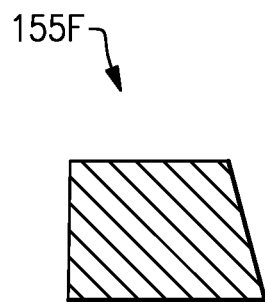

Patterned mass loading layers can include features with a variety of different cross-sectional shapes. A patterned mass loading layer can include gratings spaced apart from each other. The gratings can have any suitable cross-sectional shape, such as any of the cross-sectional shapes shown in any of FIGS. 15B to 15H. FIG. 15A includes a cross-sectional view of the BAW material stack 30 of FIG. 3 and a plan view of the patterned mass loading layer 35 for illustrative purposes. The cross-sectional shapes shown in of FIGS. 15B to 15H are example shapes for gratings of the patterned mass loading layer 35. The cross-sectional shapes shown in any of FIGS. 15B to 15H can be included in a patterned mass loading layer in accordance with any suitable principles and advantages disclosed herein. In certain embodiments, all gratings of a pattered mass loading layer can have the same shape in cross-sectional view. In some other embodiments, gratings of a patterned mass loading layer can have two or more different shapes.

Figure 15G:
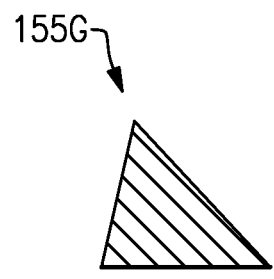
Figure 15H:
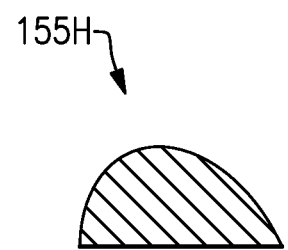

FIG. 15B illustrates a schematic cross-sectional view of a rectangular grating 155B. Certain illustrated embodiments herein have rectangular shaped gratings. FIG. 15C illustrates a schematic cross-sectional view of a trapezoidal grating 155C. FIG. 15D illustrates a schematic cross-sectional view of a triangular grating 155D. The triangular grating 155 is symmetric in the cross-sectional view. FIG. 15E illustrates a schematic cross-sectional view of a half ellipse shaped grating 155E. The grating 155E can be referred to as a lens shaped grating. A semicircular shaped grating can be implemented. FIG. 15F illustrates a schematic cross-sectional view of a grating 155F with one tapered side and one flat side. FIG. 15G illustrates a schematic cross-sectional view of an asymmetrical triangular grating 155G. The sides of the triangular grating 155 have different slopes. FIG. 15H illustrates a schematic cross-sectional view of an asymmetrical lens shaped grating 155H.

Patterned mass loading layers can include any suitable pattern in plan view. Example patterns include line patterns, loop patterns, crossed line patterns, random patterns, and the like. The density of features of such patterns of a patterned mass loading layer can be adjusted to thereby adjust mass loading of the patterned mass loading layer. Example patterns shown in plan view are illustrated in FIGS. 16A to 19C. The patterns shown in these figures can be implemented with different spacings between features to adjust mass loading. The patterns shown in any of FIGS. 16A to 19C can be implemented in a patterned mass loading layer in accordance with any suitable principles and advantages disclosed herein.

Figure 16C:
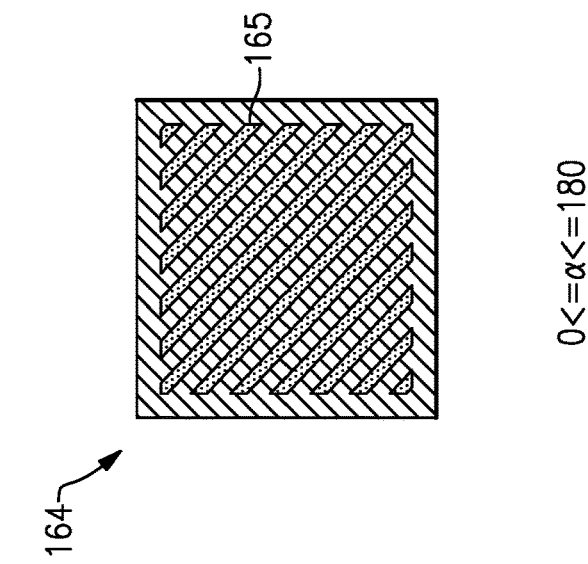
FIGS. 16A, 16B, and 16C illustrate example patterned mass loading layers with line patterns in plan view.
Figure 16B:
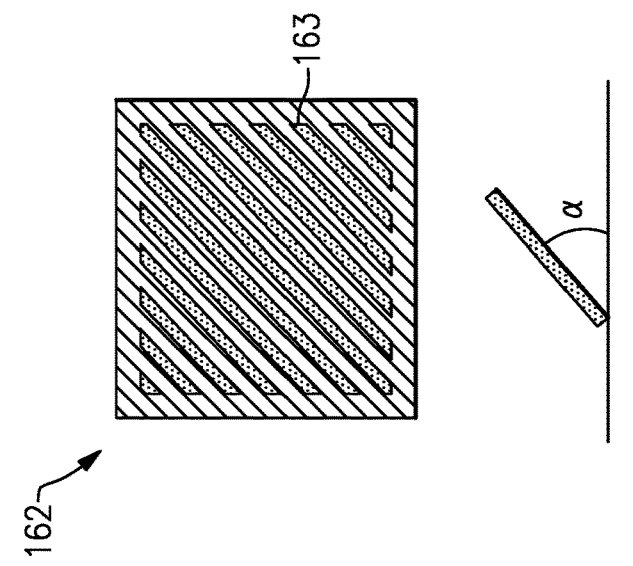
Figure 16A:
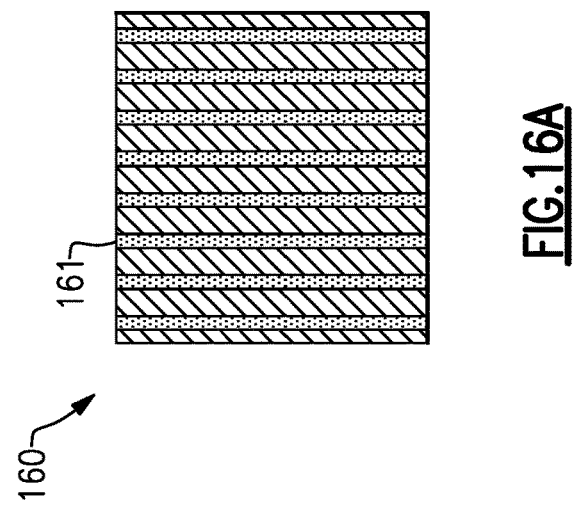

FIGS. 16A to 16C illustrate example patterned mass loading layers with line patterns in plan view. FIG. 16A shows a plan view of a patterned mass loading layer 160 that includes a plurality of line shaped features 161 spaced apart from each other. FIG. 16B shows a plan view of a patterned mass loading layer 162 that includes a plurality of angled line shaped features 163 spaced apart from each other. FIG. 16C shows a plan view of a patterned mass loading layer 164 that includes a plurality of angled line shaped features 165 spaced apart from each other, in which the angle is different than in the patterned mass loading layer 162. These figures illustrate that features of the patterned mass loading layer can be angled at any suitable angle α, where 0<α<180 degrees.

Figure 17A:
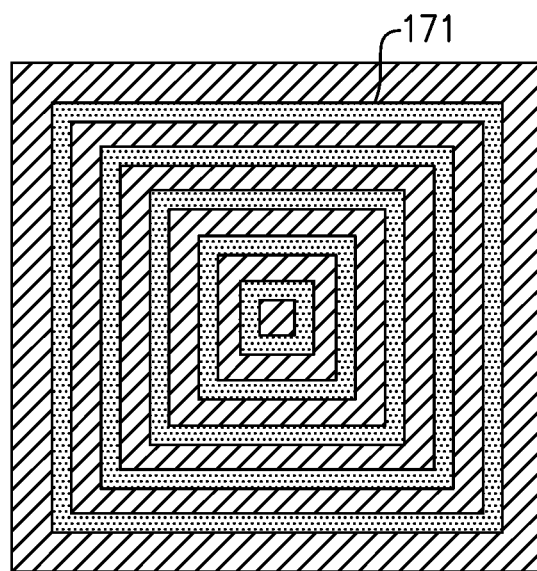
FIGS. 17A, 17B, 17C, and 17D illustrate example patterned mass loading layers with loop patterns in plan view.
Figure 17B:
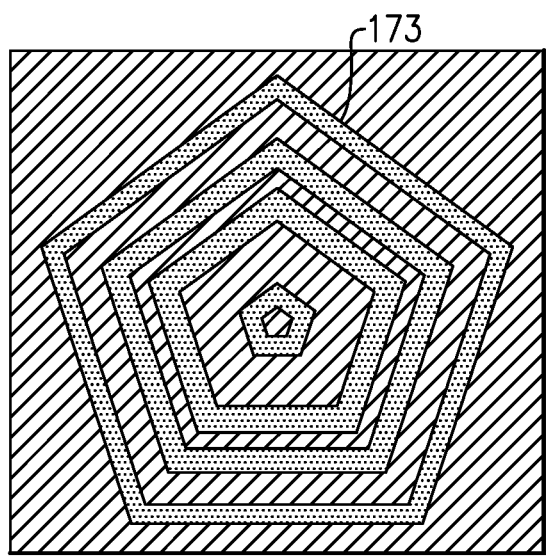
Figure 17C:
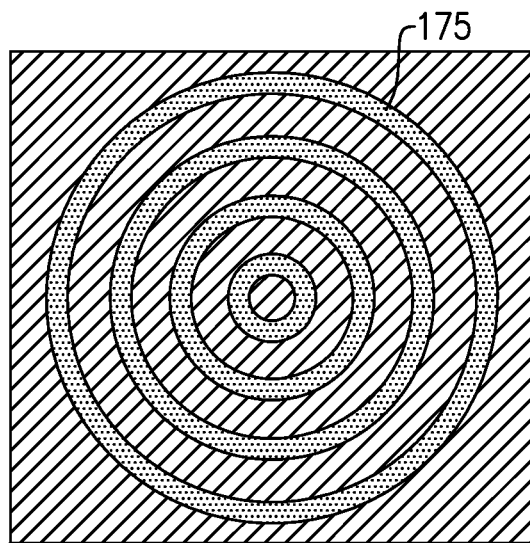
Figure 17D:
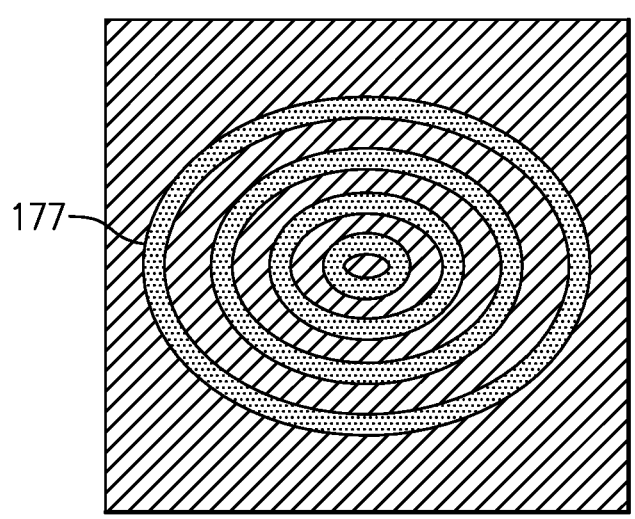

FIGS. 17A to 17D illustrate example patterned mass loading layers with loop patterns in plan view. These loop patterns include concentric shaped features of the patterned mass loading layer. FIG. 17A shows a plan view of a patterned mass loading layer 170 that includes a plurality of concentric rectangular shaped features 171 spaced apart from each other. As illustrated, the rectangular shaped features 171 are square shaped. FIG. 17B shows a plan view of a patterned mass loading layer 172 that includes a plurality of concentric pentagon shaped features 173 spaced apart from each other. FIG. 17C shows a plan view of a patterned mass loading layer 174 that includes a plurality of concentric circular features 175 spaced apart from each other. FIG. 17D shows a plan view of a patterned mass loading layer 176 that includes a plurality of concentric ellipsoid features 177 spaced apart from each other.

Figure 18A:
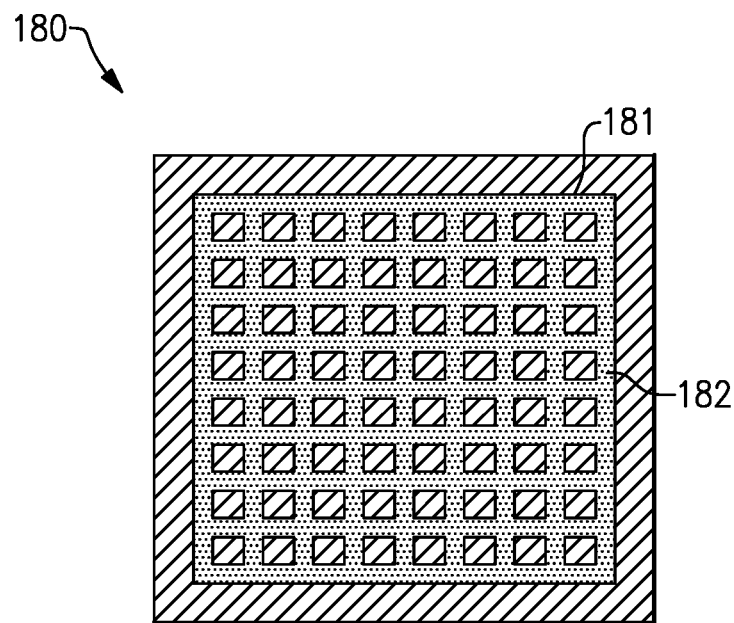
FIGS. 18A and 18B illustrate example patterned mass loading layers with crossed line patterns in plan view.
Figure 18B:
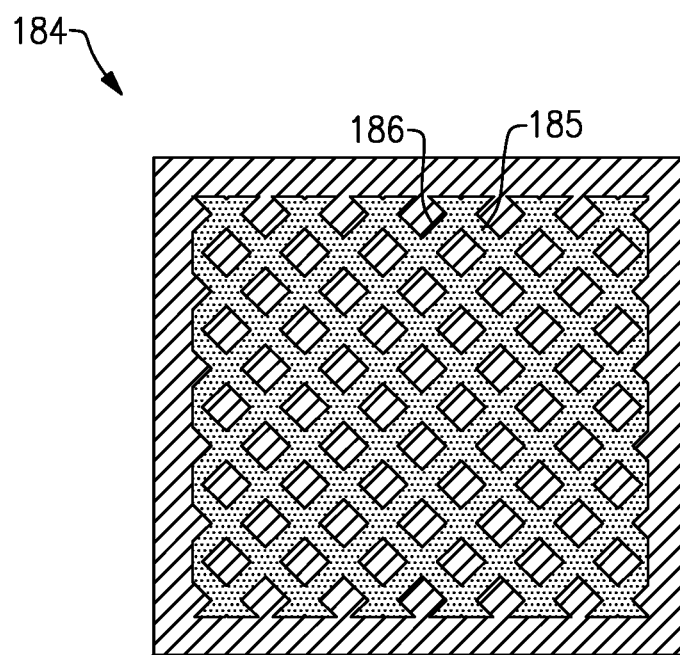

FIGS. 18A and 18B illustrate example patterned mass loading layers with crossed line patterns in plan view. FIG. 18A shows a plan view of a patterned mass loading layer 180 that includes a plurality of first lines 181 that intersect with a plurality of second lines 182. FIG. 18B shows a plan view of a patterned mass loading layer 184 that includes a plurality of first lines 185 that intersect with a plurality of second lines 186. In the patterned mass loading layers 180 and 184 the lines are angled differently. The lines of crossed line patterned mass loading layers can be at any suitable angle.

Figure 18C:
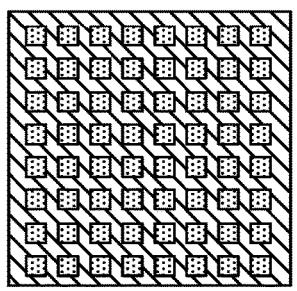
FIGS. 18C, 18D, and 18E illustrate other example patterned mass loading layers.
Figure 18D:
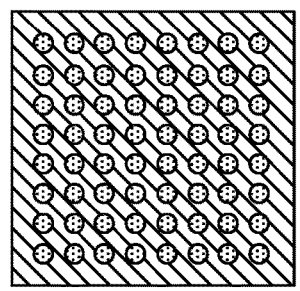
Figure 18E:
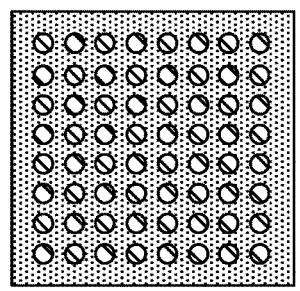

FIGS. 18C, 18D, and 18E illustrate other example patterned mass loading layers. FIG. 18C illustrates a patterned mass loading layer 187 with rectangular island features. The rectangular island features can be squared island features as illustrated. Any other suitable island features can be implemented in a patterned mass loading layer, such as other polygon island features, ellipsoid features, dot features, or the like. FIG. 18D illustrates a patterned mass loading layer 188 with dot features. FIG. 18E illustrates a patterned mass loading layer 189 with holes.

Figure 19C:
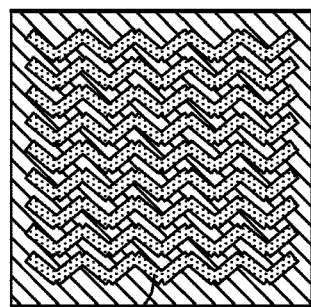
FIGS. 19A to 19C illustrate example patterned mass loading layers with different features types for line patterns in plan view.
Figure 19B:
Figure 19A:
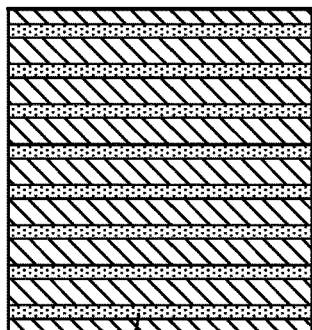

Patterned mass loading layers can have a plurality of different feature types in plan view. Including continuous features, dashed features, angled features, zig-zag features, or the like. FIGS. 19A to 19C illustrate example patterned mass loading layers with different features types for line patterns in plan view. These feature types can be applied to any other suitable patterns. FIG. 19A shows a plan view of a patterned mass loading layer 190 that includes a plurality of continuous line features 191. FIG. 19B shows a plan view of a patterned mass loading layer 192 that includes a plurality of dashed line features 193. FIG. 19C shows a plan view of a patterned mass loading layer 194 that includes a plurality of zig-zag line features 195.

Figure 20A:
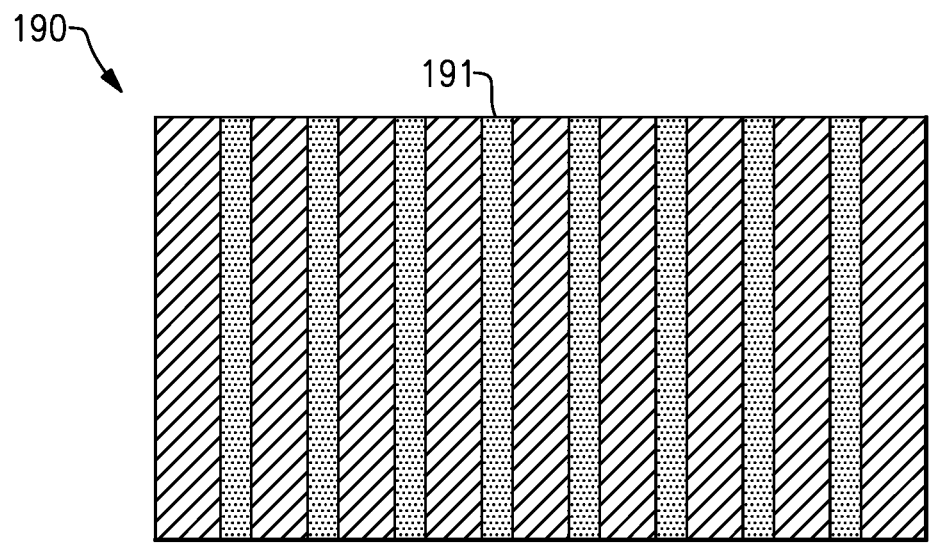
FIG. 20A shows a plan view of a patterned mass loading layer that includes a plurality of line features over an underlying layer.
Figure 20B:
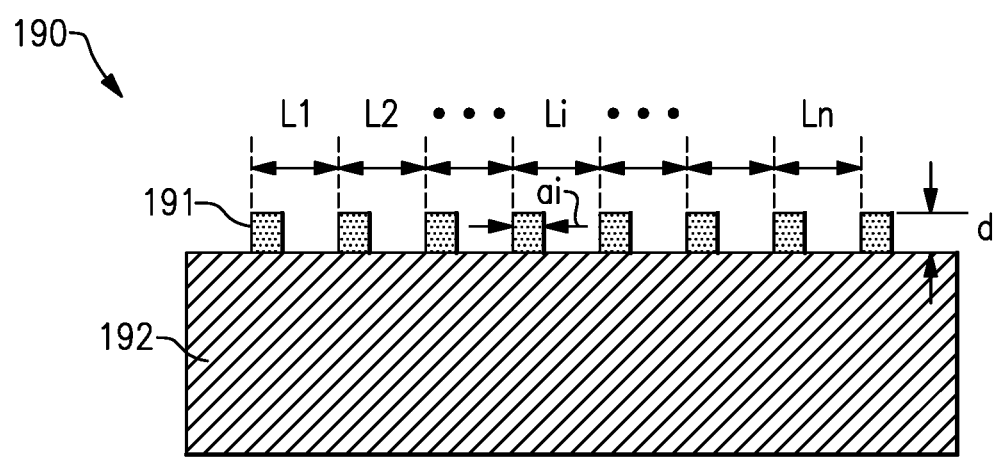
FIG. 20B shows a side view of the line features of the patterned mass loading layer and the underlying layer.

FIG. 20A shows a plan view of a patterned mass loading layer 190 that includes a plurality of line features 191 over an underlying layer 192. FIG. 20B shows a side view of the line features 191 of the patterned mass loading layer and the underlying layer. The line features 191 all have height d. The i-th line feature has a width ai. Each line feature can have the same width a in certain embodiments. The line features 191 have a period P. The period P can be constant for the line features. In some instances, the spacing between adjacent features can change and pitch can be modulated. For example, there can be a gradient in spacing between line features 191 of the patterned mass loading layers.

Mass loading can depend on material of the line features 191, height of the line features 191, and pattern density/duty factor of the line features 191.

The line features 191 can include any suitable mass loading material. The mass loading material can be a dielectric and/or passivation material, such as $SiO_2$, SiN, $Al_2O_3$, SiC, AlN, or TiN. The mass loading material can be a metal layer, such as Ti, Ru, Mo, W, Pt, Al, Ir, Cr, or any suitable alloy thereof.

The line features can have a height d of less than 250 nanometers (nm) and greater than a minimum height for manufacturing. The height d can be in a range from about 10 nm to about 220 nm in certain applications. The height d can be in a range from about 20 nm to about 100 nm in some applications. The height d can be in a range from about 20 nm to about 50 nm in some applications. The line features have a height d in a range from 0.001 h<d<1.5 h, where h is the total thickness of a resonator stack from a bottom side passivation over an acoustic reflector (e.g., air cavity or solid acoustic mirror) to a top side passivation. In certain applications, d<0.3 h is preferred The pitch P can be less than 3 h, where h is the total thickness of a resonator stack. In certain applications, P<2.4 h is preferred. Pitch P can be in a range from 0.2 micrometer to 2 micrometer in some applications. Pitch P can be in a range from 0.2 micrometer to 1 micrometer in various applications. Pitch P can be less than 1 micrometer in certain applications.

The line features can have a pattern density from 0 to 100%. In certain applications, a plurality of BAW resonators of a filter can have a duty factor in a range from 0.05 to 0.95 in a central region of an active area, in which the duty factor is defined by the width of a line feature a divided by the pitch P. In some such instances, a plurality of BAW resonators of a filter can have a duty factor in a range from 0.2 to 0.8. In some applications, a plurality of BAW resonators of a filter can have a duty factor in a range from 0.3 to 0.7 in a central region of an active area. A duty factor of a patterned mass loading layer in a main acoustically active region of a BAW resonator in a range from 0.3 to 0.7 can be desirable for a variety of applications. Duty factor can represent a ratio of an area that is covered by the patterned mass loading layer. BAW devices with higher duty factor and high Qp values can be less sensitive to thickness and pitch length variation in certain applications.

By adjusting pattern density for a particular mass loading material with a particular material height, resonant frequency of a BAW resonator can be adjusted. Adjusting from a duty factor of 0 to a duty factor of 1 can change a resonant frequency of a BAW resonator by an amount in a range from about 0.5% to about 10% of a resonant frequency of the BAW resonator. Two BAW resonators with patterned mass loading layers with different densities formed in the same processing step can have resonant frequencies that are different by an amount in a range from about 0.1% to about 10% of the lower resonant frequency. In certain applications, the two BAW resonators with patterned mass loading layers with different densities formed in the same processing step can have resonant frequencies that are different by an amount in a range from about 1% to about 10%. In some applications, the two BAW resonators with patterned mass loading layers with different densities formed in the same processing step can have resonant frequencies that are different by an amount in a range from about 1% to about 5%.

Resonant frequency variation among BAW devices on a common die can be achieved entirely by adjusting density of patterned mass loading layers in certain applications. Resonant frequency variation among BAW devices on a common die can be achieved by adjusting density of patterned mass loading layers combined with other techniques in some other applications.

Figure 20C:
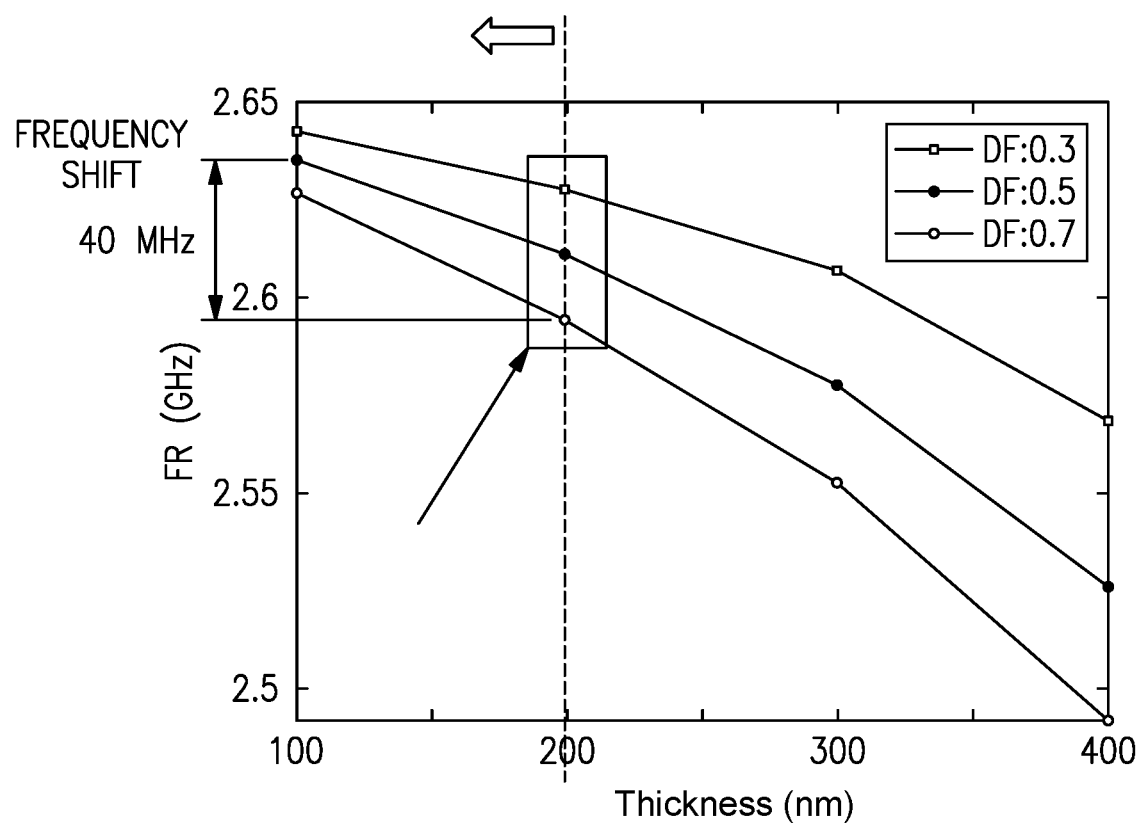
FIG. 20C is a graph of simulation results for the patterned mass loading layer of FIGS. 20A and 20B.

FIG. 20C is a graph of simulation results for the patterned mass loading layer of FIGS. 20A and 20B. In these simulations, $SiO_2$ was used for a patterned mass loading layer and Ru was used for both electrodes. The simulation results in FIG. 20C indicate that changing from a duty factor of 0.3 to a duty factor of 0.7 for a particular thickness of the patterned mass loading layer can adjust resonant frequency by 40 MHz. In certain instances, patterned mass loading layers with a thickness of less than 200 nm can be desirable. Thicker patterned mass loading layers can have a greater impact in changing resonant frequency for the same duty factor difference.

A BAW resonator with a patterned mass loading layer can be included in any suitable filter. The filter can be used to filter a radio frequency signal. The filter can include a plurality of BAW resonators, one or more BAW resonators and one or more other types of acoustic resonators, one or more BAW resonators and an inductor capacitor (LC) circuit, the like or any suitable combination thereof. The filter can be any suitable type of filter, such as band pass filter or a band rejection filter. Band pass filter can be implemented in applications for passing a particular frequency band and rejecting frequencies outside of the particular frequency band. The filter can have any suitable topology, such as a ladder topology, lattice topology, hybrid ladder lattice topology, or the like. An example ladder filter of BAW resonators with different patterned mass loading layers will be described with reference to FIG. 21.

Figure 21:
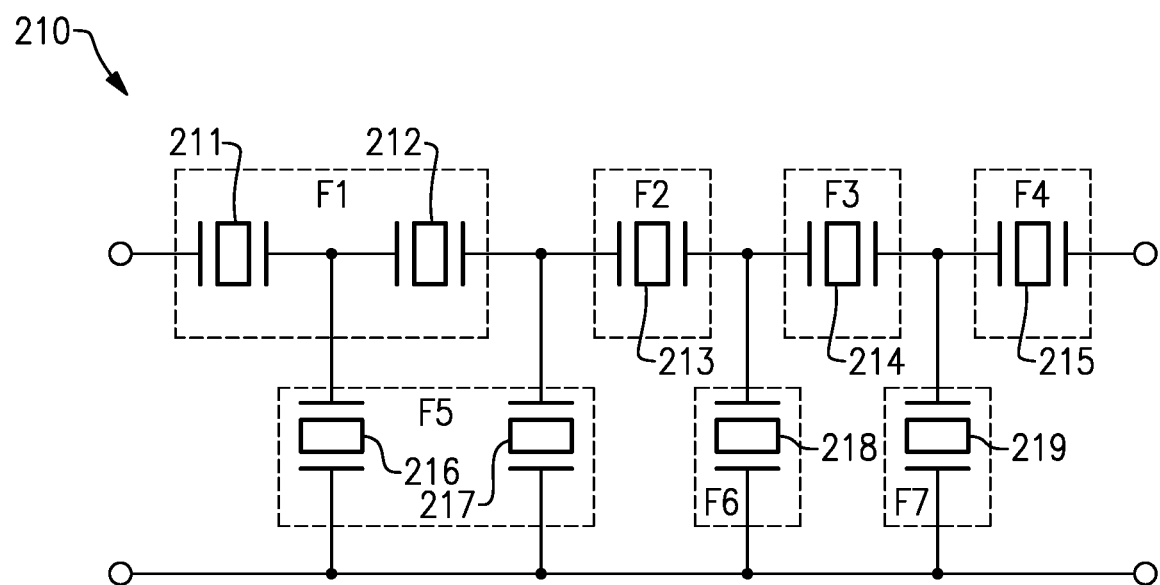
FIG. 21 is a schematic diagram of a ladder filter that includes a plurality of BAW resonators.

FIG. 21 is a schematic diagram of a ladder filter 210 that includes a plurality of BAW resonators 211 to 219. As illustrated, the ladder filter 210 includes series BAW resonators 211 to 215 and shunt BAW resonators 216 to 219. The BAW resonators 211 to 219 of the ladder filter 210 have 7 different resonant frequencies. The series resonators have 4 resonant frequencies: BAW resonators 211 and 211 have resonant frequency F1, BAW resonator 213 has resonant frequency F2, BAW resonator 214 has resonant frequency F3, and BAW resonator 215 has resonant frequency F4, where F1>F2>F3>F4. The shunt resonators have 3 resonant frequencies: BAW resonators 216 and 217 have resonant frequency F5, BAW resonator 218 has resonant frequency F6, and BAW resonator 219 has resonant frequency F7, where F5>F6>F7. F4 can be greater than F5. These example resonant frequency relationships can be a for a band pass filter. For band pass filters, series resonators can provide an upper band edge of the frequency response and shunt resonators can provide a lower band edge of the frequency response. In contrast, for band rejection filters, series resonators can provide a lower band edge of the frequency response and shunt resonators can provide an upper band edge of the frequency response. The relative resonant frequency relationships discussed above for F1 to F7 can be modified accordingly when applied to a band rejection filter.

In some existing methods, forming resonators with 7 different resonant frequencies involves 6 different processing iterations. For example, there can be 6 iterations of depositing material on BAW resonator structures to provide BAW resonators with 7 different mass loadings that will result in 7 different resonant frequencies. As another example, there can be 6 iterations of etching material of BAW resonator structures to provide BAW resonators with 7 different mass loadings that will result in 7 different resonant frequencies.

Methods disclosed herein can create 7 resonant frequencies F1 to F7 with a common processing step. Patterned mass loading layers of different BAW resonators of the ladder filter 210 can be formed with a different pattern density during the common processing step. This can adjust mass loading of the BAW resonators with the different densities and result in different respective resonant frequencies. Such a method can be performed to provide the BAW resonators of the ladder filter 210 with 7 different resonant frequencies F1 to F7.

For example, the patterned mass loading layers of the BAW resonators of the ladder filter 210 can have strip line patterns. The strip line patterns can be formed with different densities (e.g., different pitches) in a common processing step to create different respective resonant frequencies. The different densities can be formed by depositing material to form patterned mass loading layers. The different densities can be formed by etching material to form patterned mass loading layers. In some instances, both deposition and etching can be performed to provide mass loading for the BAW resonators of the ladder filter 210. For instance, a common processing step could be performed to form patterned mass loading layers for the BAW resonators 211 to 219. Then an etching process can remove material between strips of the patterned mass loading layers of the series BAW resonators 211 to 215 to reduce mass loading of the series BAW resonators 211 to 215 without impacting mass loading of the shunt BAW resonators 216 to 219.

FIG. 22 is an example schematic cross-sectional diagram showing material stacks of example BAW resonators of the ladder filter 210 of FIG. 21 with different patterned mass loading layers. These different patterned mass loading layers can be formed in a common processing step. The BAW resonators illustrated in FIG. 22 have example patterned mass loading layers, although the principles and advantages of these resonators can be implemented with any suitable patterned mass loading layers disclosed herein.

The BAW resonator 221 has a resonant frequency of F1. The BAW resonator 221 does not include a patterned mass loading layer and can thus provide a highest resonant frequency of the illustrated BAW resonators. The BAW resonator 221 can correspond to an example of BAW resonators 211 and 212 of FIG. 21. The BAW resonator 222 has a resonant frequency of F2. The BAW resonator 222 has a patterned mass loading layer 35 with less density than corresponding patterned mass loading layers 35' and 35" of BAW resonators 226 and 227, respectively. The BAW resonator 222 can correspond to an example of BAW resonator 213 of FIG. 21. The BAW resonator 226 has a resonant frequency of F6 and a patterned mass loading layer 35'. The BAW resonator 226 can correspond to an example of BAW resonator 218 of FIG. 21. The BAW resonator 227 has a resonant frequency of F7 and a patterned mass loading layer 35". The BAW resonator 226 can correspond to an example of BAW resonator 219 of FIG. 21. The BAW resonator 227 has a maximum density where the patterned mass loading layer 35" has a 100% fill. The BAW resonator 227 can have a lowest resonant frequency of the illustrated BAW resonators due to having the greatest mass loading. BAW resonators with resonant frequencies of between F2 and F6 can be implemented with similar patterned mass loading layers having densities between the densities of the patterned mass loading layers 35 and 35', respectively.

FIGS. 23A and 23B are flow diagrams of example methods of forming BAW resonators with patterned mass loading layers. FIG. 23A relates to a process that involves liftoff where material is deposited over a BAW structure to form patterned mass loading layers. FIG. 23B relates to a process that involves etching where material is removed to form patterned mass loading layers. Any suitable combination of the features of the methods of FIGS. 23A and 23B can be combined with each other.

FIG. 23A is a flow diagram for a process 230 of manufacturing BAW resonators. The BAW resonators can be FBARs and/or BAW SMRs. The process 230 includes providing a BAW resonator structure at block 232. The BAW resonator structure includes at least a support substrate. The BAW resonator structure can include one or more other layers over the support substrate. For example, the BAW resonator structure can include the layers of a material stack below any of the patterned mass loading layers shown in any of FIGS. 2 to 14.

At block 234, material is deposited over the BAW resonator structure to form patterned mass loading layers during a common processing step. The common processing step can form the patterned mass loading layers concurrently. The common processing step can involve using a common mask. During the common processing step, the material is deposited such that a first patterned mass loading layer is formed over the bulk acoustic wave resonator structure in a first area for a first bulk acoustic wave resonator and a second patterned mass loading layer over the bulk acoustic wave resonator structure in a second area for a second bulk acoustic wave resonator. The second patterned mass loading layer has a different density than the first patterned mass loading layer. Any suitable number of patterned mass loading layers can be formed for different respective BAW resonators during the common processing step. These patterned mass loading layers can have any suitable number of different densities. For example, in the example of FIGS. 21 and 22, six densities of patterned mass loading layers can be formed to create seven different resonant frequencies of BAW resonators.

During the common processing step at block 234, patterned mass loading layers can be formed for a plurality of BAW resonators of the same filter. Alternatively or additionally, the common processing step can involve forming patterned mass loading layers of BAW resonators of different filters on the same die.

The patterned mass loading layer can be any of the patterned mass loading layers of FIGS. 2 to 14. The patterned mass loading layer can include different material than a layer on which the patterned mass loading layer is deposited. In addition, the patterned mass loading layer can include different material than a layer subsequently formed over the patterned mass loading layer. In some other embodiments, the patterned mass loading layer can be of the same material as an underlying or overlying layer.

FIG. 23B is a flow diagram for a process 235 of manufacturing BAW resonators. The BAW resonators can be FBARs and/or SMRs. The process 235 includes providing a BAW resonator structure at block 236. The BAW resonator structure includes at least a support substrate. The BAW resonator structure can include one or more other layers over the support substrate. For example, the BAW resonator structure can include the layers of a material stack below and including the patterned mass loading layers (before patterning with 100% fill) shown in any of FIGS. 2 to 14.

The patterned mass loading layer can be any of the patterned mass loading layers of FIGS. 2 to 14. The patterned mass loading layer can include different material than a layer on which the patterned mass loading layer is deposited. In addition, the patterned mass loading layer can include different material than a layer subsequently formed over the patterned mass loading layer. In some other embodiments, the patterned mass loading layer can be of the same material as an underlying or overlying layer.

At block 238, material is removed from the BAW resonator structure to form patterned mass loading layers during a common processing step. The material can be etched such that a first patterned mass loading layer is formed on the bulk acoustic wave resonator structure in a first area for a first bulk acoustic wave resonator and a second patterned mass loading layer on the bulk acoustic wave resonator structure in a second area for a second bulk acoustic wave resonator. The second patterned mass loading layer has a different density than the first patterned mass loading layer. Any suitable number of patterned mass loading layers can be formed for different respective BAW resonators during the common processing step at block 238. These patterned mass loading layers can have any suitable number of different densities. For example, in the example of FIGS. 21 and 22, six densities of patterned mass loading layers can be formed to create seven different resonant frequencies of BAW resonators.

During the common processing step at block 238, patterned mass loading layers can be formed for a plurality of BAW resonators of the same filter. Alternatively or additionally, the common processing step can involve forming patterned mass loading layers of BAW resonators of different filters on the same die.

The patterned mass loading layer can be any suitable patterned mass loading layer of FIGS. 2 to 14. The patterned mass loading layer can include different material than a layer on which the patterned mass loading layer is deposited. In addition, the patterned mass loading layer can include different material than a layer subsequently formed over the patterned mass loading layer. In some other embodiments, the patterned mass loading layer can be of the same material as an underlying and/or overlying layer.

Figure 24A:
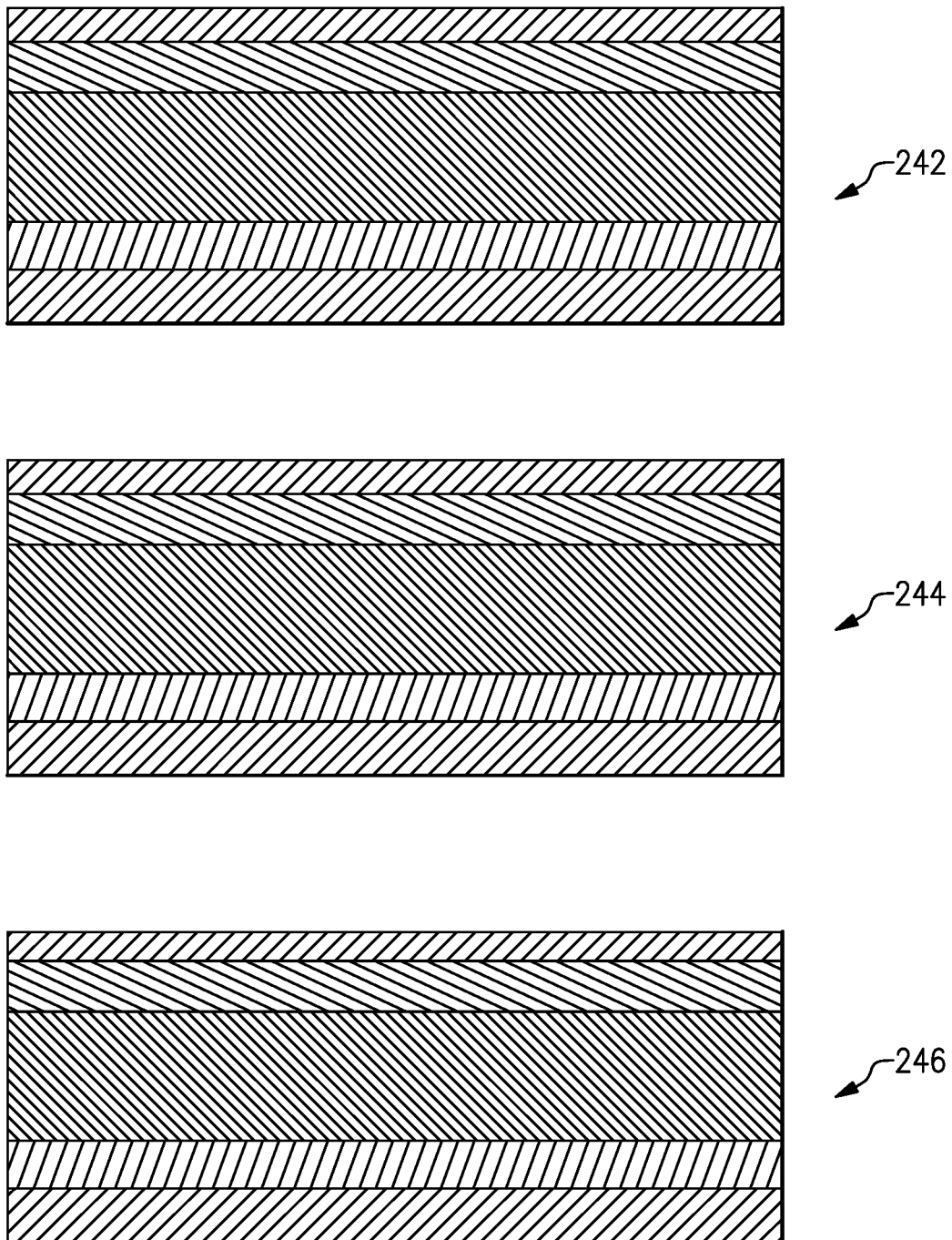
FIGS. 24A and 24B illustrate different schematic cross sections of material stacks of BAW resonators corresponding to steps of the processes of FIGS. 23A and/or 23B.
Figure 24B:
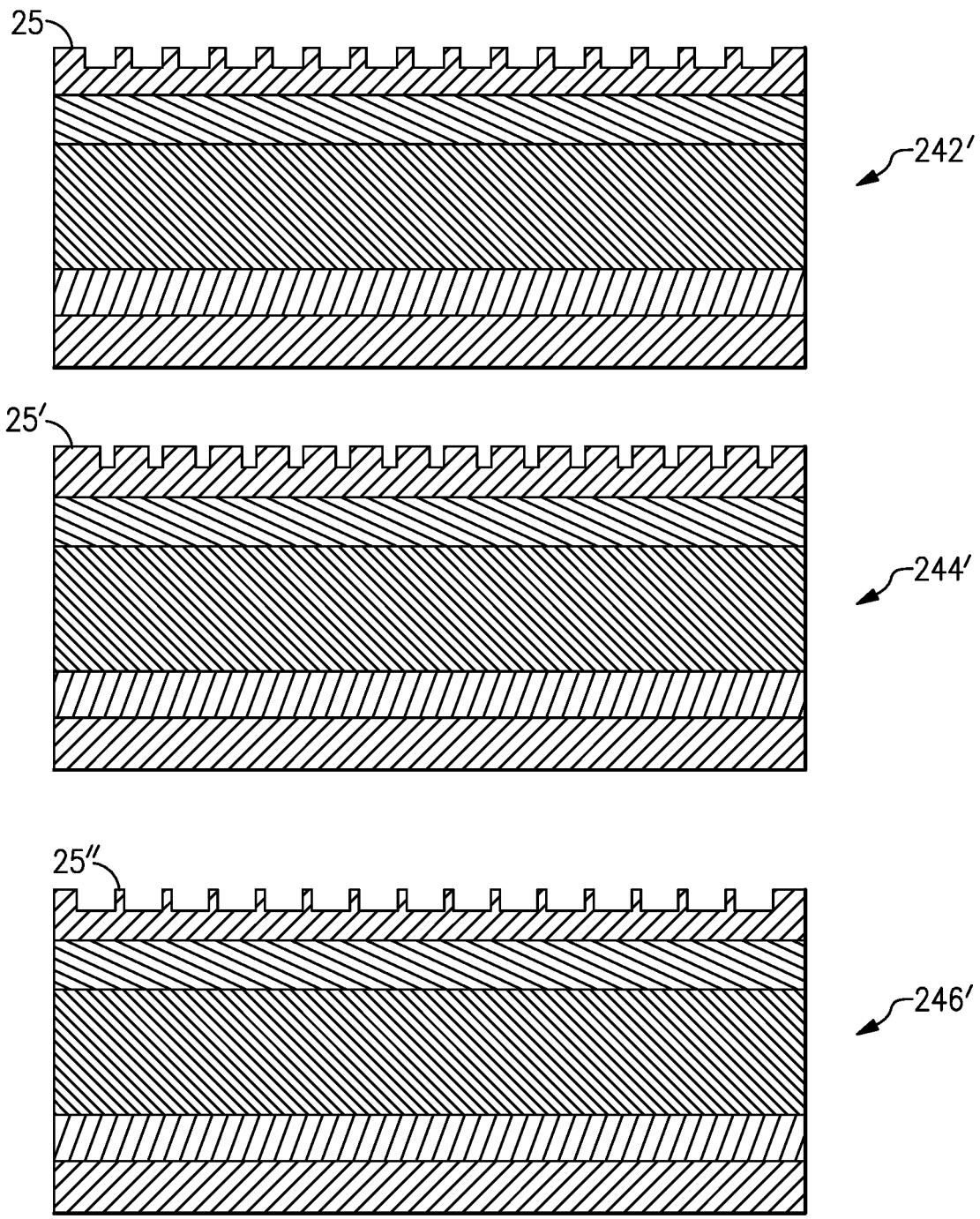

FIGS. 24A and 24B illustrate different schematic cross sections of material stacks of BAW resonators corresponding to steps of the processes of FIGS. 23A and/or 23B. The illustrated BAW resonators can be included in the same filter. The illustrated BAW resonators can be included in two or more filters on the same die.

FIG. 24A illustrates three BAW structures 242, 244, and 246 with the same material stacks. These BAW structures can correspond to the BAW structures provided at block 232 of the process 230 and/or the BAW structures provided at block 236 of the process 235.

FIG. 24B illustrates three BAW structures 242', 244', and 246' with different material stacks after a patterned mass loading layer is formed. The BAW structures 242', 244', and 246' include respective mass loading layers 25, 25', and 25" to provide different mass loading and impact resonant frequency. These BAW structures can correspond to the BAW structures formed by depositing material at block 234 of the process 230. Alternatively, these BAW structures can correspond to the BAW structures formed by removing (e.g., etching) material at block 238 of the process 235.

Figure 25:
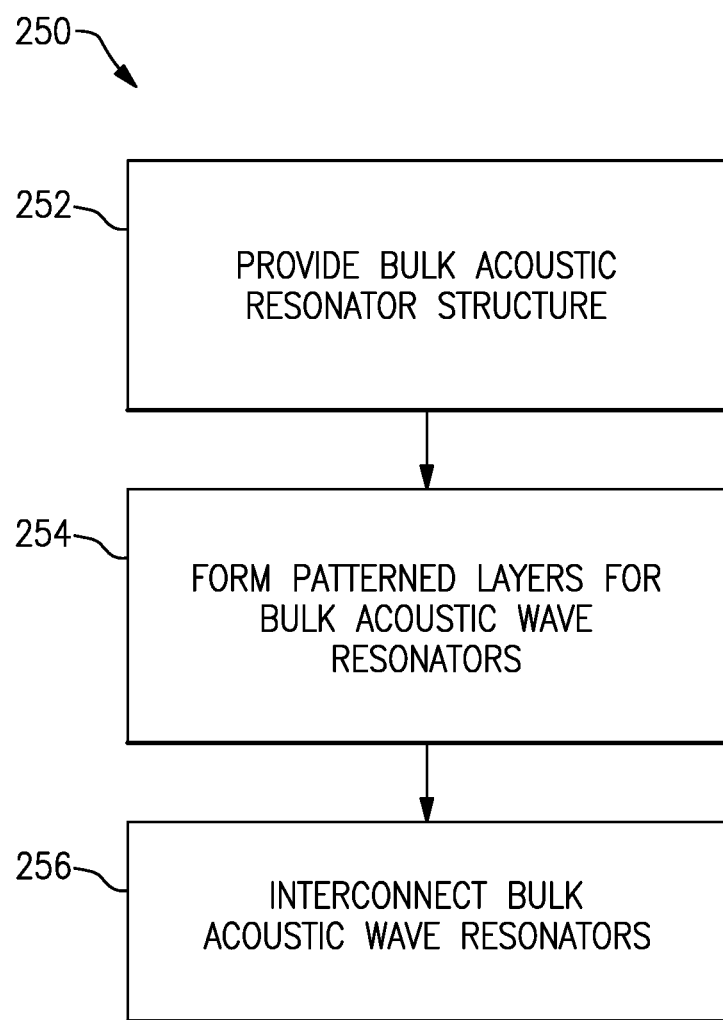
FIG. 25 is a flow diagram for a process of manufacturing BAW resonators.

FIG. 25 is a flow diagram for a process 250 of manufacturing BAW resonators. The BAW resonators can be FBARs and/or BAW SMRs. The process 250 includes providing a BAW resonator structure at block 252. Patterned mass loading layers are formed for BAW resonators at block 254. This can involve depositing material and/or removing material. BAW resonators are interconnected at block 256. The interconnecting can include connecting BAW resonators together as a filter. In some instances, interconnecting can include connecting BAW resonators together as two or more filters. In some such instances, interconnecting can include connecting BAW resonators of the two or more filters together at a common node to form a multiplexer, such as a duplexer.

FIG. 26 is a top plan view schematically illustrating a BAW die 260 that includes BAW resonators with different patterned mass loading layers. BAW resonators of the BAW die 260 can be manufactured in accordance with any suitable principles and advantages disclosed herein. FIG. 26 shows view of material stacks of BAW resonators 266 and 268 of the BAW die 260. The BAW resonators 266 and 268 have different patterned mass loading layers with different densities that impact their respective resonant frequencies. The patterned mass loading layers of the BAW resonators 266 and 268 have periodic patterns. The periodic patterns have different duty factors. The patterned mass loading layers of the BAW resonators 266 and 268 each extend a same amount above an underlying layer. The BAW resonators 266 and 268 can be included in a single filter. The BAW resonators 266 and 268 can be included in different filters. The different filters can be included in a multiplexer, such as a duplexer. In certain embodiments, the BAW resonators 266 and 268 can have the shape shown in FIG. 1B or the shape shown in FIG. 1C in plan view.

Figure 27:
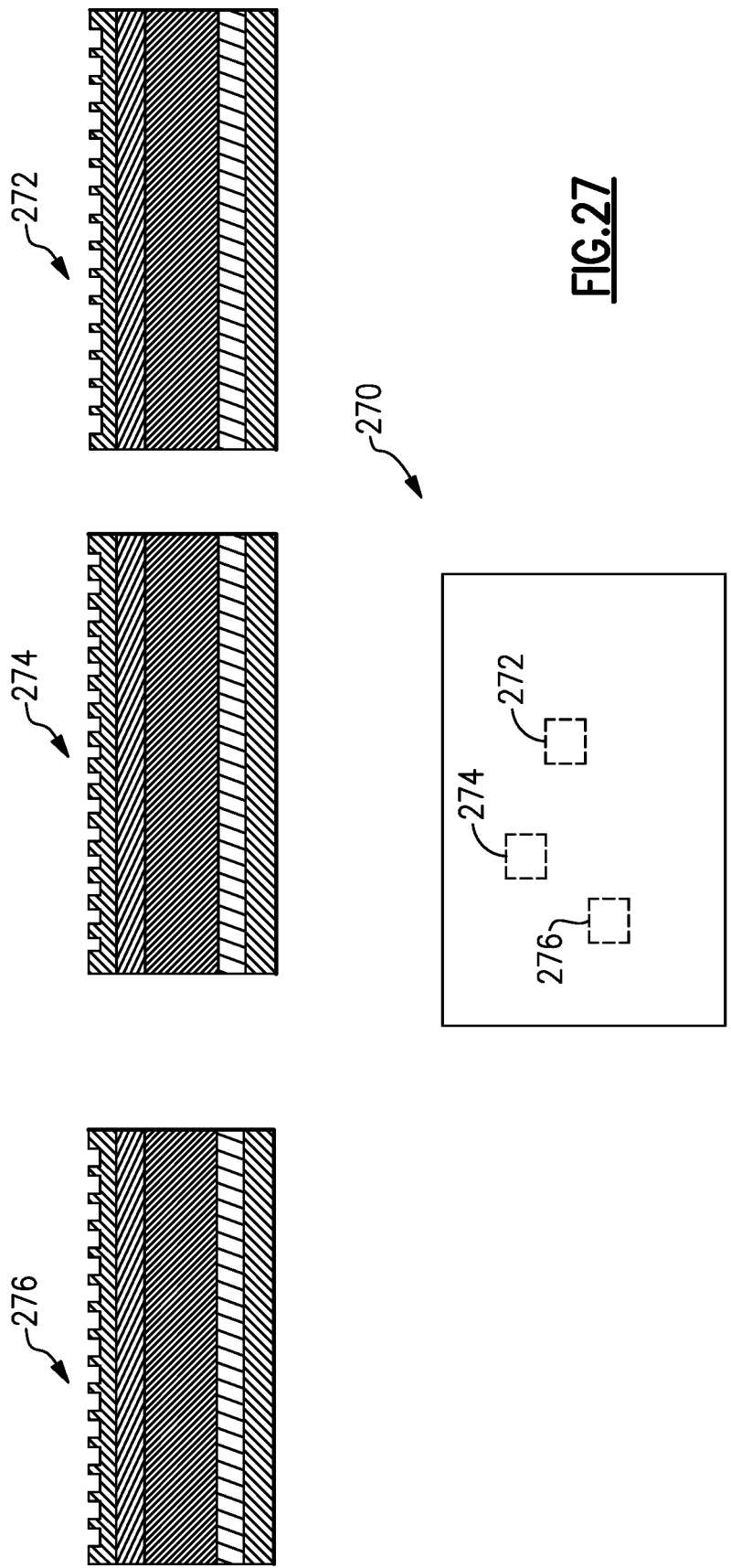
FIG. 27 is a top plan view schematically illustrating a BAW die that includes BAW resonators with different patterned mass loading layers according to an embodiment.

FIG. 27 is a top plan view schematically illustrating a BAW die 270 that includes BAW resonators with different patterned mass loading layers. BAW resonators of the BAW die 270 can be manufactured in accordance with any suitable principles and advantages disclosed herein. FIG. 27 shows view of material stacks of BAW resonators 272, 274, and 276 of the BAW die 270. The BAW resonators 272, 274, and 276 have different patterned mass loading layers with different densities that impact their respective resonant frequencies. The patterned mass loading layers of the BAW resonators 272, 274, and 276 have periodic patterns. The periodic patterns have different fill factors. The patterned mass loading layers of the BAW resonators 272, 274, and 276 each extend a same amount above an underlying layer. The BAW resonators 272, 274, and 276 can be included in a single filter. Any suitable number of BAW resonators with patterned mass loading layers can be included in a single filter. The BAW resonators 272, 274, and 276 can be included in two different filters. The two different filters can be included in a multiplexer, such as a duplexer. The BAW resonators 272, 274, and 276 can be included in three different filters. The three different filters can be included in a multiplexer, such as a triplexer. The principles and advantages disclosed herein can be applied to manufacturing BAW resonators on a BAW die, in which the BAW resonators are included in any suitable number of different filters of a multiplexer and/or any suitable number of standalone filters. In certain embodiments, the BAW resonators 272, 274, and 276 can have the shape shown in FIG. 1B or the shape shown in FIG. 1C in plan view.

Patterned mass loading layers in accordance with any suitable advantages disclosed herein can be included in a variety of different acoustic wave devices. Although some embodiments are disclosed in association with FBARs, any suitable features disclosed herein of such embodiments can be applied to solidly mounted resonators (SMRs), Lamb wave resonators, plate wave resonators, oscillators with one or more acoustic resonators, or the like. An example of a BAW SMR with a patterned mass loading layer will be discussed with reference to FIG. 28. In Lamb wave resonators, a patterned mass loading layer can be included above and/or below a lower electrode positioned between a piezoelectric layer and an acoustic reflector.

Figure 28:
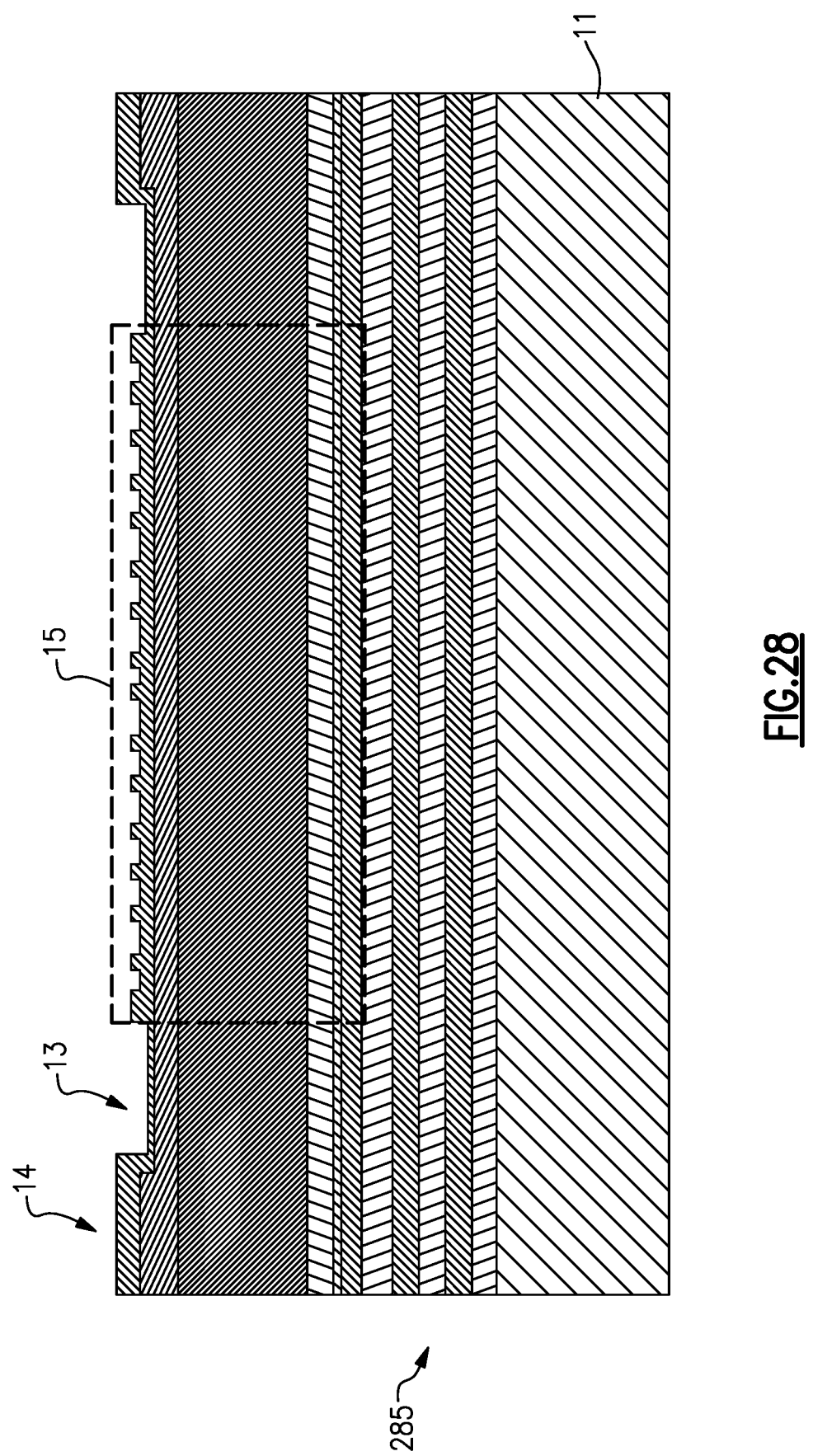
FIG. 28 is a schematic cross-sectional diagram of a solidly mounted resonator (SMR) with a patterned mass loading layer according to an embodiment.

FIG. 28 is a schematic cross-sectional diagram of a BAW SMR 280 with a patterned mass loading layer according to an embodiment. The BAW SMR 280 is like the BAW resonator 10 of FIG. 1A except that a solid acoustic mirror 285 is included in place of an air cavity 12. The solid acoustic mirror 285 is an acoustic Bragg reflector. The solid acoustic mirror 285 includes alternating low acoustic impedance and high acoustic impedance layers. As one example, the solid acoustic mirror 285 can include alternating silicon dioxide layers as low impedance layers and tungsten layers as high impedance layers. As illustrated, the BAW SMR 280 includes material stack 15 with a patterned mass loading layer. Any other material stacks and/or principles and advantages of patterned mass loading layers disclosed herein can be applied in BAW SMRs.

Patterned mass loading layers can have different densities in main acoustically active regions of different respective BAW resonators to adjust resonant frequency. A patterned mass loading layer can impact mass loading in a BAW device where mass loading is lower in a recessed frame region than in a main acoustically active region. Such a patterned mass loading layer can be implemented with any suitable principles and advantages disclosed herein. A patterned mass loading layers can at least contribute to a difference in mass loading between a main acoustically active region of a BAW resonator and a recessed frame region of the BAW resonator. A patterned mass loading layer can account for some or all of the difference in mass loading between the main acoustically active region and the recessed frame region. For example, a patterned mass loading layer can account for an entire difference in mass loading between the main acoustically active region and the recessed frame region of a BAW resonator in certain applications. As another example, a patterned mass loading layer and one or more other layers can together account the difference in mass loading between the main acoustically active region and the recessed frame region of a BAW resonator in various applications. In both examples, the patterned mass loading layer at least contributes to the difference in mass loading.

In certain embodiments, a patterned mass loading layer can be included in both a main acoustically active region and a recessed frame region. In such embodiments, the patterned mass loading layer can have a higher density in the main acoustically active region than in a recessed frame region. According to some embodiments, a patterned mass loading can be included in the main acoustically active region, and the recessed frame region can be free from the patterned mass loading layer.

In a BAW resonator, a mass loading boundary between a main acoustically active region and a recessed frame region can be created in a variety of different ways. In some instances, this mass loading boundary can be created by having a thinner upper passivation layer in the recessed frame region relative to the main acoustically active region. Example schematic cross-sectional views of BAW resonators with a thinner upper passivation layer in a recessed frame region are shown in FIGS. 29A and 29B. In certain applications, a patterned mass loading layer can create a mass loading boundary between a main acoustically active region and a recessed frame region. Example schematic cross-sectional views of BAW resonators with patterned mass loading layers providing more mass loading in the main acoustically active region relative to the recessed frame region are shown in FIGS. 31A, 31B, and 31C. In these examples, the patterned mass loading layer includes the same material as an upper electrode of a BAW resonator. In some other instances, a patterned mass loading layer can include the same material as an upper passivation layer (e.g., silicon dioxide) and the recessed frame region can have less mass loading from the upper passivation layer (e.g., a thinner upper passivation layer) and/or from the patterned mass loading layer (e.g., being free from the patterned mass loading layer or having a lower density of the patterned mass loading layer than in the main acoustically active region). Any suitable principles and advantages of the embodiments of FIGS. 29A to 32B can be implemented together with each other. Any suitable principles and advantages of the embodiments of FIGS. 29A to 32B can be implemented with one or more other features of any other embodiments disclosed herein.

FIG. 29A is a schematic cross-sectional diagram of a main acoustically active region MAIN and a recessed frame region ReF of part of a BAW resonator 290 with a patterned mass loading layer 294. In FIG. 29A, an upper passivation layer 292, the patterned mass loading layer 294, and an upper electrode layer 296 are illustrated. Although not illustrated in FIG. 29A, the BAW device 290 can include a piezoelectric layer, a lower electrode layer, a lower passivation, an acoustic reflector, and a support substrate below the illustrated layers. The patterned mass loading layer 294 includes the same material as the upper electrode layer 296 in FIG. 29A. The patterned mass loading layer 294 is included in both the recessed frame region ReF and the main acoustically active region MAIN in the BAW resonator 290. The upper passivation layer 292 is thinner in the recessed frame region ReF than in the main acoustically active region MAIN in the BAW resonator 290. This creates a difference in mass loading between the recessed frame region ReF and the main acoustically active region MAIN.

FIG. 29B is a schematic cross-sectional diagram of a main acoustically active region and a recessed frame region of part of another BAW resonator 298 with a patterned mass loading layer 294. The BAW resonator 298 is like the BAW resonator 290 of FIG. 29A, except that the upper passivation layer 292' in the BAW resonator 298 has a different geometry than the upper passivation layer 292 of the BAW resonator 290. The upper passivation layer 292' has a geometry that is impacted by the patterned mass loading layer 294. In contrast, the upper passivation layer 292 of FIG. 29A has planar upper surfaces.

Figure 30:
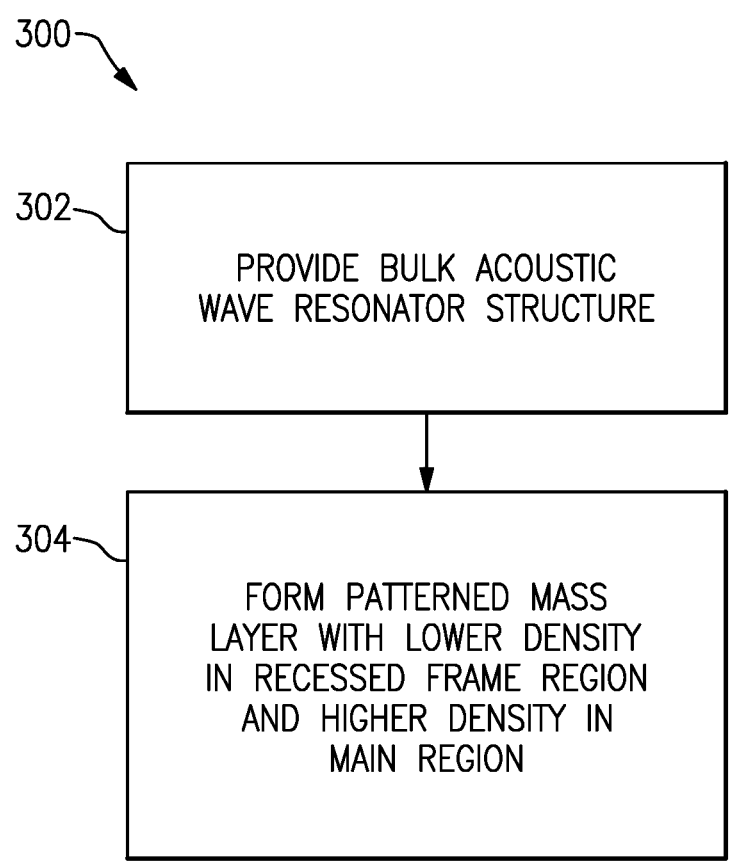
FIG. 30 is flow diagram of an example method of forming a BAW resonator with a patterned mass loading layer having a higher density in a main acoustically active region and a lower density in a raised frame region according to an embodiment.

FIG. 30 is flow diagram of an example method 300 of forming a BAW resonator with a patterned mass loading layer having a higher density in a main acoustically active region and a lower density in a raised frame region according to an embodiment. The lower density of the patterned mass loading layer can provide a sufficient difference in mass loading relative to the main acoustically active region such that an upper passivation can have substantially the same thickness over both the main acoustically active region and the recessed frame region. In such instances, a recessed frame region can be realized without etching the upper passivation layer. This can eliminate a step of etching upper passivation to create a recessed frame region from certain methods of manufacturing BAW resonators. The method 300 can create a recessed frame region by including a patterned mass loading layer with a lower duty factor in a recessed frame region relative to a main acoustically active region, instead of a separate processing step to create the recessed frame region.

At block 302 of the method 300, a bulk acoustic wave resonator structure including a support substrate is provided. The bulk acoustic wave resonator structure can also include a passivation layer over the support substrate, an electrode layer over the passivation layer, and a piezoelectric layer over the electrode layer. In some applications, the bulk acoustic wave resonator structure can further include a second electrode over the piezoelectric layer.

At block 304 of the method 300, a common processing step is performed to form a patterned mass loading layer on the bulk acoustic wave resonator structure with a lower density in an area corresponding to a recessed frame region of a bulk acoustic wave resonator and a higher density in an area corresponding to a main acoustically active region of the bulk acoustic wave resonator. The common processing step can include depositing material to form the patterned mass loading layer. The common processing step can alternatively or additionally include removing material to from the patterned mass loading layer. In certain applications, the patterned mass loading layer can have a duty factor of 0.3 or less in the area corresponding to the recessed frame region. For example, the duty factor in the area corresponding to the recessed frame region can be in a range from 0.05 to 0.3. In such applications the patterned mass loading layer can have a duty factor in the area corresponding to the main acoustically active region that is greater than the duty factor in the area corresponding to the recessed frame region. For example, the duty factor in the area corresponding to the main acoustically active region can be in a range from 0.3 to 0.8.

The patterned mass loading layer can be implemented in accordance with any suitable principles and advantages disclosed herein. For example, the patterned mass loading layer can include a periodic pattern. As another example, the patterned mass loading layer can include a plurality of strips spaced apart from each other.

After forming the patterned mass loading layer, a passivation layer can be formed over an upper electrode of the bulk acoustic wave resonator without etching material of the upper passivation layer over the recessed frame region. This can advantageously remove a processing step relative to some other methods of manufacturing BAW resonators. In such embodiments, an upper passivation layer can have substantially the same thickness in both a main acoustically active region and a recessed frame region.

FIG. 31A is a schematic cross-sectional diagram of part of a BAW resonator 310 with a patterned mass loading layer 294″ in a main acoustically active region MAIN and a recessed frame region ReF without a patterned mass loading layer. The upper passivation layer 292″ can have a geometry that is impacted by the underlying patterned mass loading layer 294″. By forming the patterned mass loading layer 294″ in the main acoustically active region MAIN and not in the recessed frame region ReF, the recessed frame region ReF can be formed without etching or otherwise removing material of the upper passivation layer 292″. This can eliminate a processing step of etching upper passivation in a recessed frame region relative to certain other methods of manufacturing BAW resonators.

FIG. 31B is a schematic cross-sectional diagram of part of a BAW resonator 312 with a patterned mass loading layer 294′ with a higher density in a main acoustically active region MAIN than in a recessed frame region ReF. The BAW resonator 312 can be manufactured by the method 300. The upper passivation layer 292‴ has a geometry impacted by the underlying patterned mass loading layer 294′. The upper passivation layer 292‴ extends farther from an underlying piezoelectric layer over features of the patterned mass loading layer 294‴ in both the main acoustically active region MAIN and the recessed frame region ReF.

FIG. 31C is a schematic cross-sectional diagram of part of a BAW resonator 314 with a patterned mass loading layer 294′ with a higher density in a main acoustically active region MAIN than in a recessed frame region ReF. The upper passivation layer 292″″ extends farther from an underlying piezoelectric layer over features of the patterned mass loading layer 294‴ in the main acoustically active region MAIN but not in the recessed frame region ReF. The upper passivation layer 292″″ can be planarized in the recessed frame region ReF. Alternatively, a planar upper passivation layer can be formed and a second patterned mass loading layer of the same material as the upper passivation layer can be formed only over the main acoustically active region. This is one example of another layer in a recessed frame region providing less mass loading in the recessed frame region relative to the main acoustically active region in combination with a patterned mass loading layer providing less mass loading in the recessed frame region relative to the main acoustically active region.

Figures 32A, 32B:
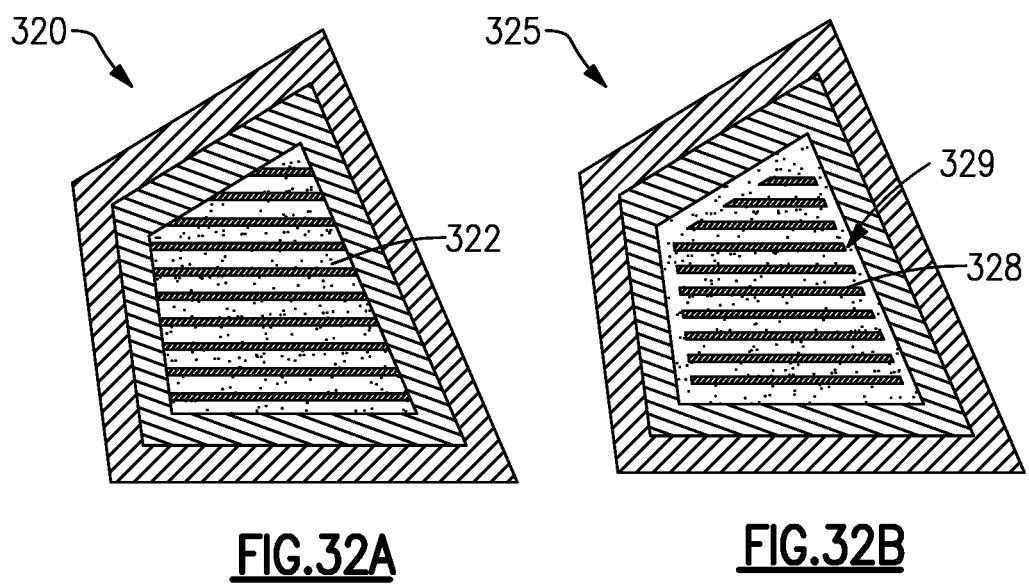
FIG. 32A is a plan view of a BAW resonator with a patterned mass loading layer.
FIG. 32B is a plan view of a BAW resonator with a patterned mass loading layer and a recessed frame region without the patterned mass loading layer.

FIG. 32A is a plan view of a BAW resonator 320 with a patterned mass loading layer 322. In the BAW resonator 320, the patterned mass loading layer can provide similar or the same mass loading in a main acoustically active region relative to a recessed frame region. The recessed frame region can be created by one or more other layers in a material stack, such as an upper passivation layer being thinner in a recessed frame region relative to a main acoustically active region.

FIG. 32B is a plan view of a BAW resonator 325 with a patterned mass loading layer 328 and a recessed frame region 329 without the patterned mass loading layer 328. The recessed frame region 329 surrounds an area associated with the patterned mass loading layer 328 in the BAW resonator 325. The recessed frame region 329 can have reduced mass loading relative to the main acoustically active region of the BAW resonator 325 due to being free from the patterned mass loading layer 328. Being free from the patterned mass loading layer 328 can account for some or all of the difference in mass loading relative to the main acoustically active region.

The principles and advantages disclosed herein can be implemented in a standalone filter and/or in one or more filters in any suitable multiplexer. Such filters can be any suitable topology discussed herein, such as any filter topology in accordance with any suitable principles and advantages disclosed with reference to any of FIG. 21. The filter can be a band pass filter arranged to filter a fourth generation (4G) Long Term Evolution (LTE) band and/or a fifth generation (5G) New Radio (NR) band. Examples of a standalone filter and multiplexers will be discussed with reference to FIGS. 33A to 33E. Any suitable principles and advantages of these filters and/or multiplexers can be implemented together with each other. Moreover, the anti-series bulk acoustic bulk acoustic wave resonators disclosed herein can be included in filter that also includes one or more inductors and one or more capacitors.

Figure 33A:
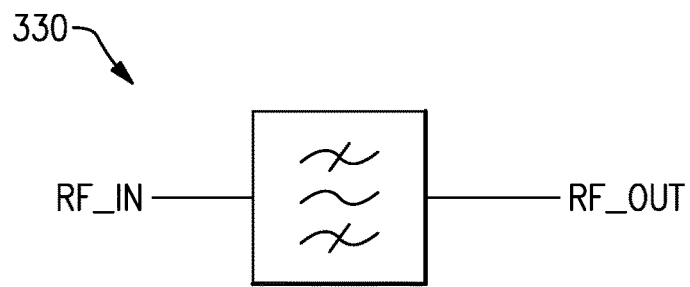
FIG. 33A is schematic diagram of an acoustic wave filter.

FIG. 33A is schematic diagram of an acoustic wave filter 330. The acoustic wave filter 330 is a band pass filter. The acoustic wave filter 330 is arranged to filter a radio frequency signal. The acoustic wave filter 330 includes a plurality of acoustic wave resonators coupled between a first input/output port RF_IN and a second input/output port RF_OUT. The acoustic wave filter 330 includes one or more BAW resonators with a patterned mass loading layer implemented in accordance with any suitable principles and advantages disclosed herein.

Figure 33B:
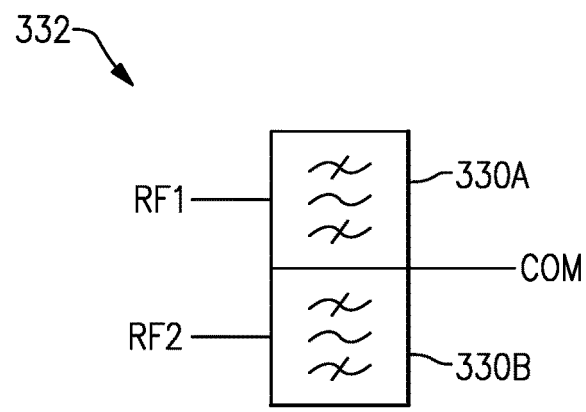
FIG. 33B is a schematic diagram of a duplexer that includes an acoustic wave filter according to an embodiment.

FIG. 33B is a schematic diagram of a duplexer 332 that includes an acoustic wave filter according to an embodiment. The duplexer 332 includes a first filter 330A and a second filter 330B coupled to together at a common node COM. One of the filters of the duplexer 332 can be a transmit filter and the other of the filters of the duplexer 332 can be a receive filter. In some other instances, such as in a diversity receive application, the duplexer 332 can include two receive filters. Alternatively, the duplexer 332 can include two transmit filters. The common node COM can be an antenna node.

The first filter 330A is an acoustic wave filter arranged to filter a radio frequency signal. The first filter 330A includes acoustic wave resonators coupled between a first radio frequency node RF1 and the common node COM. The first radio frequency node RF1 can be a transmit node or a receive node. The first filter 330A includes one or more BAW resonators with a patterned mass loading layer implemented in accordance with any suitable principles and advantages disclosed herein.

The second filter 330B can be any suitable filter arranged to filter a second radio frequency signal. The second filter 330B can be, for example, an acoustic wave filter, an acoustic wave filter that includes one or more BAW resonators with a patterned mass loading layer implemented in accordance with any suitable principles and advantages disclosed herein, an LC filter, a hybrid acoustic wave LC filter, or the like. The second filter 330B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of BAW resonators with a patterned mass loading layer.

Figure 33C:
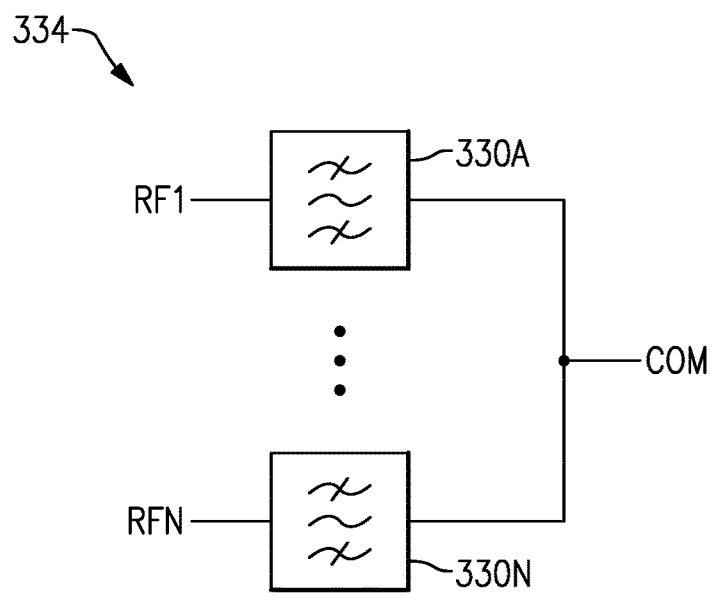
FIG. 33C is a schematic diagram of a multiplexer that includes an acoustic wave filter according to an embodiment.

FIG. 33C is a schematic diagram of a multiplexer 334 that includes an acoustic wave filter according to an embodiment. The multiplexer 334 includes a plurality of filters 330A to 330N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 330A to 330N each have a fixed electrical connection to the common node COM. This can be referred to as hard multiplexing or fixed multiplexing. Filters have fixed electrical connections to the common node in hard multiplexing applications. Each of the filters 330A to 330N has a respective input/output node RF1 to RFN.

The first filter 330A is an acoustic wave filter arranged to filter a radio frequency signal. The first filter 330A can include one or more acoustic wave devices coupled between a first radio frequency node RF1 and the common node COM. The first radio frequency node RF1 can be a transmit node or a receive node. The first filter 330A one or more BAW resonators with a patterned mass loading layer in accordance with any suitable principles and advantages disclosed herein. The other filter(s) of the multiplexer 334 can include one or more acoustic wave filters, one or more acoustic wave filters that include one or more BAW resonators with a patterned mass loading layer, one or more LC filters, one or more hybrid acoustic wave LC filters, or any suitable combination thereof.

Figure 33D:
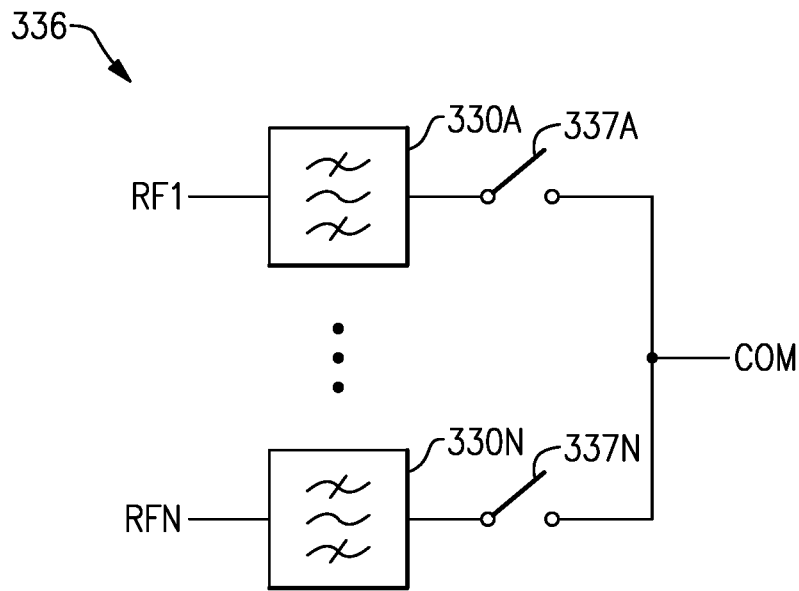
FIG. 33D is a schematic diagram of a multiplexer that includes an acoustic wave filter according to an embodiment.

FIG. 33D is a schematic diagram of a multiplexer 336 that includes an acoustic wave filter according to an embodiment. The multiplexer 336 is like the multiplexer 334 of FIG. 33C, except that the multiplexer 336 implements switched multiplexing. In switched multiplexing, a filter is coupled to a common node via a switch. In the multiplexer 336, the switch 337A to 337N can selectively electrically connect respective filters 330A to 330N to the common node COM. For example, the switch 337A can selectively electrically connect the first filter 330A the common node COM via the switch 337A. Any suitable number of the switches 337A to 337N can electrically a respective filters 330A to 330N to the common node COM in a given state. Similarly, any suitable number of the switches 337A to 337N can electrically isolate a respective filter 330A to 330N to the common node COM in a given state. The functionality of the switches 337A to 337N can support various carrier aggregations.

Figure 33E:
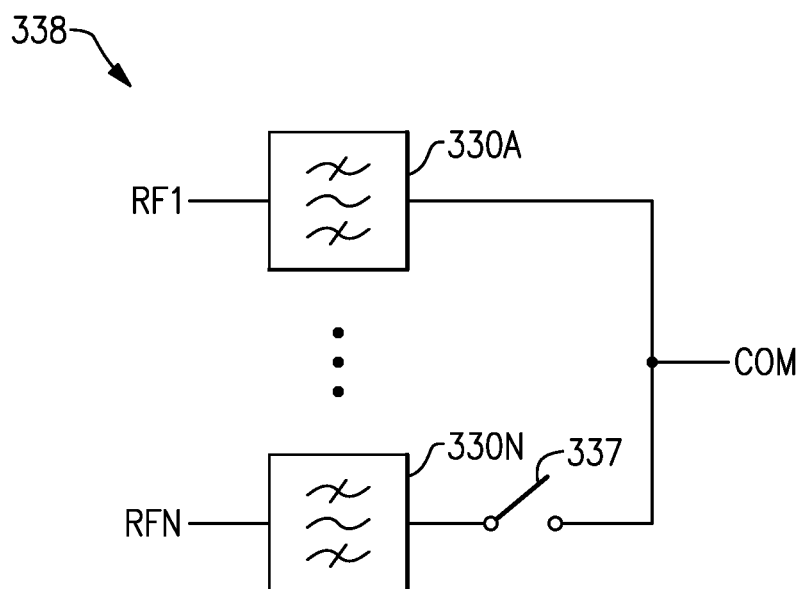
FIG. 33E is a schematic diagram of a multiplexer that includes an acoustic wave filter according to an embodiment.

FIG. 33E is a schematic diagram of a multiplexer 338 that includes an acoustic wave filter according to an embodiment. The multiplexer 338 illustrates that a multiplexer can include any suitable combination of hard multiplexed and switched multiplexed filters. One or more BAW resonators with a patterned mass loading layer can be included in a filter that is hard multiplexed to the common node of a multiplexer. Alternatively or additionally, one or more BAW resonators with a patterned mass loading layer can be included in a filter that is switch multiplexed to the common node of a multiplexer.

The acoustic wave devices with a patterned mass loading layer disclosed herein can be implemented in a variety of packaged modules. Some example packaged modules will now be discussed in which any suitable principles and advantages of the acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 34 to 38 are schematic block diagrams of illustrative packaged modules according to certain embodiments. Any suitable combination of features of these packaged modules can be implemented with each other. While duplexers are illustrated in the example packaged modules of FIGS. 35 to 38, any other suitable multiplexer that includes a plurality of filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 34:
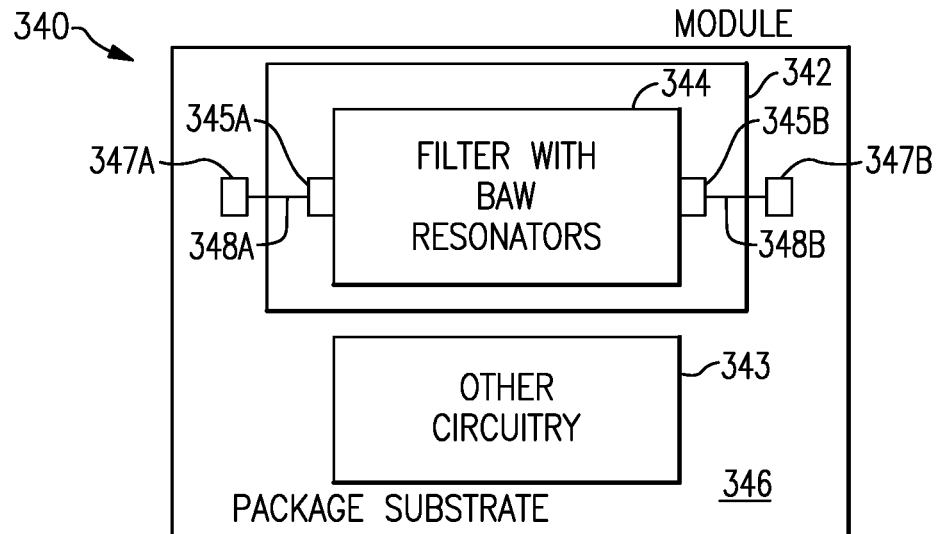
FIGS. 34, 35, 36, 37, and 38 are schematic block diagrams of illustrative packaged modules according to certain embodiments.

FIG. 34 is a schematic diagram of a radio frequency module 340 that includes an acoustic wave component 342 according to an embodiment. The illustrated radio frequency module 340 includes the acoustic wave component 342 and other circuitry 343. The acoustic wave component 342 can include one or more BAW resonators with a patterned mass loading layer in accordance with any suitable combination of features disclosed herein. The acoustic wave component 342 can include a BAW die that includes BAW resonators.

The acoustic wave component 342 shown in FIG. 34 includes a filter 344 and terminals 345A and 345B. The filter 344 includes one or more BAW resonators implemented in accordance with any suitable principles and advantages disclosed herein. The terminals 345A and 344B can serve, for example, as an input contact and an output contact. The acoustic wave component 342 and the other circuitry 343 are on a common packaging substrate 346 in FIG. 34. The package substrate 346 can be a laminate substrate. The terminals 345A and 345B can be electrically connected to contacts 347A and 347B, respectively, on the packaging substrate 346 by way of electrical connectors 348A and 348B, respectively. The electrical connectors 348A and 348B can be bumps or wire bonds, for example.

The other circuitry 343 can include any suitable additional circuitry. For example, the other circuitry can include one or more one or more radio frequency amplifiers (e.g., one or more power amplifiers and/or one or more low noise amplifiers), one or more power amplifiers, one or more radio frequency switches, one or more additional filters, one or more low noise amplifiers, one or more RF couplers, one or more delay lines, one or more phase shifters, the like, or any suitable combination thereof. The other circuitry 343 can be electrically connected to the filter 344. The radio frequency module 340 can include one or more packaging structures to, for example, provide protection and/or facilitate easier handling of the radio frequency module 340. Such a packaging structure can include an overmold structure formed over the packaging substrate 340. The overmold structure can encapsulate some or all of the components of the radio frequency module 340.

Figure 35:
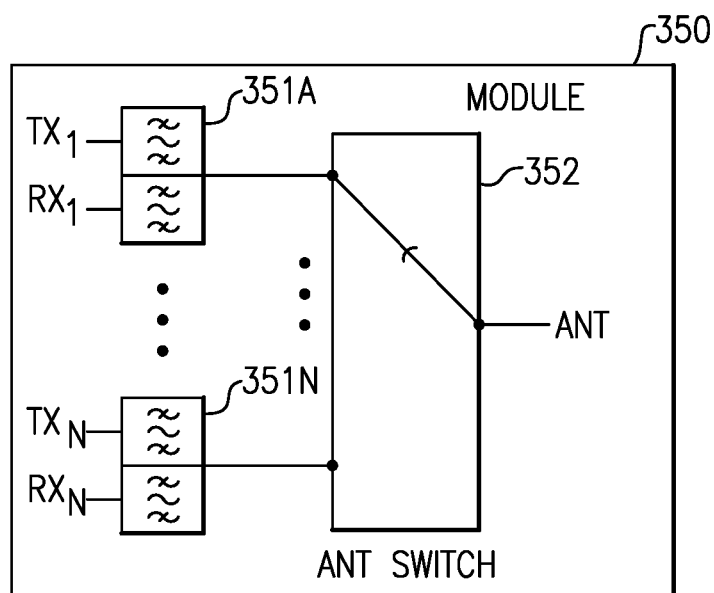

FIG. 35 is a schematic block diagram of a module 350 that includes duplexers 351A to 351N and an antenna switch 352. One or more filters of the duplexers 351A to 351N can include one or more BAW resonators with a patterned mass loading layer in accordance with any suitable principles and advantages discussed herein. Any suitable number of duplexers 351A to 351N can be implemented. The antenna switch 352 can have a number of throws corresponding to the number of duplexers 351A to 351N. The antenna switch 352 can include one or more additional throws coupled to one or more filters external to the module 350 and/or coupled to other circuitry. The antenna switch 352 can electrically couple a selected duplexer to an antenna port of the module 350.

Figure 36:
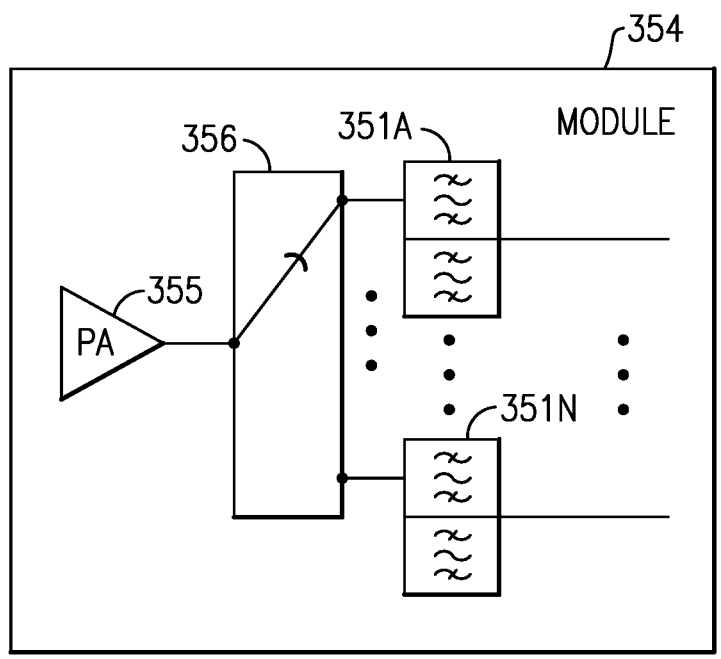

FIG. 36 is a schematic block diagram of a module 354 that includes a power amplifier 355, a radio frequency switch 356, and multiplexers 351A to 351N in accordance with one or more embodiments. The power amplifier 355 can amplify a radio frequency signal. The radio frequency switch 356 can be a multi-throw radio frequency switch. The radio frequency switch 356 can electrically couple an output of the power amplifier 355 to a selected transmit filter of the multiplexers 351A to 351N. One or more filters of the multiplexers 351A to 351N can include any suitable number of BAW resonators with a patterned mass loading layer in accordance with any suitable principles and advantages discussed herein. Any suitable number of multiplexers 351A to 351N can be implemented.

Figure 37:
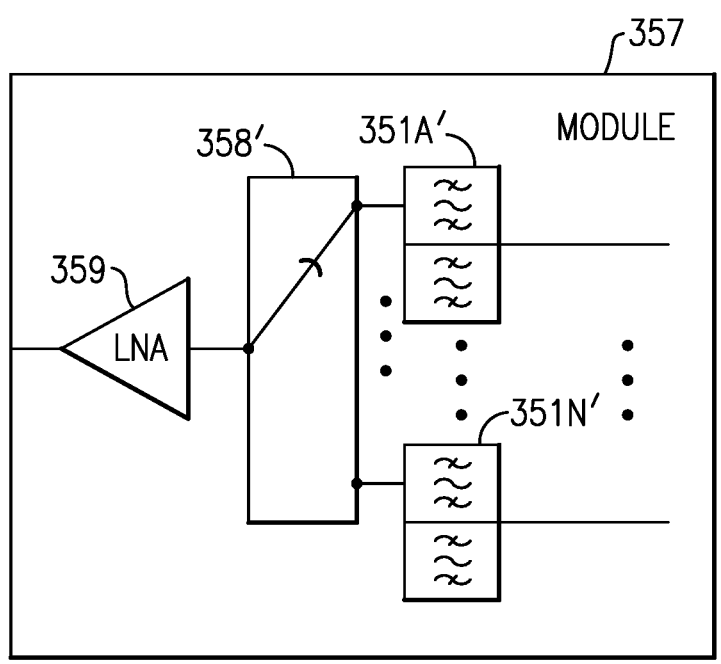

FIG. 37 is a schematic block diagram of a module 357 that includes multiplexers 351A' to 351N', a radio frequency switch 358', and a low noise amplifier 359 according to an embodiment. One or more filters of the multiplexers 351A' to 351N' can include any suitable number BAW resonators with a patterned mass loading layer in accordance with any suitable principles and advantages disclosed herein. Any suitable number of multiplexers 351A' to 351N' can be implemented. The radio frequency switch 358 can be a multi-throw radio frequency switch. The radio frequency switch 358 can electrically couple an output of a selected filter of multiplexers 351A' to 351N' to the low noise amplifier 359. In some embodiments (not illustrated), a plurality of low noise amplifiers can be implemented. The module 357 can include diversity receive features in certain applications.

Figure 38:
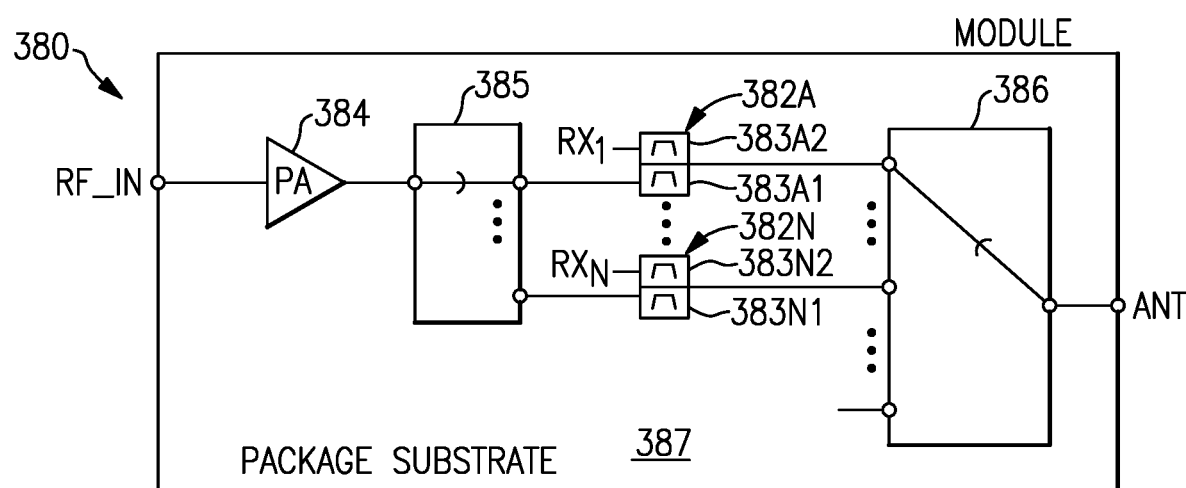

FIG. 38 is a schematic diagram of a radio frequency module 380 that includes an acoustic wave filter according to an embodiment. As illustrated, the radio frequency module 380 includes duplexers 382A to 382N that include respective transmit filters 383A1 to 383N1 and respective receive filters 383A2 to 383N2, a power amplifier 384, a select switch 385, and an antenna switch 386. The radio frequency module 380 can include a package that encloses the illustrated elements. The illustrated elements can be disposed on a common packaging substrate 387. The packaging substrate 387 can be a laminate substrate, for example. A radio frequency module that includes a power amplifier can be referred to as a power amplifier module. A radio frequency module can include a subset of the elements illustrated in FIG. 38 and/or additional elements. The radio frequency module 380 may include one or more BAW resonators with a patterned mass loading layer in accordance with any suitable principles and advantages disclosed herein.

The duplexers 382A to 382N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters 383A1 to 383N1 can include one or more BAW resonators with a patterned mass loading layer in accordance with any suitable principles and advantages disclosed herein. Similarly, one or more of the receive filters 383A2 to 383N2 can include one or more BAW resonators with a patterned mass loading layer in accordance with any suitable principles and advantages disclosed herein. Although FIG. 38 illustrates duplexers, any suitable principles and advantages disclosed herein can be implemented in other multiplexers (e.g., quadplexers, hexaplexers, octoplexers, etc.) and/or in switched multiplexers.

The power amplifier 384 can amplify a radio frequency signal. The illustrated switch 385 is a multi-throw radio frequency switch. The switch 385 can electrically couple an output of the power amplifier 384 to a selected transmit filter of the transmit filters 383A1 to 383N1. In some instances, the switch 385 can electrically connect the output of the power amplifier 384 to more than one of the transmit filters 383A1 to 383N1. The antenna switch 386 can selectively couple a signal from one or more of the duplexers 382A to 382N to an antenna port ANT. The duplexers 382A to 382N can be associated with different frequency bands and/or different modes of operation (e.g., different power modes, different signaling modes, etc.).

Figure 39:
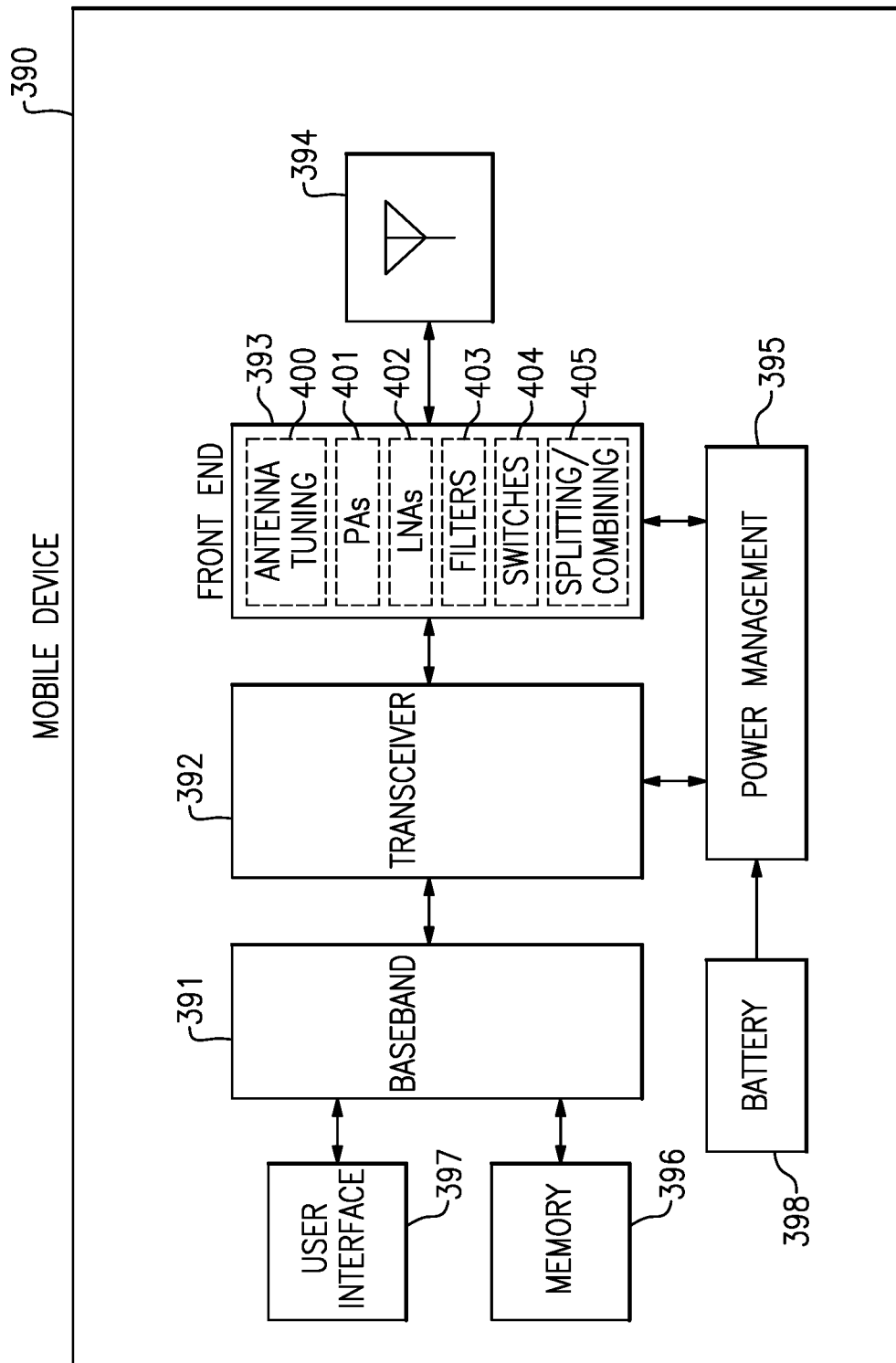
FIG. 39 is a schematic diagram of one embodiment of a mobile device.

BAW resonators with a patterned mass loading layer disclosed herein can be implemented in a variety of wireless communication devices, such as mobile devices. FIG. 39 is a schematic diagram of one embodiment of a mobile device 390. The mobile device 390 includes a baseband system 391, a transceiver 392, a front end system 393, antennas 394, a power management system 395, a memory 396, a user interface 397, and a battery 398.

The mobile device 390 can be used communicate using a wide variety of communications technologies, including, but not limited to, second generation (2G), third generation (3G), fourth generation (4G) (including LTE, LTE-Advanced, and LTE-Advanced Pro), fifth generation (5G) New Radio (NR), wireless local area network (WLAN) (for instance, WiFi), wireless personal area network (WPAN) (for instance, Bluetooth and ZigBee), WMAN (wireless metropolitan area network) (for instance, WiMax), Global Positioning System (GPS) technologies, or any suitable combination thereof.

The transceiver 392 generates RF signals for transmission and processes incoming RF signals received from the antennas 394. It will be understood that various functionalities associated with the transmission and receiving of RF signals can be achieved by one or more components that are collectively represented in FIG. 39 as the transceiver 392. In one example, separate components (for instance, separate circuits or dies) can be provided for handling certain types of RF signals.

The front end system 393 aids in conditioning signals transmitted to and/or received from the antennas 394. In the illustrated embodiment, the front end system 393 includes antenna tuning circuitry 400, power amplifiers (PAs) 401, low noise amplifiers (LNAs) 402, filters 403, switches 404, and signal splitting/combining circuitry 405. However, other implementations are possible. One or more of the filters 403 can be implemented in accordance with any suitable principles and advantages disclosed herein. For example, one or more of the filters 403 can include at least one BAW resonator with a patterned mass loading layer in accordance with any suitable principles and advantages disclosed herein.

For example, the front end system 393 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or any suitable combination thereof.

In certain implementations, the mobile device 390 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 394 can include antennas used for a wide variety of types of communications. For example, the antennas 394 can include antennas for transmitting and/or receiving signals associated with a wide variety of frequencies and communications standards.

In certain implementations, the antennas 394 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 390 can operate with beamforming in certain implementations. For example, the front end system 393 can include amplifiers having controllable gain and phase shifters having controllable phase to provide beam formation and directivity for transmission and/or reception of signals using the antennas 394. For example, in the context of signal transmission, the amplitude and phases of the transmit signals provided to the antennas 394 are controlled such that radiated signals from the antennas 394 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 394 from a particular direction. In certain implementations, the antennas 394 include one or more arrays of antenna elements to enhance beamforming.

The baseband system 391 is coupled to the user interface 397 to facilitate processing of various user input and output (I/O), such as voice and data. The baseband system 391 provides the transceiver 392 with digital representations of transmit signals, which the transceiver 392 processes to generate RF signals for transmission. The baseband system 391 also processes digital representations of received signals provided by the transceiver 392. As shown in FIG. 39, the baseband system 391 is coupled to the memory 396 of facilitate operation of the mobile device 390.

The memory 396 can be used for a wide variety of purposes, such as storing data and/or instructions to facilitate the operation of the mobile device 390 and/or to provide storage of user information.

The power management system 395 provides a number of power management functions of the mobile device 390. In certain implementations, the power management system 395 includes a PA supply control circuit that controls the supply voltages of the power amplifiers 401. For example, the power management system 395 can be configured to change the supply voltage(s) provided to one or more of the power amplifiers 401 to improve efficiency, such as power added efficiency (PAE).

As shown in FIG. 39, the power management system 395 receives a battery voltage from the battery 398. The battery 398 can be any suitable battery for use in the mobile device 390, including, for example, a lithium-ion battery.

Technology disclosed herein can be implemented in acoustic wave filters in fifth generation (5G) applications. 5G technology is also referred to herein as 5G New Radio (NR). 5G NR supports and/or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR. An acoustic wave device including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more SAW devices disclosed herein. FR1 can be from 410 MHz to 7.125 GHz, for example, as specified in a current 5G NR specification. One or more acoustic wave devices in accordance with any suitable principles and advantages disclosed herein can be included in a filter arranged to filter a radio frequency signal in a fourth generation (4G) Long Term Evolution (LTE). One or more acoustic wave devices in accordance with any suitable principles and advantages disclosed herein can be included in a filter having a passband that includes a 4G LTE operating band operating band and a 5G NR operating band. Such a filter can be implemented in a dual connectivity application, such as an E-UTRAN New Radio—Dual Connectivity (ENDC) application.

The acoustic wave filters disclosed herein can suppress second harmonics. Such features can be advantageous in 5G NR applications. Suppressing second harmonics can provide increased filter linearity. With higher filter linearity, higher peak to average power ratios that are present in certain 5G NR applications can be accommodated. Suppression of harmonics and/or higher filter linearity can be advantageous for meeting one or more other specifications in 5G technology.

Figure 40:
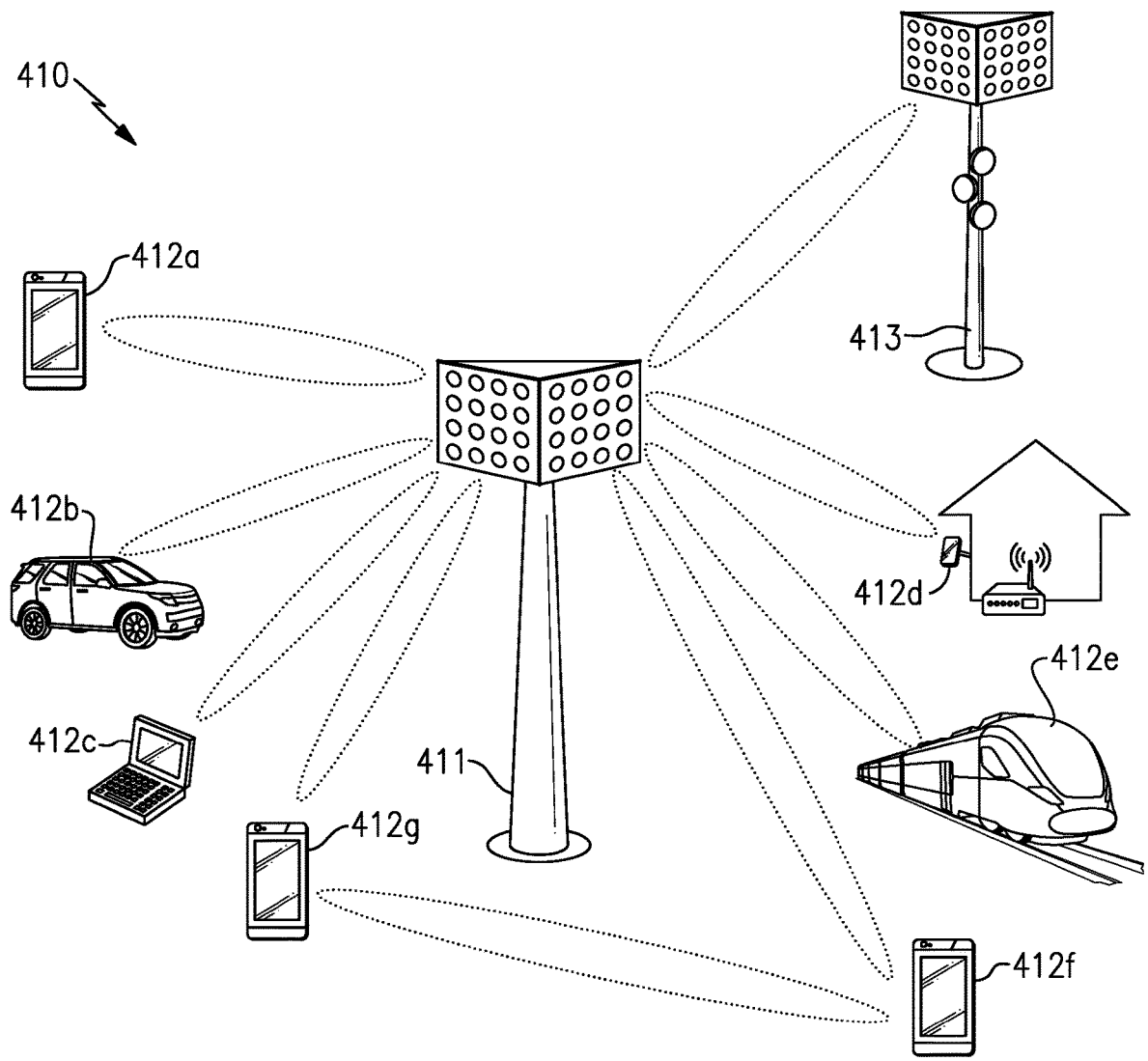
FIG. 40 is a schematic diagram of one example of a communication network.

FIG. 40 is a schematic diagram of one example of a communication network 410. The communication network 410 includes a macro cell base station 411, a small cell base station 413, and various examples of user equipment (UE), including a first mobile device 412a, a wireless-connected car 412b, a laptop 412c, a stationary wireless device 412d, a wireless-connected train 412e, a second mobile device 412f, and a third mobile device 412g. UEs are wireless communication devices. One or more of the macro cell base station 141, the small cell base station 413, or UEs illustrated in FIG. 40 can implement one or more of the acoustic wave filters in accordance with any suitable principles and advantages disclosed herein. For example, one or more of the UEs shown in FIG. 40 can include one or more acoustic wave filters that include any suitable number of BAW resonators with a patterned mass loading layer.

Although specific examples of base stations and user equipment are illustrated in FIG. 40, a communication network can include base stations and user equipment of a wide variety of types and/or numbers. For instance, in the example shown, the communication network 410 includes the macro cell base station 411 and the small cell base station 413. The small cell base station 413 can operate with relatively lower power, shorter range, and/or with fewer concurrent users relative to the macro cell base station 411. The small cell base station 413 can also be referred to as a femtocell, a picocell, or a microcell. Although the communication network 410 is illustrated as including two base stations, the communication network 410 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 410 of FIG. 40 supports communications using a variety of cellular technologies, including, for example, 4G LTE and 5G NR. In certain implementations, the communication network 410 is further adapted to provide a wireless local area network (WLAN), such as WiFi. Although various examples of communication technologies have been provided, the communication network 410 can be adapted to support a wide variety of communication technologies.

Various communication links of the communication network 410 have been depicted in FIG. 40. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 40, the communication links include not only communication links between UE and base stations, but also UE to UE communications and base station to base station communications. For example, the communication network 410 can be implemented to support self-fronthaul and/or self-backhaul (for instance, as between mobile device 412g and mobile device 412f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. According to certain implementations, the communication links can serve Frequency Range 1 (FR1), Frequency Range 2 (FR2), or a combination thereof. An acoustic wave filter in accordance with any suitable principles and advantages disclosed herein can filter a radio frequency signal within FR1. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 410 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 3 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 410 of FIG. 40 can be used to support a wide variety of advanced communication features, including, but not limited to, eMBB, uRLLC, and/or mMTC.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel filters, wireless communication devices, apparatus, methods, and systems described herein may be embodied in a variety of other forms. Furthermore, various omissions, substitutions and changes in the form of the filters, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A method of manufacturing bulk acoustic wave resonators, the method comprising:
providing a bulk acoustic wave resonator structure including a support substrate; and
during a common processing step, forming (i) a first patterned mass loading layer on the bulk acoustic wave resonator structure in a first area for a first bulk acoustic wave resonator, the first patterned mass loading layer having a duty factor in a range from 0.05 to 0.95 in a main acoustically active region of the first bulk acoustic wave resonator, and (ii) a second patterned mass loading layer on the bulk acoustic wave resonator structure in a second area for a second bulk acoustic wave resonator, the second patterned mass loading layer having a different density than the first patterned mass loading layer.

2. The method of claim 1 wherein the bulk acoustic wave resonator structure includes a passivation layer and an electrode layer.

3. The method of claim 2 wherein the bulk acoustic wave resonator structure includes a piezoelectric layer.

4. The method of claim 3 wherein the bulk acoustic wave resonator structure includes a second electrode layer, the piezoelectric layer being positioned between the electrode layer and the second electrode layer.

5. The method of claim 4 wherein the bulk acoustic wave resonator structure includes a second passivation layer over the second electrode layer.

6. The method of claim 1 wherein the first patterned mass loading layer includes a different material than any layer of the first bulk acoustic wave resonator that is in physical contact with the first patterned mass loading layer.

7. The method of claim 1 wherein the first patterned mass loading layer and a layer of the bulk acoustic wave resonator structure that is in physical contact with the first patterned mass loading layer are both of a same material.

8. The method of claim 1 further comprising forming, during the common processing step, a third patterned mass loading layer over the bulk acoustic wave resonator structure in a third area for a third bulk acoustic wave resonator, the third patterned mass loading layer having a different density than both the first and second patterned mass loading layers.

9. The method of claim 1 wherein the common processing step includes depositing material of the first and second patterned mass loading layers.

10. The method of claim 1 wherein the common processing step includes removing material to form the first and second patterned mass loading layers.

11. The method of claim 1 further comprising:
forming, during the common processing step, a third patterned mass loading layer over the bulk acoustic wave resonator structure in a third area for a third bulk acoustic wave resonator; and
removing material to increase a depth between features of the third patterned mass loading layer.

12. The method of claim 11 wherein the depth between the features of the third patterned mass loading layer is greater than a depth between features of the first patterned mass loading layer.

13. The method of claim 1 wherein the first patterned mass loading layer has a periodic pattern.

14. The method of claim 1 wherein the first patterned mass loading layer includes a plurality of strips spaced apart from each other.

15. The method of claim 1 further comprising interconnecting a plurality of bulk acoustic wave resonators such that the first and second bulk acoustic wave resonators are included in a common filter.

16. The method of claim 1 wherein, after manufacture, the first patterned mass loading layer impacts a resonant frequency of the first bulk acoustic wave resonator and the second patterned mass loading layer impacts a resonant frequency of the second bulk acoustic wave resonator, and the resonant frequency of the first bulk acoustic wave resonator is in a range from 0.1% to 10% greater than the resonant frequency of the second bulk acoustic wave resonator.

17. The method of claim 1 wherein the first patterned mass loading layer has a duty factor in a range from 0.2 to 0.8 in the main acoustically active region of the first bulk acoustic wave resonator.

18. The method of claim 1 wherein the second patterned mass loading layer has a duty factor in a range from 0.05 to 0.95 in a main acoustically active region of the second bulk acoustic wave resonator.

19. A method of manufacturing bulk acoustic wave resonators, the method comprising:
providing a bulk acoustic wave resonator structure including a support substrate; and
during a common processing step, depositing material to form (i) a first patterned mass loading layer over the bulk acoustic wave resonator structure in a first area for a first bulk acoustic wave resonator, the first patterned mass loading layer having a duty factor in a range from 0.05 to 0.95 in a main acoustically active region of the first bulk acoustic wave resonator, and (ii) a second patterned mass loading layer over the bulk acoustic wave resonator structure in a second area for a second bulk acoustic wave resonator, the second patterned mass loading layer having a duty factor in a range from 0.2 to 0.8 in a main acoustically active region of the second bulk acoustic wave resonator, and the second patterned mass loading layer having a different density than the first patterned mass loading layer.

20. A method of manufacturing bulk acoustic wave resonators, the method comprising:
providing a bulk acoustic wave resonator structure including a support substrate; and
during a common processing step, etching material to form (i) a first patterned mass loading layer on the bulk acoustic wave resonator structure in a first area for a first bulk acoustic wave resonator, the first patterned mass loading layer having a duty factor in a range from 0.05 to 0.95 in a main acoustically active region of the first bulk acoustic wave resonator, and (ii) a second patterned mass loading layer on the bulk acoustic wave resonator structure in a second area for a second bulk acoustic wave resonator, the second patterned mass loading layer having a duty factor in a range from 0.2 to 0.8 in a main acoustically active region of the second bulk acoustic wave resonator, and the second patterned mass loading layer having a different density than the first patterned mass loading layer.

* * * * *